(12) United States Patent
Takahashi et al.

(10) Patent No.: US 11,531,362 B2
(45) Date of Patent: Dec. 20, 2022

(54) AMPLIFIER CIRCUIT, LATCH CIRCUIT, AND SENSING DEVICE

(71) Applicant: SEMICONDUCTOR ENERGY LABORATORY CO., LTD., Atsugi (JP)

(72) Inventors: Kei Takahashi, Kanagawa (JP); Yuto Yakubo, Kanagawa (JP); Hiroki Inoue, Kanagawa (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

(21) Appl. No.: 17/265,361

(22) PCT Filed: Jul. 29, 2019

(86) PCT No.: PCT/IB2019/056434
§ 371 (c)(1),
(2) Date: Feb. 2, 2021

(87) PCT Pub. No.: WO2020/031016
PCT Pub. Date: Feb. 13, 2020

(65) Prior Publication Data
US 2021/0294367 A1    Sep. 23, 2021

(30) Foreign Application Priority Data
Aug. 10, 2018 (JP) .............................. JP2018-151318
Aug. 31, 2018 (JP) .............................. JP2018-162313
(Continued)

(51) Int. Cl.
*G05F 1/56*    (2006.01)
*H01L 29/786*    (2006.01)
(Continued)

(52) U.S. Cl.
CPC ............ *G05F 1/56* (2013.01); *H01L 29/7869* (2013.01); *H03F 3/45179* (2013.01); *H03F 3/45183* (2013.01); *H03K 3/356* (2013.01)

(58) Field of Classification Search
CPC ... G05F 1/56; H01L 29/7869; H03F 3/45179; H03F 3/45183; H03F 3/45475;
(Continued)

(56) References Cited

U.S. PATENT DOCUMENTS 4,996,498 A * 2/1991 Hanna ................. H03F 3/45479
327/345
5,963,158 A    10/1999 Yasuda
(Continued)

FOREIGN PATENT DOCUMENTS

JP    51-048228 A    4/1976
JP    10-163773 A    6/1998
(Continued)

OTHER PUBLICATIONS

"Chapter 12 Introduction to Switched-Capacitor Circuits" to Razavi B., Design of Analog CMOS Integrated Circuits, Mar. 1, pp. 537-539 (Year: 2003).*
(Continued)

*Primary Examiner* — Jung Kim
(74) *Attorney, Agent, or Firm* — Nixon Peabody LLP; Jeffrey L. Costellia

(57) ABSTRACT

An output gain of a latch circuit is increased. The latch circuit includes a first circuit, a second circuit, and first to fourth transistors. The latch circuit includes a first input/output terminal and a second input/output terminal. The first circuit and the second circuit have a function of a current source. In the case where the third transistor is off and the fourth transistor is on, the latch circuit is supplied with a first input signal supplied to the first input/output terminal and a
(Continued)

second input signal supplied to the second input/output terminal. In the case where the third transistor is on and the fourth transistor is off, an inverted signal of the first input signal is output to the first input/output terminal of the latch circuit, and an inverted signal of the second input signal is output to the second input/output terminal of the latch circuit. The first circuit and the second circuit increase the output gain of the latch circuit.

14 Claims, 34 Drawing Sheets

(30) Foreign Application Priority Data

Sep. 11, 2018 (JP) .............................. JP2018-170089
Nov. 20, 2018 (JP) .............................. JP2018-217580

(51) Int. Cl.
*H03F 3/45* (2006.01)
*H03K 3/356* (2006.01)

(58) Field of Classification Search
CPC . H03F 3/45188; H03F 3/45192; H03K 3/356; H03K 3/356191; H01M 10/48; Y02E 60/10
See application file for complete search history.

(56) References Cited

U.S. PATENT DOCUMENTS

| | | | |
|---|---|---|---|
| 6,750,704 B1* | 6/2004 | Connell | H03F 3/45753 330/253 |
| 7,868,810 B2 | 1/2011 | Nozawa et al. | |
| 8,542,066 B2 | 9/2013 | Kusuda | |
| 9,742,356 B2 | 8/2017 | Takahashi et al. | |
| 10,250,247 B2 | 4/2019 | Kato et al. | |
| 10,560,056 B2 | 2/2020 | Takahashi et al. | |
| 10,693,448 B2 | 6/2020 | Kato et al. | |
| 2010/0156683 A1 | 6/2010 | Nozawa et al. | |
| 2013/0207727 A1 | 8/2013 | Kusuda | |
| 2017/0230041 A1 | 8/2017 | Kato et al. | |
| 2020/0177132 A1 | 6/2020 | Takahashi et al. | |

FOREIGN PATENT DOCUMENTS

| | | |
|---|---|---|
| JP | 2010-147992 A | 7/2010 |
| JP | 2013-235564 | 11/2013 |
| JP | 2015-507436 | 3/2015 |
| JP | 2017-192124 A | 10/2017 |
| WO | WO-2013/119464 | 8/2013 |

OTHER PUBLICATIONS

Razavi.B, "Chapter 12 Introduction to Switched-Capacitor Circuits", Design of Analog CMOS Integrated Circuits, Mar. 1, 2003, pp. 537-539.
International Search Report (Application No. PCT/IB2019/056434) dated Oct. 21, 2019.
Written Opinion (Application No. PCT/IB2019/056434) dated Oct. 21, 2019.

* cited by examiner

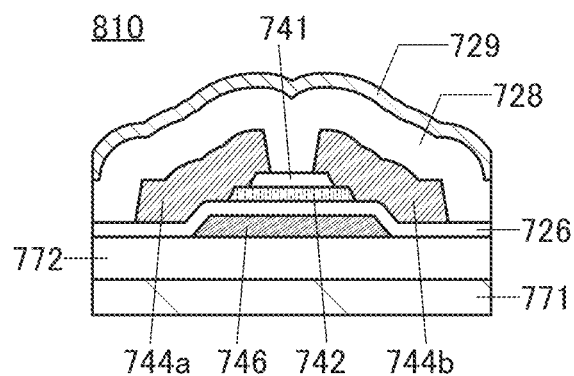
FIG. 9A1
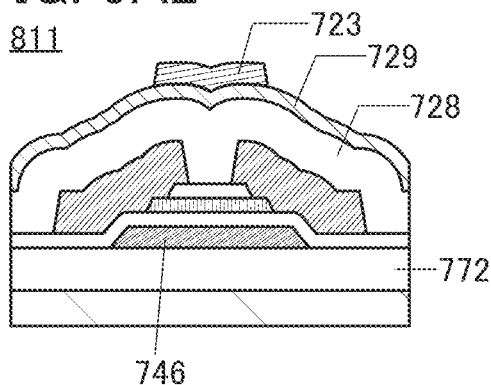
FIG. 9A2
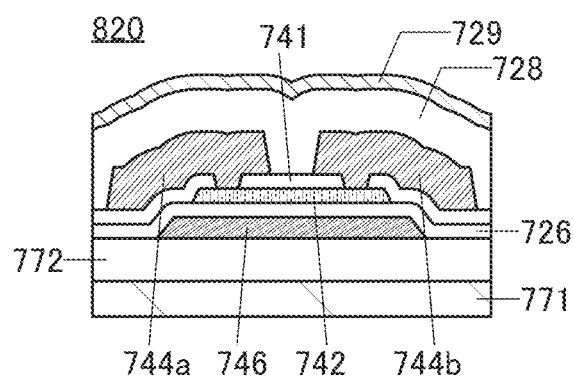
FIG. 9B1
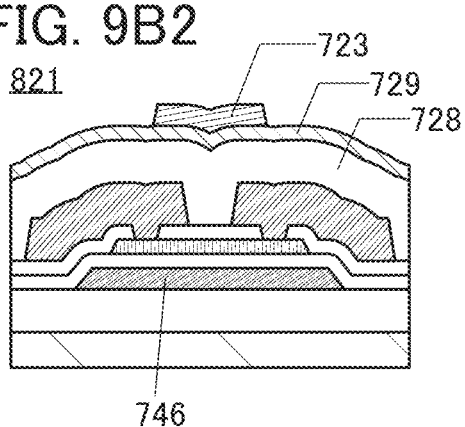
FIG. 9B2
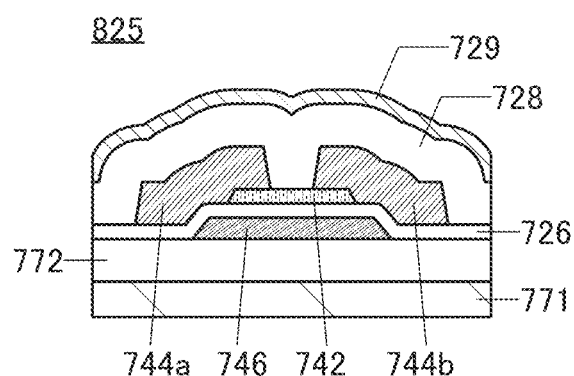
FIG. 9C1
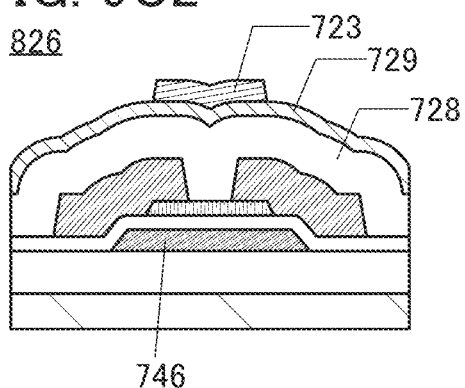
FIG. 9C2

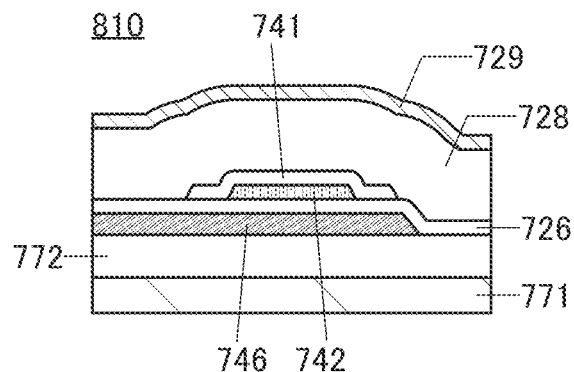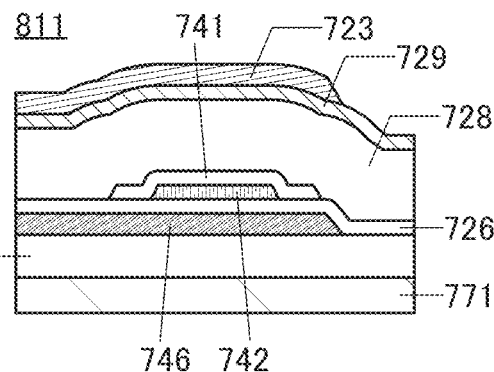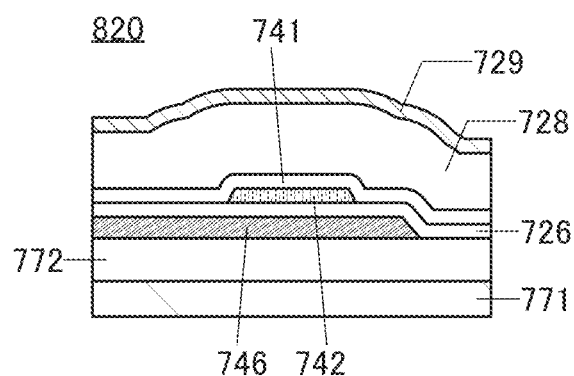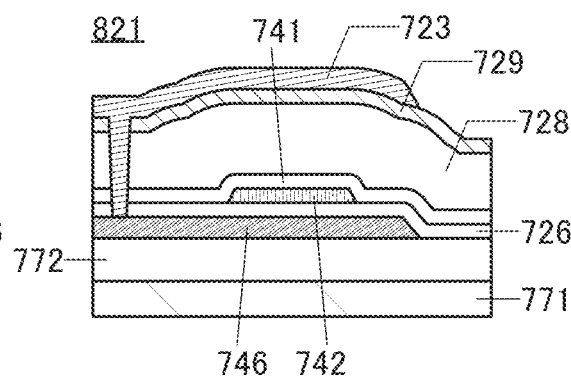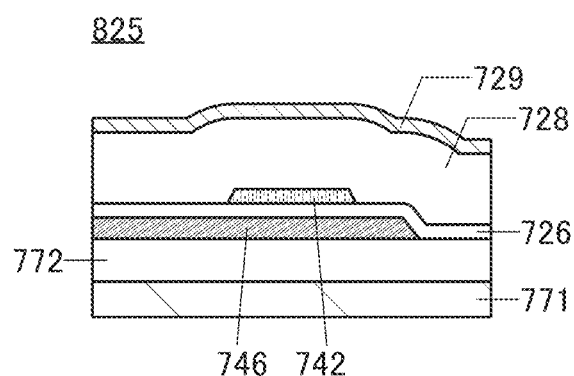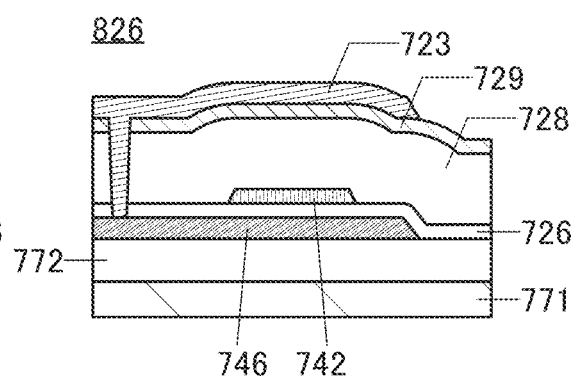

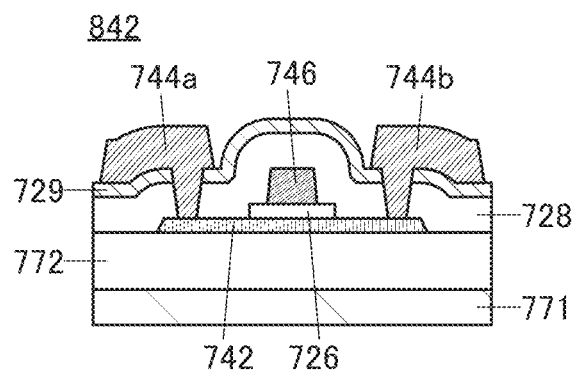
FIG. 11A1
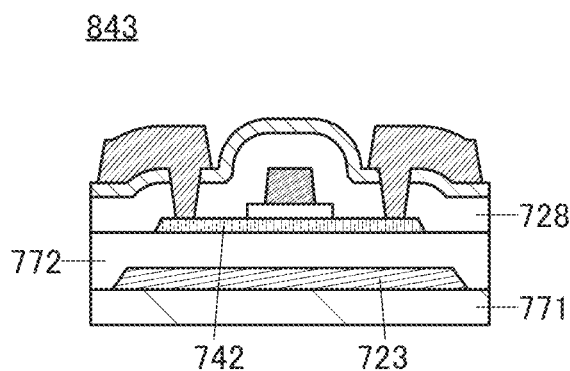
FIG. 11A2
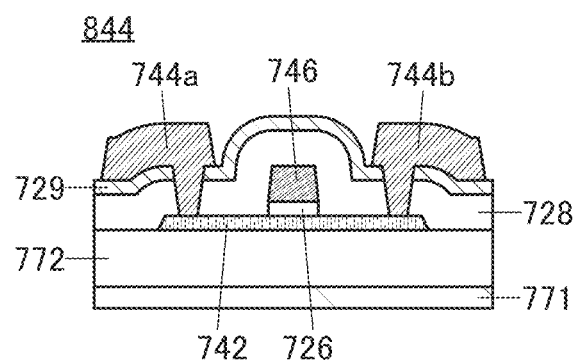
FIG. 11B1
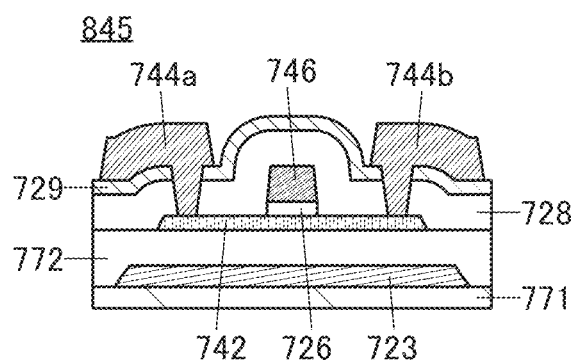
FIG. 11B2
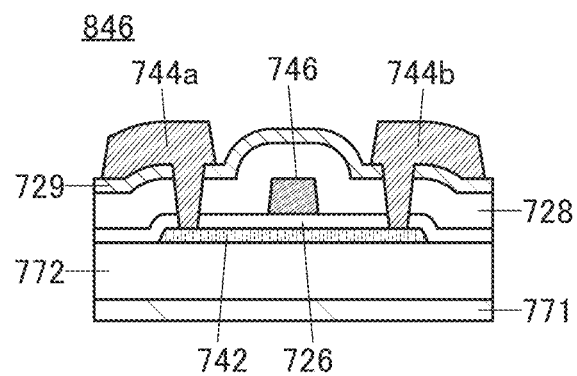
FIG. 11C1
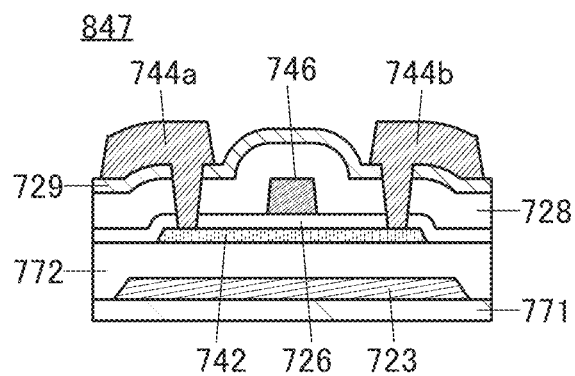
FIG. 11C2

FIG. 12A1 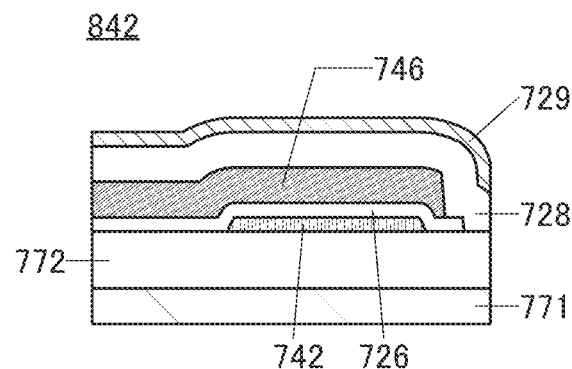 FIG. 12A2 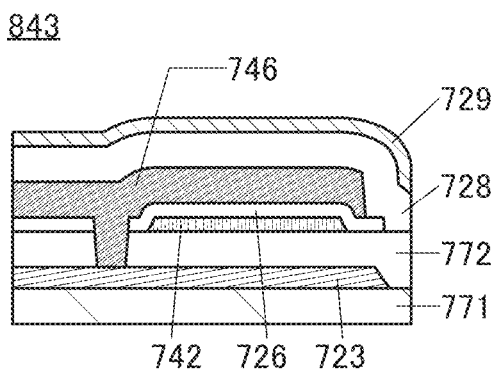
FIG. 12B1 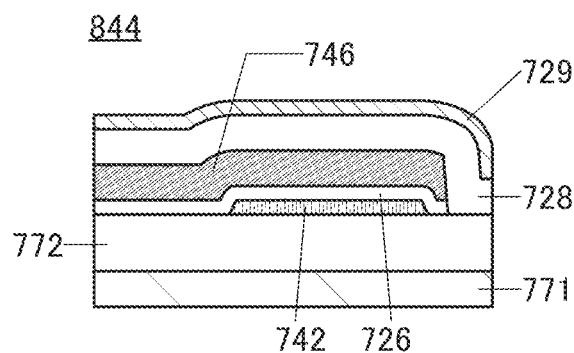 FIG. 12B2 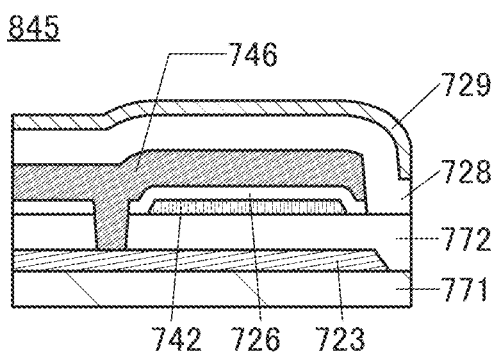
FIG. 12C1 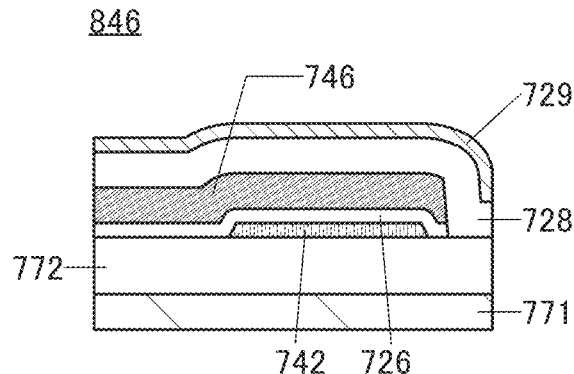 FIG. 12C2 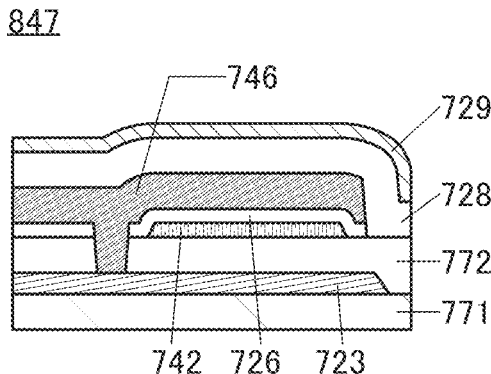

In charging

FIG. 17A1
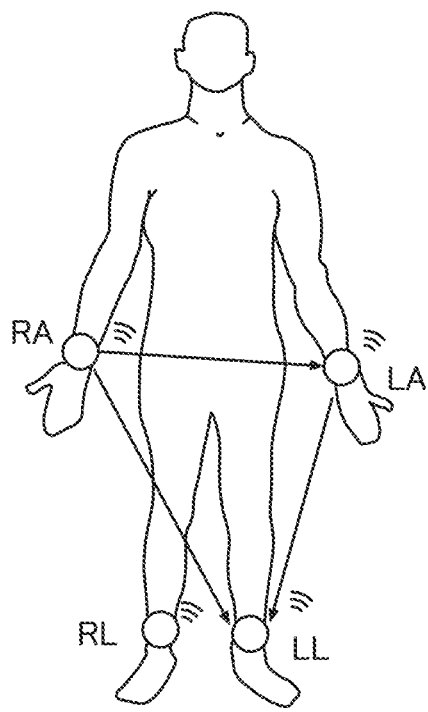
FIG. 17A2
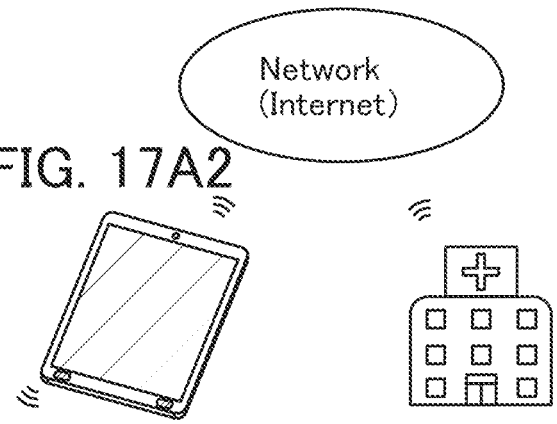
FIG. 17B1  FIG. 17B2  FIG. 17B3  FIG. 17B4
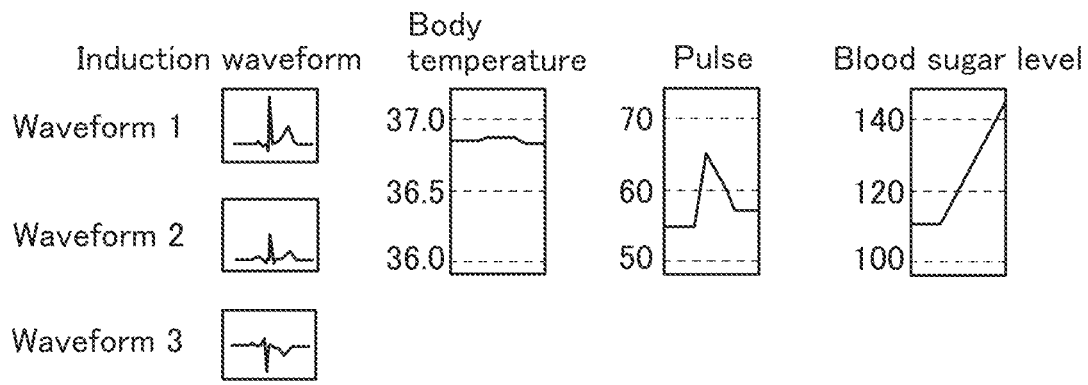

Micro-short Detector

Battery charge

Normal operation

Abnormal operation: Micro-short

FIG. 21A1
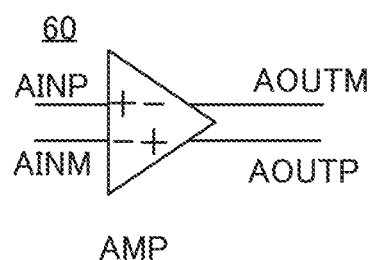
FIG. 21A2
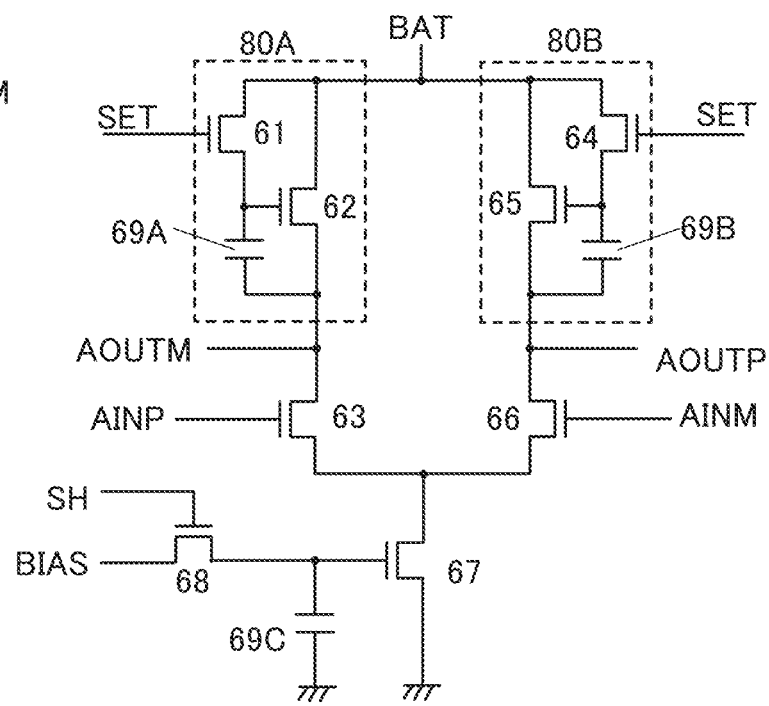
FIG. 21B1
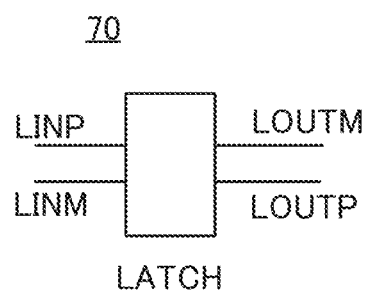
FIG. 21B2
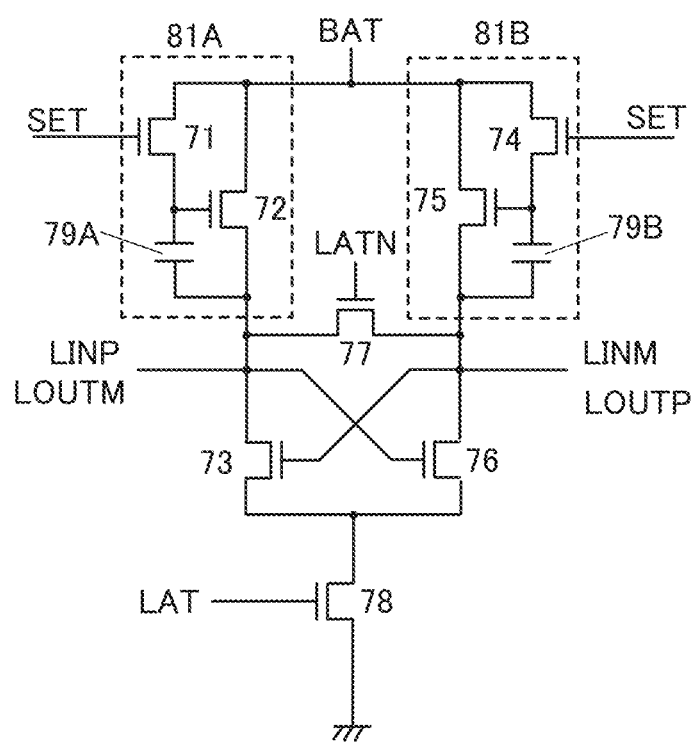

FIG. 25A
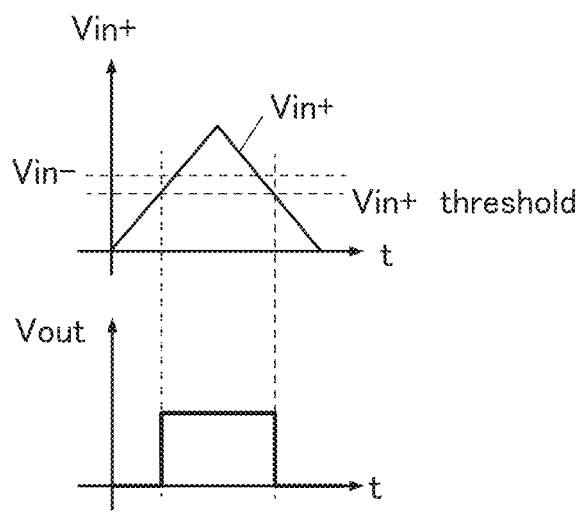
FIG. 25B
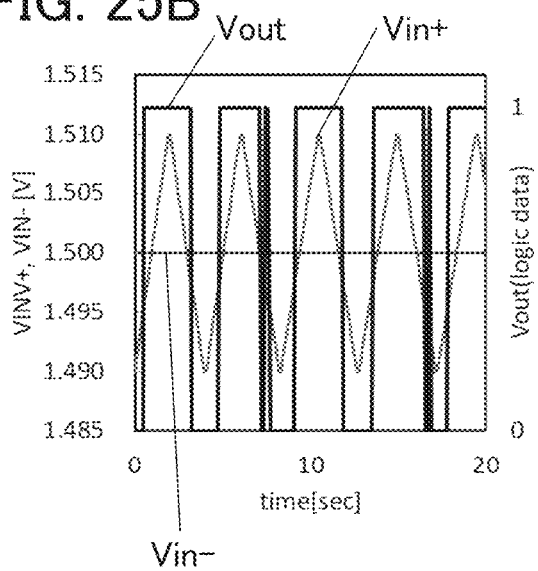
FIG. 25C
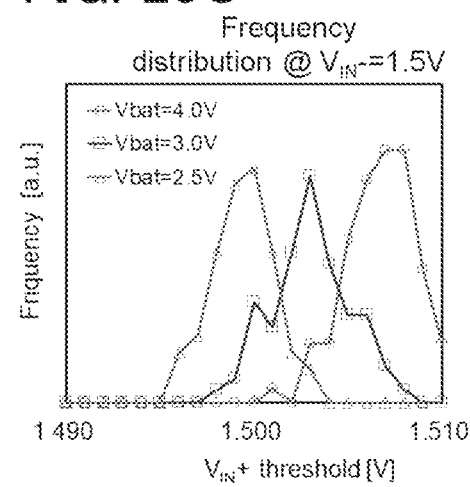
FIG. 25D
| detection voltage | 10[mV] |
|---|---|
| Gain | 52.0 [dB] @ Vbat4.0V |

|  |  | C [F] | ΔV [V] | Δt [sec] | Icut [A] |
|---|---|---|---|---|---|
| VBG | −0.5V | 1pA | 0.1 | < 1 | > 1E−13 |
|  | −1.0V |  |  | 1000 | 1E−16 |
|  | −2.0V |  |  | > 10000 | < 1E−17 |

|  | [5] | [6] | This work |
|---|---|---|---|
| Device | Oxide FET | CMOS | Oxide FET |
| Technology (nm) | 1500 | 180 | 360 |
| Power supply or Vbat. (V) | 3/6 | 3.6~4.1 | 2.5~4.0 |
| #Tr.s | 1.7k | N/A | 1k |
| Frequency (Hz) | 13.56M | – | 4k |
| Power ($\mu$W) | 7500 | 0.3 | 10 |
| Micro-short func. | – | no | yes |

1000

Overcharge voltage control test circuit

Overcurrent control test circuit

Overheat detection cotrol test circuit

Overdischarge control test circuit

AMPLIFIER CIRCUIT, LATCH CIRCUIT, AND SENSING DEVICE

TECHNICAL FIELD

One embodiment of the present invention relates to an amplifier circuit, a latch circuit, a sensing device, a power storage device, a power storage state monitoring device, and an electronic device.

One embodiment of the present invention relates to an object, a method, or a manufacturing method. Alternatively, the present invention relates to a process, a machine, manufacture, or a composition (a composition of matter). One embodiment of the present invention relates to a semiconductor device, a display device, a light-emitting device, a power storage device, a lighting device, or an electronic device. In addition, one embodiment of the present invention relates to a method of controlling charge of a power storage device, a method of estimating the state of a power storage device, and a detection device used for sensing anomaly of a power storage device. In particular, one embodiment of the present invention relates to a charge system of a power storage device, a state estimation system of a power storage device, and an anomaly detection system of a power storage device. An electronic device including the detection device of one embodiment of the present invention includes a medical device that detects a body condition.

Note that in this specification, a power storage device refers to every element and device having a function of storing power. For example, a storage battery (also referred to as secondary battery) such as a lithium-ion secondary battery includes a lithium-ion capacitor, a nickel hydrogen battery; an all-solid-state battery, an electric double layer capacitor, and the like.

In this specification and the like, a semiconductor device means an element, a circuit, a device, or the like that can function by utilizing semiconductor characteristics. For example, a semiconductor element such as a transistor or a diode is a semiconductor device. For another example, a circuit including a semiconductor element is a semiconductor device. For another example, a device provided with a circuit including a semiconductor element is a semiconductor device.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry for portable information terminals such as mobile phones, smartphones, tablets, or laptop computers; game machines; portable music players; digital cameras; medical equipment; next-generation clean energy vehicles such as hybrid electric vehicles (HEVs), electric vehicles (EVs), and plug-in hybrid electric vehicles (PHEVs); electric bikes; or the like, and lithium-ion secondary batteries have become essential as rechargeable energy supply sources for the modern information society.

In the design capacity (DC) of a secondary battery (including a lithium-ion secondary battery), the proportion of the remaining capacity (RC) in the full charge capacity (FCC) of the battery, that is, the state of charge (SOC), is not set to use all of the design capacity from 0% to 100%, and a margin of approximately 5% (or 10%), not 0%, is provided to prevent overdischarge. In addition, to prevent overcharge, a margin of approximately 5% (or 10%), not 100%, is provided; accordingly, a design capacity within a range of 5% to 95% (or within a range of 10% to 90%) is said to be used. In practice, a design capacity of 5% to 95% (or within a range of 10% to 90%) is used by setting the voltage range of an upper limit voltage $V_{max}$ and a lower limit voltage $V_{min}$ using a BMS (Battery Management System) connected to a secondary battery.

A secondary battery is degraded by charging and discharging, change over time, a temperature change, or the like. Therefore, the secondary battery can be managed by accurately determining the state of the inside of the secondary battery, particularly the SOC (state of charge). By accurately determining the SOC, the voltage range of the upper limit voltage $V_{max}$ and the lower limit voltage $V_{min}$ can be widened. Thus, in order to manage the secondary battery, a sensing device that accurately determines the state of the inside of the secondary battery, particularly the SOC (state of charge) has been demanded.

Patent Document 1 discloses an example of a semiconductor device that can be used for sensing a change in potential.

REFERENCE

Patent Document

[Patent Document 1] Japanese Published Patent Application No. 2013-235564

SUMMARY OF THE INVENTION

Problems to be Solved by the Invention

One object is to compensate for a reduction in output potential due to a source follower circuit included in a sensing device in the case where a power supply voltage supplied to the sensing device that detects a change in potential becomes low.

Another object is to inhibit a reduction in driving current capability of an output signal of a sensing device in the case where a power supply voltage applied to the sensing device that detects a change in potential becomes high. An object of a sensing device is to output a stable output signal regardless of a power supply voltage supplied to a sensing device.

Another object is to reduce the manufacturing cost of a sensing device.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a sensing device including a first amplifier circuit and a second amplifier circuit. The first amplifier circuit includes a first source follower circuit. The first amplifier circuit includes a first input terminal supplied with a first input signal, a second input terminal supplied with a second input signal, and first to fourth terminals. The first amplifier circuit has a function of generating a first output signal from the first input signal and a function of generating a second output signal from the second input signal. The first output signal is converted into a third output signal through the first source follower circuit, and the third output signal is supplied to the first terminal. The first output signal is supplied to the second terminal without through the first source follower circuit. The second output signal is converted into a fourth output signal through the first source follower circuit, and the fourth output signal is supplied to the third terminal. The second output signal is supplied to the fourth terminal without through the first source follower circuit. The second amplifier circuit has a function of being supplied with the first to fourth output signals from the first amplifier circuit and outputting a fifth output signal or a sixth output signal.

One embodiment of the present invention is a sensing device including a first amplifier circuit and a second amplifier circuit. The first amplifier circuit includes a first source follower circuit. The first amplifier circuit includes a first terminal supplied with a first input signal, a second terminal supplied with a second input signal, a third terminal supplied with a third input signal, a fourth terminal supplied with a fourth input signal, and fifth to eighth terminals. The first amplifier circuit has a function of generating a first output signal from the first input signal and the third input signal and a function of generating a second output signal from the second input signal and the fourth input signal. The first output signal is converted into a third output signal through the first source follower circuit, and the third output signal is supplied to the fifth terminal. The first output signal is supplied to the sixth terminal without through the first source follower circuit. The second output signal is converted into a fourth output signal through the first source follower circuit, and the fourth output signal is supplied to the seventh terminal. The second output signal is supplied to the eighth terminal without through the first source follower circuit. The second amplifier circuit has a function of being supplied with the first to fourth output signals from the first amplifier circuit and outputting a fifth output signal or a sixth output signal.

In the above structure, the sensing device includes a memory circuit. The memory circuit includes a first transistor and a capacitor. The memory circuit is electrically connected to the first terminal. In the sensing device, the first input signal is preferably supplied to the capacitor included in the memory circuit through the first transistor, and the first amplifier circuit preferably senses a potential relationship between the first input signal supplied to the first input terminal and the second input signal supplied to the second input terminal.

In each of the above structures, it is preferable that the first amplifier circuit include a second transistor, the second amplifier circuit include a third transistor, and any one of the first to third transistors include a metal oxide in a semiconductor layer.

In each of the above structures, the second or third transistor preferably includes a back gate.

One embodiment of the present invention is an amplifier circuit including a first circuit, a second circuit, first to fourth transistors, a first capacitor, and a second capacitor. The amplifier circuit includes a first output terminal and a second output terminal. The first circuit and the second circuit have a function of a current source. An output terminal of the first circuit is electrically connected to one of a source and a drain of the first transistor, one electrode of the first capacitor, and the first output terminal. An output terminal of the second circuit is electrically connected to one of a source and a drain of the second transistor, one electrode of the second capacitor, and the second output terminal. One of a source and a drain of the third transistor is electrically connected to the other of the source and the drain of the first transistor and the other of the source and the drain of the second transistor. A gate of the third transistor is electrically connected to one of a source and a drain of the fourth transistor, the other electrode of the first capacitor, and the other electrode of the second capacitor.

In the above structure, the amplifier circuit includes a first input terminal, a second input terminal, and a third input terminal. A first wiring supplied with a first input signal is electrically connected to a gate of the first transistor. A second wiring supplied with a second input signal is electrically connected to a gate of the second transistor. The third input terminal has a function of supplying a program potential to the other electrode of the first capacitor or the other electrode of the second capacitor through the fourth transistor. In the case where a signal having the same potential as the first input signal is supplied as the second input signal, the first output signal output to the first output terminal preferably has substantially the same potential as the potential of the second output signal output to the second output terminal.

In the above structure, the amplifier circuit further includes a third capacitor whose capacitance is smaller than or equal to half of the combined capacitance of the first capacitor and the second capacitor. The third capacitor is electrically connected to the gate of the third transistor, the one of the source and the drain of the fourth transistor, the other electrode of the first capacitor, and the other electrode of the second capacitor. The program potential is preferably supplied to the other electrode of the first capacitor, the other electrode of the second capacitor, and one electrode of the third capacitor through the fourth transistor.

In the above structure, each of the first circuit and the second circuit includes a fifth transistor, a sixth transistor, a fourth capacitor, and a fourth input terminal. One of a source and a drain of the fifth transistor is electrically connected to one electrode of the fourth capacitor and the one of the source and the drain of the first transistor. A gate of the fifth transistor is electrically connected to one of a source and a drain of the sixth transistor and the other electrode of the fourth capacitor. A data potential supplied to the fourth input terminal has a function of controlling the amount of current supplied to the first output terminal through the sixth transistor. The first circuit has a function of supplying current to the first output terminal without being influenced by the amount of current flowing in the first transistor by the first input signal. The second circuit has a function of supplying current to the second output terminal without being influenced by the amount of current flowing in the second transistor by the second input signal. An output potential of the first output terminal or the second output terminal is preferably corrected by a potential supplied to the gate of the third transistor according to the first input signal or the second input signal.

One embodiment of the present invention is a latch circuit including a first circuit, a second circuit, and first to fourth transistors. The latch circuit includes a first input/output terminal and a second input/output terminal. The first circuit and the second circuit have a function of a current source. An output terminal of the first circuit is electrically connected to one of a source and a drain of the first transistor, a gate of the second transistor, one of a source and a drain of the third transistor, and the first input/output terminal. An output terminal of the second circuit is electrically connected to one of a source and a drain of the second transistor, a gate of the first transistor, the other of the source and the drain of the third transistor, and the second input/output terminal. One of a source and a drain of the fourth transistor is electrically connected to the other of the source and the drain of the first transistor and the other of the source and the drain of the second transistor. In the case where the third transistor is off and the fourth transistor is on, the latch circuit is supplied with a first input signal supplied to the first input/output terminal and a second input signal supplied to the second input/output terminal. In the case where the third transistor is on and the fourth transistor is off, an inverted signal of the first input signal is output to the first input/output terminal of the latch circuit, and an inverted signal of the second input signal is output to the second input/output terminal of the latch circuit. Note that in each of the above structures, each of the first to fourth transistors in the amplifier circuit includes a metal oxide in a semiconductor layer, and each of the transistors includes a back gate.

Effect of the Invention

In one embodiment of the present invention, an influence of a power supply voltage supplied to a sensing device that detects a change in potential upon a sensing range of the sensing device can be reduced. In one embodiment of the present invention, all the transistors used in the sensing device are n-type transistors or p-type transistors, whereby the manufacturing cost can be reduced.

In the case where the power supply voltage supplied to the sensing device that detects a change in potential becomes low, a reduction in output potential due to the source follower circuit included in the sensing device can be compensated for. In the case where the power supply voltage supplied to the sensing device that detects a change in potential becomes high, a reduction in the driving current capability of the output signal of the sensing device can be inhibited. The sensing device can output a stable output signal regardless of a power supply voltage supplied to the sensing device. The manufacturing cost of the sensing device can be reduced.

Note that the effects of one embodiment of the present invention are not limited to the effects listed above. The effects listed above do not preclude the existence of other effects. Note that the other effects are effects that are not described in this section and will be described below. The effects that are not described in this section will be derived from the descriptions of the specification, the drawings, and the like and can be extracted from these descriptions by those skilled in the art. Note that one embodiment of the present invention has at least one of the effects listed above and/or the other effects. Accordingly, depending on the case, one embodiment of the present invention does not have the effects listed above in some cases.

BRIEF DESCRIPTION OF THE DRAWINGS

FIG. 9A1, FIG. 9A2, FIG. 9B1, FIG. 9B2, FIG. 9C1, and FIG. 9C2 are diagrams illustrating transistors.

FIG. 10A1, FIG. 10A2, FIG. 10B1, FIG. 10B2, FIG. 10C1, and FIG. 10C2 are diagrams illustrating transistors.

FIG. 11A1, FIG. 11A2, FIG. 11B1, FIG. 11B2, FIG. 11C1, and FIG. 11C2 are diagrams illustrating transistors.

FIG. 12A1, FIG. 12A2, FIG. 12B1, FIG. 12B2, FIG. 12C1, and FIG. 12C2 are diagrams illustrating transistors.

FIG. 17A1, FIG. 17A2, FIG. 17B1, FIG. 17B2, FIG. 17B3, and FIG. 17B4 are diagrams showing electronic devices.

FIG. 21A1, FIG. 21A2, FIG. 21B1, and FIG. 21B2 are circuit diagrams showing a comparison circuit.

FIG. 25A to FIG. 25D are measurement data of a comparison circuit.

MODE FOR CARRYING OUT THE INVENTION

Figure 1A:
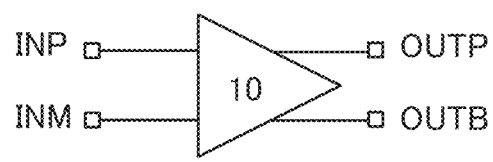
FIG. 1A and FIG. 1B are block diagrams illustrating a sensing device.

Embodiments will be described below with reference to the drawings. Note that the embodiments can be implemented with many different modes, and it will be readily understood by those skilled in the art that modes and details thereof can be changed in various ways without departing from the spirit and scope thereof. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. The drawings are schematic views showing ideal examples, and embodiments of the present invention are not limited to shapes or values shown in the drawings.

Furthermore, it is noted that ordinal numbers such as "first", "second", and "third" used in this specification are used in order to avoid confusion among components, and the terms do not limit the components numerically.

In this specification, terms for describing arrangement, such as "over" and "under", are used for convenience in describing a positional relation between components with reference to drawings. Furthermore, the positional relationship between components is changed as appropriate in accordance with the direction in which each component is described. Thus, terms for the description are not limited to those used in this specification, and the description can be rephrased appropriately depending on the situation.

In this specification and the like, a transistor is an element having at least three terminals of a gate, a drain, and a source. The transistor has a channel formation region between the drain (a drain terminal, a drain region, or a drain electrode) and the source (a source terminal, a source region, or a source electrode), and can make current flow between the source and the drain through the channel formation region. Note that in this specification and the like, a channel formation region refers to a region through which current mainly flows.

Furthermore, functions of a source and a drain might be switched when a transistor of opposite polarity is employed or when a direction of current flow is changed in circuit operation, for example. Thus, the terms of source and drain are interchangeably used in this specification and the like.

In this specification and the like, "electrically connected" includes the case where connection is made through an "object having any electric function". Here, there is no particular limitation on the "object having any electric function" as long as electric signals can be transmitted and received between the connected components. Examples of the "object having any electric action" include a switching element such as a transistor, a resistor, an inductor, a capacitor, and other elements with a variety of functions as well as an electrode and a wiring.

In this specification and the like, "parallel" indicates a state where two straight lines are placed at an angle of greater than or equal to $-10°$ and less than or equal to $10°$. Accordingly, the case where the angle is greater than or equal to $-5°$ and less than or equal to $5°$ is also included. Moreover, "perpendicular" indicates a state where two straight lines are placed at an angle of greater than or equal to $80°$ and less than or equal to $100°$. Accordingly, the case where the angle is greater than or equal to $85°$ and less than or equal to $95°$ is also included.

Moreover, in this specification and the like, the term "film" and the term "layer" can be interchanged with each other. For example, the term "conductive layer" can be changed into the term "conductive film" in some cases. Moreover, the term "insulating film" can be changed into the term "insulating layer" in some cases.

Furthermore, unless otherwise specified, off-state current in this specification and the like refers to drain current of a transistor in an off state (also referred to as a non-conducting state or a cutoff state). Unless otherwise specified, the off state of an n-channel transistor refers to a state where the voltage Vgs between its gate and source is lower than the threshold voltage Vth, and the off state of a p-channel transistor refers to a state where the voltage Vgs between its gate and source is higher than the threshold voltage Vth. For example, the off-state current of an n-channel transistor sometimes refers to a drain current at the time when the voltage Vgs between its gate and source is lower than the threshold voltage Vth.

The off-state current of a transistor depends on Vgs in some cases. Thus, when there is Vgs with which the off-state current of the transistor is lower than or equal to I, it may be said that the off-state current of the transistor is lower than or equal to I.

As an example, the assumption is made of an n-channel transistor where the threshold voltage Vth is 0.5 V, and the drain current at Vgs of 0.5 V is $1\times10^{-9}$ A, the drain current at Vgs of 0.1 V is $1\times10^{-13}$ A, the drain current at Vgs of $-0.5$ V is $1\times10^{-19}$ A, and the drain current at Vgs of $-0.8$ V is $1\times10^{-22}$ A. The drain current of the transistor is lower than or equal to $1\times10^{-19}$ A at Vgs of $-0.5$ V or at Vgs in the range of $-0.5$ V to $-0.8$ V; therefore, it is sometimes said that the off-state current of the transistor is lower than or equal to $1\times10^{-19}$ A. Since there is Vgs at which the drain current of the transistor is lower than or equal to $1\times10^{-22}$ A, it is sometimes said that the off-state current of the transistor is lower than or equal to $1\times10^{-22}$ A.

In this specification and the like, the off-state current of a transistor having a channel width W is sometimes represented by the value of flowing current per channel width W. Alternatively, it is sometimes represented by the value of flowing current per given channel width (e.g., 1 μm). In the latter case, the off-state current is sometimes represented by the unit with the dimension of current per length (e.g., A/μm).

The off-state current of a transistor depends on temperature in some cases. Unless otherwise specified, the off-state current in this specification sometimes refers to off-state current at room temperature, 60° C., 85° C., 95° C., or 125° C. Alternatively, the off-state current sometimes refers to off-state current at a temperature at which reliability of a semiconductor device or the like including the transistor is ensured or a temperature at which a semiconductor device or the like including the transistor is used (e.g., any temperature in the range of 5° C. to 35° C.). The off-state current of the transistor being lower than or equal to I sometimes means that there is Vgs at which the off-state current of a transistor is lower than or equal to I at room temperature, 60° C., 85° C., 95° C., 125° C., a temperature at which reliability of a semiconductor device or the like including the transistor is ensured, or a temperature at which the semiconductor device or the like including the transistor is used (e.g., any temperature in the range of 5° C. to 35° C.).

The off-state current of a transistor depends on the voltage Vds between its drain and source in some cases. Unless otherwise specified, the off-state current in this specification sometimes refers to an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current sometimes refers to off-state current at Vds at which reliability of a semiconductor device or the like including the transistor is ensured or Vds used in the semiconductor device or the like including the transistor. The off-state current of the transistor being lower than or equal to I sometimes means that there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which reliability of a semiconductor device or the like including the transistor is ensured, or at Vds used in the semiconductor device or the like including the transistor.

In the above description of the off-state current, the drain may be replaced with the source. That is, the off-state current sometimes refers to a current that flows through a source of a transistor in an off state.

In this specification and the like, leakage current sometimes expresses the same meaning as off-state current. Furthermore, in this specification and the like, the off-state current sometimes refers to current that flows between a source and a drain of a transistor in an off state, for example.

Note that voltage refers to a difference between potentials of two points, and a potential refers to electrostatic energy (electric potential energy) of a unit charge at a given point in an electrostatic field. In general, a difference between a potential of one point and a reference potential (e.g., a ground potential) is merely called a potential or voltage, and a potential and voltage are used as synonyms in many cases. Therefore, in this specification, a potential may be rephrased as a voltage and a voltage may be rephrased as a potential unless otherwise specified.

Embodiment 1

In this embodiment, a sensing device will be described. The sensing device described in this embodiment is preferably used as a sensing device that manages a secondary battery. Note that the sensing device described in this embodiment is preferably applied to a charging system of a power storage device, a state estimation system of a power storage device, an anomaly sensing system of a power storage device, or a power storage device included in an electronic device.

First, the sensing device of one embodiment of the present invention will be described. The sensing device includes a first input terminal, a second input terminal, a first output terminal, and a second output terminal. Note that a first input signal is supplied to the first input terminal, a second input signal is supplied to the second input terminal, and an output signal output from the sensing device is supplied to a third output terminal or a fourth output terminal.

The sensing device is a semiconductor device having a function of a comparison circuit. Therefore, a given potential is preferably supplied to the first input terminal as the first input signal. For example, the first input signal can function as a reference potential when the sensing device functions as a comparison circuit, and the first input signal can sense the of a potential of the second input signal supplied to the second terminal.

The sensing device of one embodiment of the present invention preferably includes a first amplifier circuit and a second amplifier circuit, and the first amplifier circuit preferably includes a first source follower circuit. For example, the first amplifier circuit includes the first input terminal supplied with the first input signal, the second input terminal supplied with the second input signal, and first to fourth terminals.

The first amplifier circuit has a function of generating a first output signal from the first input signal and a function of generating a second output signal from the second input signal. The first output signal is converted into a third output signal through the first source follower circuit, and the third output signal is supplied to the first terminal. The first output signal is supplied to the second terminal without through the first source follower circuit. The second output signal is converted into a fourth output signal through the first source follower circuit, and the fourth output signal is supplied to the third terminal. The second output signal is supplied to the fourth terminal without through the first source follower circuit.

The second amplifier circuit can be supplied with the first to fourth output signals from the first amplifier circuit and output a fifth output signal or a sixth output signal as a sensing result.

Next, a sensing device different from the above sensing device of one embodiment of the present invention will be described. In one embodiment of the present invention, it is preferable that the above second amplifier circuit and a third amplifier circuit be included and the third amplifier circuit include a second source follower circuit. The sensing device differs in that the third amplifier circuit includes the first terminal supplied with the first input signal, the second terminal supplied with the second input signal, the third terminal supplied with a third input signal, the fourth terminal supplied with a fourth input signal, and fifth to eighth terminals.

The third amplifier circuit has a function of generating a seventh output signal from the first input signal and the third input signal and a function of generating an eighth output signal from the second input signal and the fourth input signal. The seventh output signal is converted into a ninth output signal through the first source follower circuit, and the ninth output signal is supplied to the fifth terminal. The seventh output signal is supplied to the sixth terminal without through the first source follower circuit. The eighth output signal is converted into a tenth output signal through the first source follower circuit, and the tenth output signal is supplied to the seventh terminal. The eighth output signal is supplied to the eighth terminal without through the first source follower circuit.

The second amplifier circuit can be supplied with the seventh to tenth signals from the third amplifier circuit and output the fifth output signal or the sixth output signal as a sensing result.

Furthermore, the sensing device preferably includes a memory circuit. The memory circuit includes a first transistor and a capacitor. The memory circuit is electrically connected to the first terminal. The capacitor included in the memory circuit is supplied with the first input signal through the first transistor. The first amplifier circuit can sense which one of a potential of the first input signal supplied to the first input terminal and a potential of the second input signal supplied to the second input terminal is higher.

Note that the memory circuit includes the first transistor, the first amplifier circuit includes a second transistor, and the second amplifier circuit includes a third transistor.

Next, the sensing device described in this embodiment will be described in detail with reference to FIG. 1 to FIG. 8. FIG. 1A is a block diagram of a sensing device 10. The sensing device 10 includes a terminal INP, a terminal INM, a terminal OUTP, and a terminal OUTB.

Figure 1B:
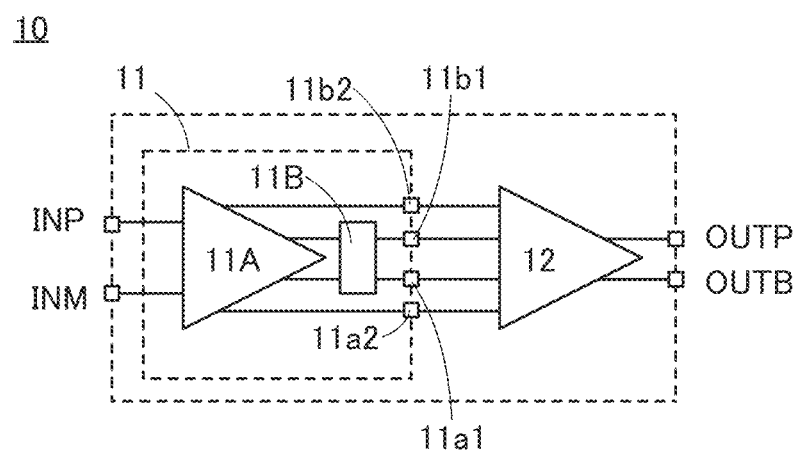

FIG. 1B is a block diagram of the sensing device 10. The sensing device 10 includes a comparison circuit 11 and a comparison circuit 12. The comparison circuit 11 includes an amplifier circuit 11A and a source follower circuit 11B. The comparison circuit 11 functions as an amplifier circuit in an input stage including two terminals supplied with an input signal, and the comparison circuit 12 functions as an amplifier circuit in an output stage including four terminals supplied with an input signal. In addition, the comparison circuit 11 includes a terminal 11a1, a terminal 11a2, a terminal 11b1, and a terminal 11b2.

The comparison circuit 11 is electrically connected to the comparison circuit 12 through the terminal 11a1, the terminal 11a2, the terminal 11b1, and the terminal 11b2.

The comparison circuit 11 has a function of generating the first output signal from the first input signal and a function of generating the second output signal from the second input signal.

The first output signal is converted into the third output signal through the source follower circuit 11B, and the third output signal is supplied to the terminal 11a1. The first output signal is supplied to the terminal 11a2 without through the source follower circuit 11B. The second output signal is converted into the fourth output signal through the source follower circuit 11B, and the fourth output signal is supplied to the terminal 11b1. The second output signal is supplied to the terminal 11b2 without through the source follower circuit 11B.

The comparison circuit 12 is supplied with the first to fourth output signals from the comparison circuit 11 and can output an output signal OUTP or an output signal OUTB.

Figure 2A:
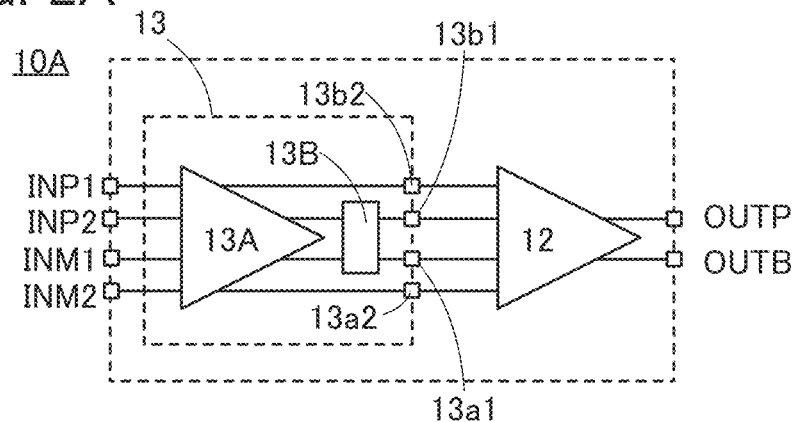
FIG. 2A to FIG. 2C are block diagrams each illustrating a sensing device.

FIG. 2A is a block diagram of a sensing device 10A different from the sensing device 10. Note that portions different from the sensing device 10 will be described with reference to FIG. 2A, and description of the components denoted by the same reference numerals as those in FIG. 1B may be omitted.

The sensing device 10A in FIG. 2A differs from the sensing device 10 in that a comparison circuit 13 is included and the comparison circuit 13 includes an amplifier circuit 13A and a source follower circuit 13B. The comparison circuit 13 functions as an input stage. The comparison circuit 13 includes a terminal INP1 supplied with the first input signal, a terminal INM1 supplied with the second input signal, a terminal INP2 supplied with the third input signal, a terminal INM2 supplied with the fourth input signal, a terminal 13a1 supplied with the ninth output signal, a terminal 13a2 supplied with the seventh output signal, a terminal 13b1 supplied with the tenth output signal, and a terminal 13b2 supplied with the eighth output signal.

The comparison circuit 13 is electrically connected to the comparison circuit 12 through the terminal 13a1, the terminal 13a2, the terminal 13b1, and the terminal 13b2.

The comparison circuit 13 has a function of generating the seventh output signal from the first input signal and the third input signal and a function of generating the eighth output signal from the second input signal and the fourth input signal.

The seventh output signal is converted into the ninth output signal through the source follower circuit 13B, and the ninth output signal is supplied to the terminal 13a1. The seventh output signal is supplied to the terminal 13a2 without through the source follower circuit 13B. The eighth output signal is converted into the tenth output signal through the source follower circuit 13B, and the tenth output signal is supplied to the terminal 13b1. The eighth output signal is supplied to the terminal 13b2 without through the source follower circuit 13B.

The comparison circuit 12 can be supplied with the seventh to tenth signals from the comparison circuit 13 and output the third output signal or the fourth output signal as a sensing result.

Figure 2B:
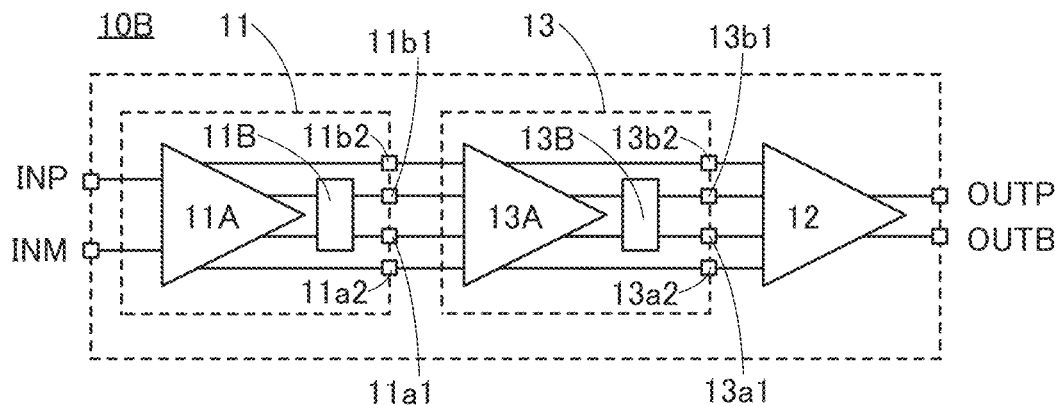

FIG. 2B illustrates a sensing device 10B in which the sensing device 10 illustrated in FIG. 1B and the sensing device 10A illustrated in FIG. 2A are combined. The sensing device 10B includes the comparison circuit 11, the comparison circuit 12, and the comparison circuit 13.

In the sensing device 10B, the comparison circuit 11 is electrically connected to the comparison circuit 13, and the comparison circuit 13 is electrically connected to the comparison circuit 12. That is, by supplying the first input signal or the second input signal to the sensing device 10B, the third output signal or the fourth output signal is output as a sensing result.

Note that in the example of the sensing device 10B, one comparison circuit 13 functioning as a relay stage is provided between the comparison circuit 11 and the comparison circuit 12. Note that the number of comparison circuits 13 is not limited. For example, in a sensing device 10C illustrated in FIG. 2C and described as an example, n comparison circuits 13 are provided. By provision of the plurality of comparison circuits 13, a gain necessary for the sensing device can be amplified by the number of stages. It is an effective method for amplifying a necessary gain by the number of stages in the case where all transistors included in the comparison circuits 13 are n-type transistors or p-type transistors, for example. Note that the case where all transistors included in the sensing device or the comparison circuit are n-type transistors or p-type transistors may be rephrased as the case where the sensing device or the comparison circuit includes transistors having the same conductivity. Note that n is an integer greater than or equal to 1.

Figure 3:
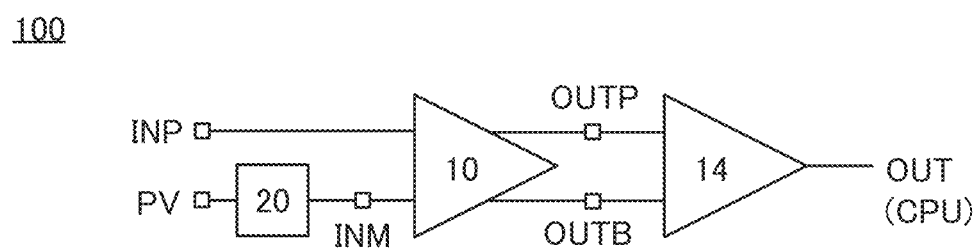
FIG. 3 is a block diagram illustrating a sensing device.

FIG. 3 illustrates a block diagram of a semiconductor device 100 including the sensing device 10 that manages a secondary battery. The semiconductor device 100 includes the sensing device 10, the memory circuit 20, and an output circuit 14. The output circuit 14 has a function of outputting a signal OUT as an output signal. Furthermore, the output circuit 14 preferably has a function of a level shifter circuit that corrects an output signal of the sensing device 10 so that the output signal has an appropriate signal amplitude and a function of a buffer circuit.

A secondary battery or the like is preferably connected to the terminal INP of the sensing device 10. The memory circuit 20 is preferably electrically connected to the terminal INM of the sensing device 10. The memory circuit 20 is supplied with the first input signal through a wiring PV. The sensing device 10 can sense the remaining amount of the secondary battery connected to the terminal INP by comparison with a first potential supplied to the memory circuit 20. Note that the memory circuit 20 will be described in detail with reference to FIG. 5B.

Note that a primary battery, a solar battery, a funnel battery a biological battery, or a sensor included in an electronic device (a sensor having a function of measuring force, displacement, position, speed, acceleration, angular velocity, rotational frequency, distance, light, liquid, magnetism, temperature, a chemical substance, sound, time, hardness, an electric field, power, radioactive rays, flow rate, humidity, a gradient, oscillation, odor, or infrared rays and converting it to a voltage or current) other than a secondary battery may be connected to the terminal INP.

When a potential of the remaining battery amount of a secondary battery becomes lower than or equal to a potential specified by the first input signal, for example, the third output signal or the fourth output signal of the sensing device 10 changes, and the sensing device 10 can output the signal OUT through the output circuit 14. The output of the signal OUT is electrically connected to a CPU, an error detection circuit (not illustrated), or the like, whereby the remaining amount of the secondary battery can be managed.

As a different example, when a potential of the remaining battery amount of the secondary battery becomes higher than or equal to a potential specified by the first input signal, the third output signal or the fourth output signal of the sensing device 10 changes, and the sensing device 10 can output the signal OUT through the output circuit 14. The output of the signal OUT is electrically connected to a CPU, an error detection circuit (not illustrated), or the like, leading to protection of the secondary battery from overcharge. Note that although an example in which the sensing device 10 is used for management of a state of the secondary battery is described, the sensing device 10 may be used for management of a state of a sensor included in an electronic device.

Figure 4:
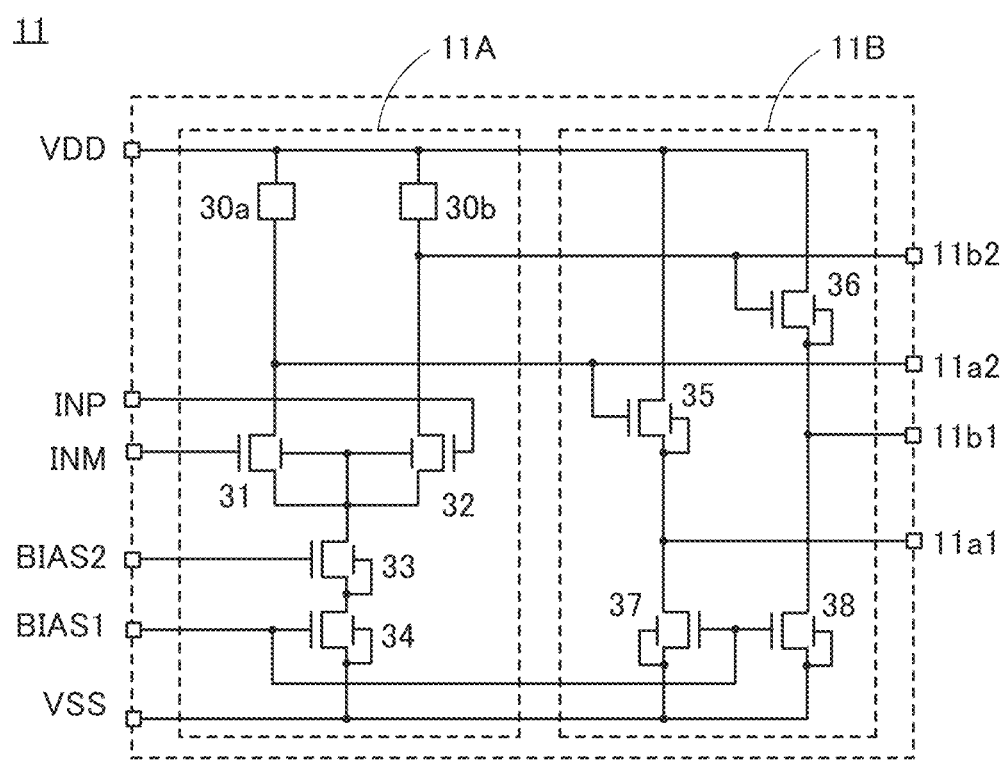
FIG. 4 is a circuit diagram illustrating a sensing device.

Next, FIG. 4 is a circuit diagram of the comparison circuit 11. The comparison circuit 11 corresponds to an input stage of the sensing device 10. The comparison circuit 11 includes the amplifier circuit 11A and the source follower circuit 11B. The amplifier circuit 11A includes a circuit 30a, a circuit 30b, and a transistor 31 to a transistor 38. The source follower circuit 11B includes the transistor 35 to the transistor 38. Note that the circuit 30a or the circuit 30b may be a diode. Alternatively, the circuit 30a or the circuit 30b may be composed of a diode-connected transistor. Note that the circuit 30a or the circuit 30b will be described in detail with reference to FIG. 5C.

A wiring VDD is electrically connected to one electrode of the circuit 30a, one electrode of the circuit 30b, one of a source and a drain of the transistor 35, and one of a source and a drain of the transistor 36.

The other electrode of the circuit 30a is electrically connected to one of a source and a drain of the transistor 31, a gate of the transistor 35, and the terminal 11a2. The other electrode of the circuit 30b is electrically connected to one of a source and a drain of the transistor 32, a gate of the transistor 36, and the terminal 11b2. A gate of the transistor 31 is electrically connected to the terminal INM. A gate of the transistor 32 is electrically connected to the terminal INP. The other of the source and the drain of the transistor 31 is electrically connected to the other of the source and the drain of the transistor 32, one of a source and a drain of the transistor 33, a back gate of the transistor 31, and a back gate of the transistor 32. The other of the source and the drain of the transistor 33 is electrically connected to one of a source and a drain of the transistor 34 and a back gate of the transistor 33. A gate of the transistor 33 is electrically connected to a wiring BIAS2.

A gate of the transistor 34 is electrically connected to a wiring BIAS1, a gate of the transistor 37, and a gate of the transistor 38. The other of the source and the drain of the transistor 35 is electrically connected to a back gate of the transistor 35, one of a source and a drain of the transistor 37, and the terminal 11a1. The other of the source and the drain of the transistor 36 is electrically connected to a back gate of the transistor 36, one of a source and a drain of the transistor 38, and the terminal 11b1.

The wiring VSS is electrically connected to the other of the source and the drain of the transistor 34, a back gate of the transistor 34, the other of the source and the drain of the transistor 37, a back gate of the transistor 37, the other of the source and the drain of the transistor 38, and a back gate of the transistor 38.

Note that although FIG. 4 illustrates an example in which the back gates of the transistor 31 to the transistor 38 are connected to the others of the sources and the drains of the corresponding transistors, the back gates of the transistors may be connected to the gates of the corresponding transistors, for example. Alternatively, the back gates of the transistors are not necessarily provided.

Furthermore, it is preferable that a secondary battery or the like be connected to the terminal INP and the memory circuit 20 be electrically connected to the terminal INM.

Figure 5A:
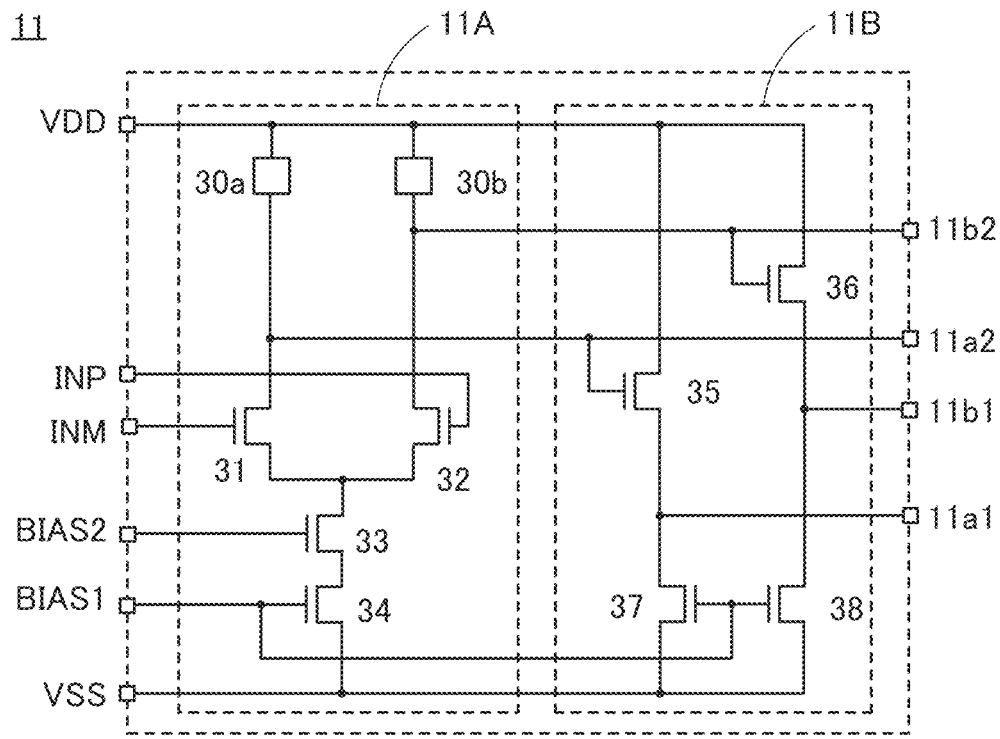
FIG. 5A to FIG. 5D are circuit diagrams illustrating a sensing device.

FIG. 5A illustrates an example in which the transistor 31 to the transistor 38 used in the comparison circuit 11 illustrated in FIG. 4 do not include back gates. In the following description, even in the case where the transistors are not provided with back gates in the drawing, the transistors may be provided with back gates, and the back gates of the transistors may be connected to the ones of the sources and the drains of the corresponding transistors or the gates of the corresponding transistors. Alternatively, a different wiring may be electrically connected to the back gate of the transistor, and a potential may be supplied to the back gate of the transistor through the wiring.

Figure 5B:
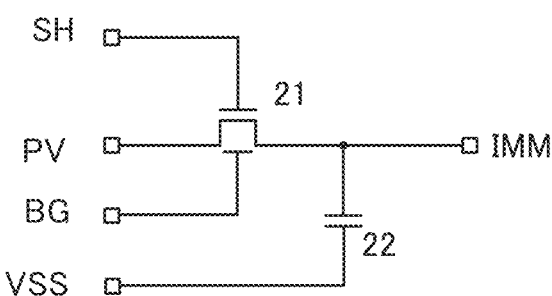

FIG. 5B illustrates a circuit diagram of the memory circuit 20, for example. The memory circuit 20 includes a transistor 21 and a capacitor 22. The first input signal supplied to the wiring PV is supplied to the capacitor 22 through the transistor 21 as a comparison potential. In the memory circuit 20, the on state or the off state of the transistor 21 is controlled by a signal supplied to a wiring SH, and in the case where the transistor 21 is an on state, a comparison potential supplied to the capacitor 22 is updated.

Note that the transistor 21 used in the memory circuit 20 preferably includes a metal oxide in a semiconductor layer. The off-state current of the transistor including a metal oxide in a semiconductor layer is small when the transistor is in an off state, and the transistor is suitably used as a memory. Furthermore, when the transistor 21 includes a back gate, the threshold voltage of the transistor 21 can be controlled. Thus, the back gate of the transistor 21 is preferably supplied with a potential for controlling the threshold voltage of the transistor 21 through the wiring BG.

Figure 5C:
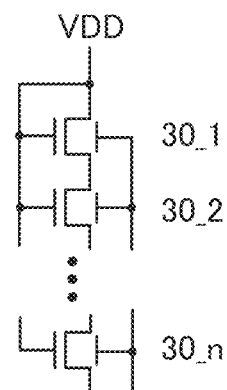

FIG. 5C illustrates an example of a circuit diagram of the circuit 30a. Note that the description of the circuit 30b is omitted because the circuit 30b preferably has the same structure as the circuit 30a. In the circuit 30a, a plurality of transistors are diode-connected. The description is made focusing on a transistor 30_1 as an example. The wiring VDD is electrically connected to a gate of the transistor 30_1 and one of a source and a drain of the transistor 30_1. The gate of the transistor 30_1 is electrically connected to the one of the source and the drain of the transistor 30_1, whereby the same function as the diode is obtained. The other of the source and the drain of the transistor 30_1 is preferably electrically connected to the terminal 11a2.

Note that the circuit 30a preferably includes the plurality of transistors 30_1 to 30_n. The wiring VDD is electrically connected to the gates of the transistors 30_1 to 30_n and the one of the source and the drain of the transistor 30_1. The other of the source and the drain of the transistor 30_1 is electrically connected to one of a source and a drain of the transistor 30_2 corresponding to a next stage. Thus, the transistors 30_1 to 30_n are sequentially connected as described above. That is, when the transistors 30_1 to 30_n are connected, the plurality of transistors can be regarded as one transistor with a large channel length. This is effective in improving the withstand voltage with respect to a potential supplied to the wiring VDD. In other words, the withstand voltage of the amplifier circuit 11A is improved.

Furthermore, the transistors 30_1 to 30_n included in the circuit 30a and the transistor 31 can be stably operated in a saturation region. In addition, in order to stably operate the amplifier circuit 11A in a saturation region, it is preferable to adjust the channel length by the number of stages of the transistors 30_1 to 30_n. The back gates of the transistors 30_1 to 30_n are preferably connected to the terminal 11a2. Note that the back gates of the transistors 30_1 to 30_n may be connected to their gates. Alternatively, the transistors 30_1 to 30_n do not necessarily include back gates.

In a different structure of the circuit 30a, a diode formed using single crystal silicon may be used, and a transistor formed using single crystal silicon may be used.

Figure 5D:
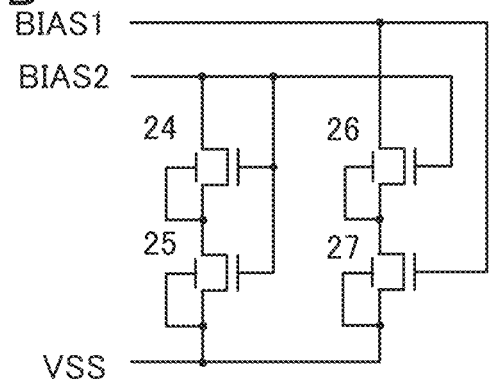

FIG. 5D illustrates an example of a control circuit that controls bias current of the amplifier circuit 11A. In the comparison circuit 11, the wiring BIAS1 is connected to the gate of the transistor 34, and the wiring BIAS2 is connected to the gate of the transistor 33. The transistor 33 and the transistor 34 are connected in series, and thus current flowing in the amplifier circuit 11A is controlled by the potential of the wiring BIAS1 or the wiring BIAS2.

The above control circuit includes a transistor 24 to a transistor 27. The wiring BIAS2 is electrically connected to one of a source and a drain of the transistor 24, a gate of the transistor 24, a gate of the transistor 25, and a gate of the transistor 26. The other of the source and the drain of the transistor 24 is electrically connected to a back gate of the transistor 24 and one of a source and a drain of the transistor 25.

The wiring BIAS1 is electrically connected to one of a source and a drain of the transistor 26 and a gate of the transistor 27. The other of the source and the drain of the transistor 26 is electrically connected to a back gate of the transistor 26 and one of a source and a drain of the transistor 27. The wiring VSS is electrically connected to the other of the source and the drain of the transistor 25, a back gate of the transistor 25, the other of the source and the drain of the transistor 27, and a back gate of the transistor 27.

The transistor 24 and the transistor 25 form a diode connection, and the first potential corresponding to the threshold voltage of the transistor is supplied to the wiring BIAS2. The first potential supplied to the wiring BIAS2 is also supplied to a gate of the transistor 26 to be described later.

Figure 2C:
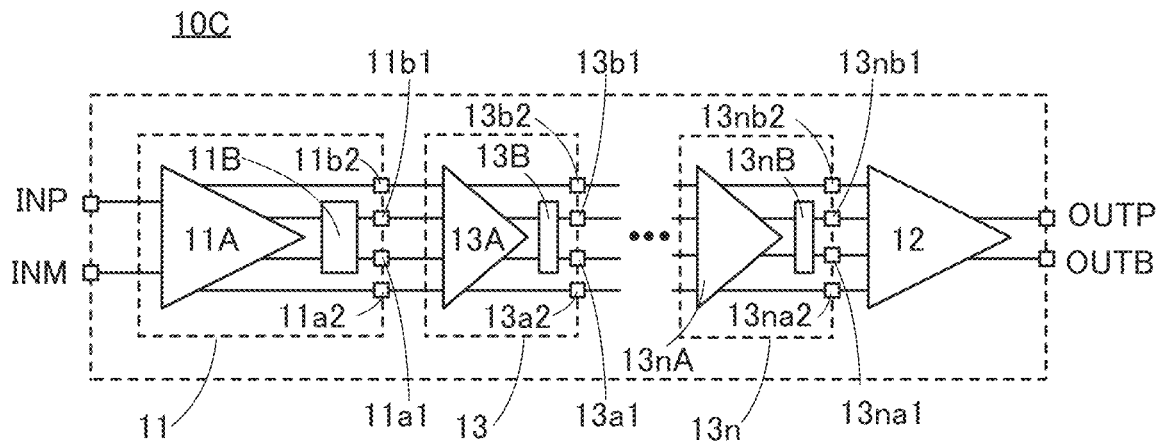

The transistor 26 and the transistor 27 have a structure of a cascode connection circuit. The transistor 27 functions as a source-grounded amplifier, and the transistor 26 functions as a gate-grounded amplifier. Accordingly, even when a potential supplied to the wiring BIAS1 is changed, bias current flowing in the amplifier circuit 11A can be stabilized. In the case where bias current in the plurality of comparison circuits illustrated in FIG. 2C are collectively controlled, the output impedance of the wiring BIAS1 is preferably made high. When the cascode connection circuit includes the transistor 26 functioning as a gate-grounded amplifier, the influence of the bias current flowing in the plurality of amplifier circuits can be reduced.

The comparison circuit in FIG. 5A, the memory circuit in FIG. 5B, the circuit 30a in FIG. 5C, and the bias current control circuit in FIG. 5D may be formed over the same substrate using transistors each including a metal oxide in a semiconductor layer.

Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. Examples of the glass substrate include barium borosilicate glass, aluminoborosilicate glass, and soda lime glass. Examples of the flexible substrate, the attachment film, the base material film, and the like are as follows: for example, plastic typified by polyethylene terephthalate (PET), polyethylene naphthalate (PEN), and polyether sulfone (PES). Another example is a synthetic resin such as acrylic. Other examples are polyester, polypropylene, polyvinyl fluoride, and polyvinyl chloride. Other examples are polyamide, polyimide, aramid, epoxy, an inorganic vapor deposition film, and paper. In particular, the use of a semiconductor substrate, a single crystal substrate, an SOI substrate, or the like enables the manufacture of small-sized transistors and capacitors with a small variation in characteristics, size, shape, or the like and with high current capability.

For example, formation using transistors each including a metal oxide in a semiconductor layer over the same substrate enables a lower process temperature than in the case of using a single crystal substrate or a silicon substrate. When all transistors in circuits used in the sensing device are n-type transistors or p-type transistors, the manufacturing cost can be reduced.

Figure 6:
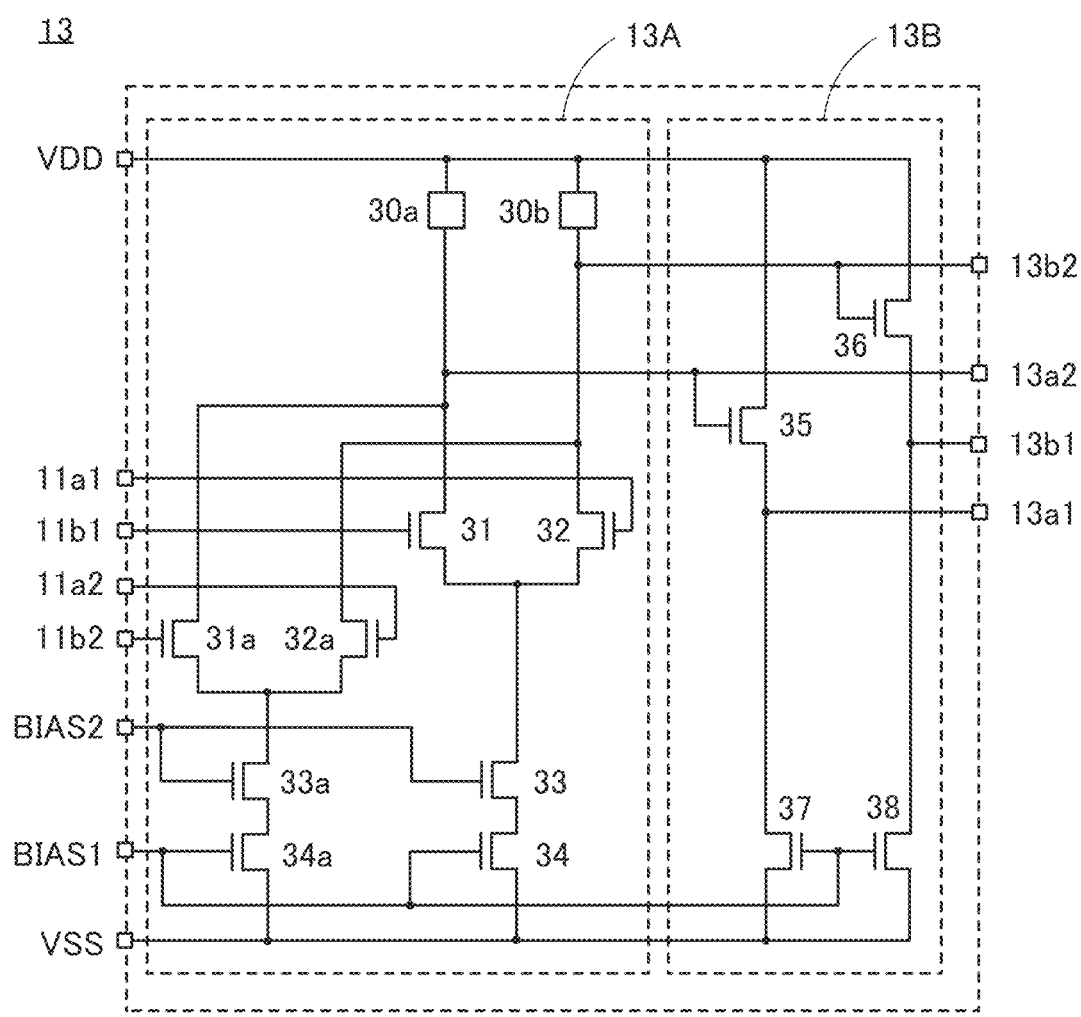
FIG. 6 is a circuit diagram illustrating a sensing device.

FIG. 6 is a circuit diagram of the comparison circuit 13. As described with reference to FIG. 2A or FIG. 2B, the comparison circuit 13 is a comparison circuit including four terminals supplied with an input signal. The comparison circuit 13 illustrated in FIG. 6 includes the amplifier circuit 13A and the source follower circuit 13B. The amplifier circuit 13A differs from the amplifier circuit 11A in including a transistor 31a, a transistor 32a, a transistor 33a, and a transistor 34a. In other words, the amplifier circuit 13A includes a first differential circuit and a second differential circuit.

For example, the first differential circuit operates with a signal supplied to the terminal 11a1 or the terminal 11b1 through the source follower circuit 119 in the comparison circuit 11. The second differential circuit operates with a signal supplied to the terminal 11a2 or the terminal 11b2 without through the source follower circuit 11B of the comparison circuit 11.

Note that the circuit 30a is electrically connected to the transistor 31 and the transistor 31a. The circuit 30b is electrically connected to the transistor 32 and the transistor 32a. That is, the transistor 31 and the transistor 31a connected to the circuit 30a compensate for each other. Similarly, the transistor 32 and the transistor 32a connected to the circuit 30b compensate for each other.

For example, in accordance with the threshold voltage of the transistor, the first output signal output to the terminal 11a1 through the source follower circuit becomes lower than the second output voltage output without through the source follower circuit. The first output signal is output to the terminal 11a1 through the source follower circuit, and thus the impedance component of the output signal is made small, so that the driving current capability can be made high. This is suitable for improvement in operation frequency of the comparison circuit. The second output signal output to the terminal 11a2 can be a higher voltage than the first output signal. This is suitable for operation of the comparison circuit with a low-voltage power. In the case where the power supply voltage supplied to the comparison circuit becomes small, a reduction in output potential due to the source follower circuit included in the comparison circuit can be compensated for. In the case where the power supply voltage supplied to the comparison circuit becomes high, a reduction in the driving current capability of the output signal of the comparison circuit can be reduced. That is, the comparison circuit can operate stably regardless of the power supply voltage supplied to the comparison circuit. Therefore, the sensing device 10 including the comparison circuit can sense the battery remaining amount of a battery connected to the sensing device 10. Note that in this specification and the like, the above comparison circuit or the above sensing device is referred to as BTOS (Battery operating system or Battery oxide semiconductor) in some cases.

Figure 7:
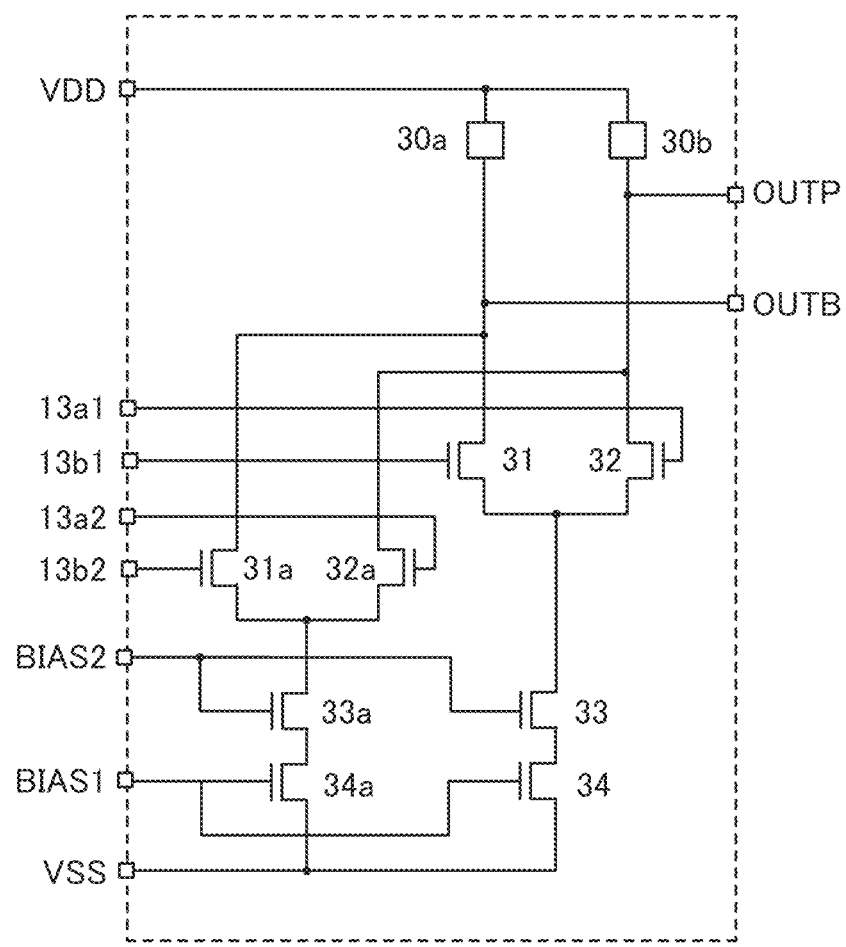
FIG. 7 is a circuit diagram illustrating a sensing device.

FIG. 7 is a circuit diagram of the comparison circuit 12. As described with reference to FIG. 1B, the comparison circuit 12 is an amplifier circuit including four terminals supplied with an input signal and two terminals from which an output signal is output. Note that the comparison circuit 12 illustrated in FIG. 7 differs from the comparison circuit 13 in that an output signal is output to the terminal OUTP or the terminal OUTB without through the source follower circuit. Note that although not illustrated in FIG. 7, an output signal of the comparison circuit 12 may be output through the source follower circuit.

The sensing device 10 described in this embodiment can detect a change in potential. Furthermore, the potential of the power supply voltage supplied to the sensing device 10 can be inhibited from affecting the sensing range of the sensing device 10. When the amplifier circuit, the memory circuit, the circuit 30a (the circuit 30b), and the bias current control circuit included in the sensing device 10 are formed over the same substrate using transistors each including a metal oxide in a semiconductor layer, the manufacturing cost can be reduced.

Figure 8A:
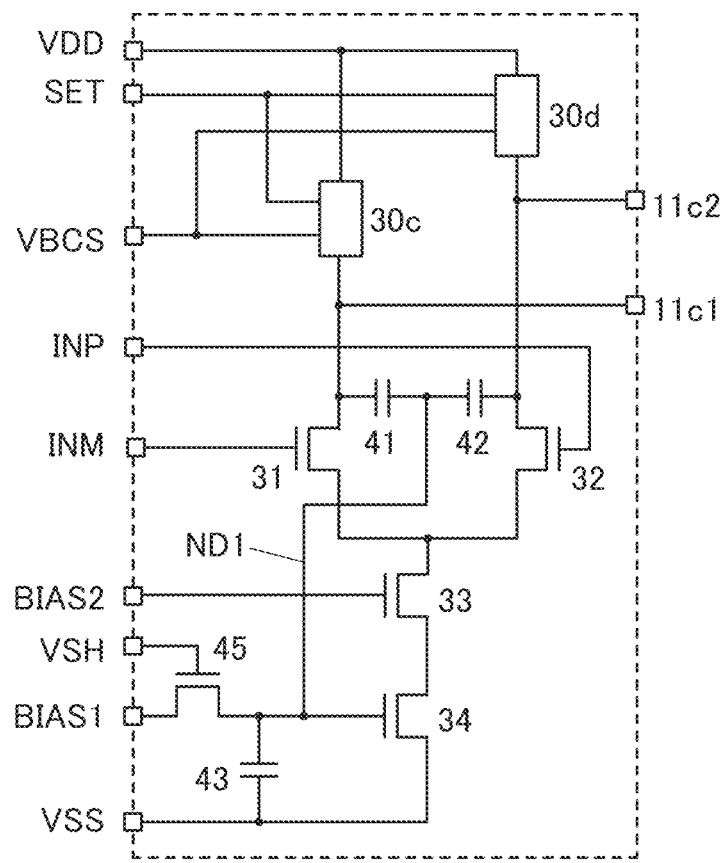
FIG. 8A and FIG. 8B are circuit diagrams illustrating a sensing device.

FIG. 8A illustrates an amplifier circuit 11C different from the amplifier circuit 11A illustrated in FIG. 4. The amplifier circuit 11C functions as a comparison circuit included in the sensing device 10. The amplifier circuit 11C can be used as the amplifier circuit 11A, 12, or 13A included in the comparison circuit. The amplifier circuit 11C includes the first input signal, the second input signal, the first output signal, and the second output signal. Note that the example of the amplifier circuit 11C, the transistors included in the amplifier circuit 11C do not have back gates as in FIG. 5A. Note that the transistors used in the amplifier circuit 11C may have or are not necessarily provided with back gates.

The amplifier circuit 11C in FIG. 8A differs from the amplifier circuit 11A. Note that in the case where the same references are used in the amplifier circuit 11C and the amplifier circuit 11A, the description of the amplifier circuit 11A is referred to for the amplifier circuit 11C and the description is omitted.

The amplifier circuit 11C differs from FIG. 4 in including a circuit 30c, a circuit 30d, a capacitor 41 to a capacitor 43, a transistor 45, a terminal 11c1, and a terminal 11c2. A wiring VSH, a wiring SET, a wiring VBCS are electrically connected to the amplifier circuit 11C. Note that the circuit 30c and the circuit 60d have a function of a current source.

An output terminal of the circuit 30c is electrically connected to one of a source and a drain of the transistor 31, one electrode of the capacitor 41, and the terminal 11c1. An output terminal of the circuit 30d is electrically connected to one of a source and a drain of the transistor 32, one electrode of the capacitor 42, and the terminal 11c2. The gate of the transistor 31 is electrically connected to the terminal INM. The gate of the transistor 32 is electrically connected to the terminal INP. The one of the source and the drain of the transistor 33 is electrically connected to the other of the source and the drain of the transistor 31 and the other of the source and the drain of the transistor 32. The other of the source and the drain of the transistor 33 is electrically connected to the one of the source and the drain of transistor 34. The gate of the transistor 33 is electrically connected to the wiring BIAS2. The gate of the transistor 34 is electrically connected to one of a source and a drain of the transistor 45, the other electrode of the capacitor 41, the other electrode of the capacitor 42, and one electrode of the capacitor 43. The other of the source and the drain of the transistor 34 is electrically connected to the other electrode of the capacitor 43 and the wiring VSS. The other of the source and the drain of the transistor 45 is electrically connected to the wiring BIAS1. A gate of the transistor 45 is electrically connected to the wiring VSH. The wiring SET is electrically connected to the circuit 30c and the circuit 30d. The wiring VBCS is electrically connected to the circuit 30c and the circuit 30d.

The terminal INM is supplied with the first input signal, and the terminal INP is supplied with the second input signal. The wiring BIAS1 can supply a program potential to the other electrode of the capacitor 41 or the other electrode of the capacitor 42 through the transistor 46. In the case where a signal having the same potential as the first input signal is supplied as the second input signal, the first output signal supplied to the terminal 11c1 has substantially the same potential as a potential of the second output signal supplied to the terminal 11c2. Note that substantially the same potential preferably means a potential difference within 20 mV. The potential difference is further preferably within 10 mV. The potential difference is still further preferably within 5 mV.

At an operating point of the amplifier circuit 11C, in the case where the potential of the first input signal is equal to the potential of the second input signal, the potential of the first output signal output to the terminal 11c1 becomes substantially the same potential as the potential of the second output signal output to the terminal 11c2. Note that the operation point preferably corresponds to an intermediate potential of potentials supplied to the wiring VDD and the wiring VSS is preferable. When the operation point corresponds to the intermediate potential, the magnitude of the amplitude of the first input signal and the second input signal can be maximized.

The program potential is supplied to the other electrode of the capacitor 41, the other electrode of the capacitor 42, and the one electrode of the capacitor 43 through the transistor 45. The program potential supplied to the gate of the transistor 34 is preferably a potential that controls the amount of current that can flow in the amplifier circuit 11C. The combined capacitance of the capacitor 41 to the capacitor 43 can hold the program potential. Note that a higher current preferably flows in the transistor 33 than in the transistor 34.

In the case where the transistor 45 is off, a node ND1 to which the capacitor 41 to the capacitor 43 are connected is brought into a floating state. Therefore, each of the capacitor 41 to the capacitor 43 has an effect of absorbing variations in characteristics of the transistor 31 and the transistor 32 so that the operating point of the amplifier circuit 11C becomes stable. Note that the capacitance of the capacitor 43 is preferably smaller than or equal to half of the combined capacitance of the capacitor 41 and the capacitor 42. The capacitor 43 is not necessarily provided. A period during which the program potential is supplied to the node ND1 can be an initialization period of the amplifier circuit 11C.

Figure 8B:
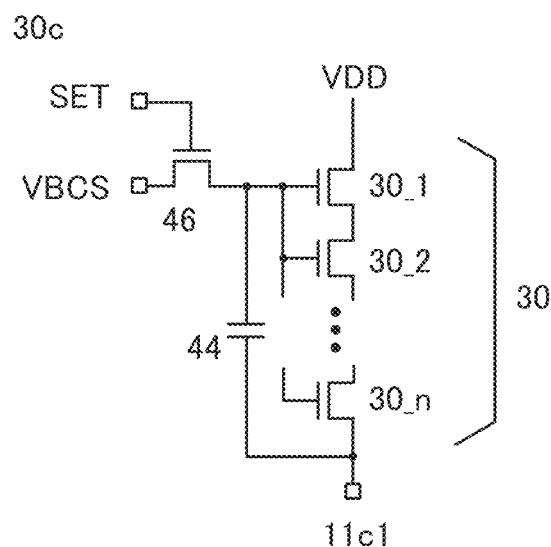

Next, the circuit 30c in FIG. 8B will be described in detail with reference to the circuit diagram. Note that the description of the circuit 30d is omitted because the circuit 30d has the same structure as the circuit 30c. The circuit 30c includes a capacitor 44, the transistor 46, and the plurality of transistors 30_1 to 30_n. Note that the transistors 30_1 to 30_n are represented as the transistor 30 in order to simplify the description of the circuit 30c.

One of a source and a drain of the transistor 30 is electrically connected to one electrode of the capacitor 44 and the one of the source and the drain of the transistor 31, a gate of the transistor 30 is electrically connected to one of a source and a drain of the transistor 46 and the other electrode of the capacitor 44, and the other of the source and the drain of the transistor 46 is electrically connected to the wiring VBCS. A gate of the transistor 46 is electrically connected to the wiring SET.

The transistor 30 will be described in more detail. The one of the source and the drain of the transistor 46 is electrically connected to gates of the transistors 30_1 to 30_n. The other of the source and the drain of the transistor 30_1 is electrically connected to the one of the source and the drain of the transistor 30_2 corresponding to a next stage. Thus, the transistors 30_1 to 30_n are sequentially connected to each other as described above. That is, when the transistors 30_1 to 30_n are connected, the plurality of transistors can be regarded as one transistor with a large channel length. This is effective in improving the withstand voltage with respect to a potential supplied to the wiring VDD. In other words, the withstand voltage of the amplifier circuit 11C is improved.

A data potential supplied to the wiring VBCS is supplied to the circuit 30c through the transistor 46. The data potential is held in the capacitor 44 and supplied to the gates of the transistor 30_1 to the transistor 30_n. Thus, the data potential can control the amount of current supplied to the terminal 11c1 and controls the rise time of the first output signal supplied to the terminal 11c1. Note that the circuit 30d is preferably supplied with the same data potential as that of the circuit 30c. Note that different data potentials may be supplied to individually set the amount of current supplied by the circuit 30c and the circuit 30d. Note that the circuit 30d has the same structure as that of the circuit 30c; thus, description thereof is omitted.

Thus, the circuit 30c can supply current to the terminal 11c1 without being affected by the amount of current flowing in the transistor 31 with the first input signal. Similarly, the circuit 30d can supply a current to the terminal 11c2 without being affected by the amount of current flowing in the transistor 32 with the second input signal.

For example, the case where the potential of the first input signal supplied to the terminal INM is at "H" and the case where the potential of the second input signal supplied to the terminal INP is at "L" will be described. When "H" is supplied as the potential of the first input signal, the transistor 31 is turned on. Accordingly, a current supplied from the circuit 30c flows through the transistor 31, the transistor 33, and the transistor 34 to the wiring VSS.

Therefore, the potential of the first output signal supplied to the terminal 11c1 is changed to "L". When "L" is supplied as the potential of the second input signal, the transistor 32 is turned off. Accordingly, a current supplied from the circuit 30d is supplied to the terminal 11c2, and the potential of the second output signal supplied to the terminal 11c2 is changed to "H". Note that as for the potential "L" or "H", the potential lower than the potential of the amplifier circuit 11C at the operating point is "L", and the potential higher than the potential of the amplifier circuit 11C at the operating point is "H".

Next, the case where the potential of the first input signal is changed from "H" to "L" and the potential of the second input signal is changed from "L" to "H" will be described. In the case where the potential of the first input signal is changed from "H" to "L", the potential of the first output signal is changed from "L" to "H". In other words, when the potential of the first output signal is changed from "L" to "H", the potential of the ND1 is increased by capacitive coupling because the potential of the first output signal is transmitted through the capacitor 41.

In the case where the potential of the second input signal is changed from "L" to "H", the potential of the terminal 11c2 changes from "H" to "L". In other words, when the potential of the second output signal is changed from "H" to "L", the potential of the ND1 is reduced by capacitive coupling because the potential of the second output signal is transmitted through the capacitor 42.

In the case where the first input signal and the second input signal are changed complementarily, for example, the capacitor 41 or the capacitor 42 is not affected by a change in potential of the first output signal or the second output signal, and thus a change in operating point of the amplifier circuit 11C can be inhibited.

As a different example, in the case where the first input signal is changed later than the second input signal, the potential of the ND1 becomes lower by capacitive coupling through the capacitor 41. Accordingly, the potential of the gate of the transistor 34 becomes lower, and the amount of current supplied to the terminal 11c1 becomes small. Thus, a large amount of current is supplied from the circuit 30c as the first output signal, and the potential of the first output signal is likely to be "H". In other words, the capacitor 41 to the capacitor 43 can inhibit a change in operating point of the amplifier circuit 11C.

Note that the potential of the node ND1 is not affected by the potential of the first output signal or the second output signal. In order to achieve this, the capacitance of the capacitor 43 is preferably smaller than or equal to half of the combined capacitance of the capacitor 41 and the capacitor 42. That is, when the combined capacitance is made large, the potential of the node ND1 is changed according to the first input signal or the second input signal. That is, by changing the potential of the node ND1, a change in operating point of the amplifier circuit 11C can be inhibited.

Thus, the program potential supplied to the gate of the transistor 34 can stabilize the operating point of the amplifier circuit 11C, and in addition, the potential supplied to the gate of the transistor 34 changes the operating point of the amplifier circuit 11C according to the first input signal or the second input signal, whereby the potential of the first output signal or the second output signal is corrected.

Note that each of the transistor 45 and the transistor 46 preferably includes a metal oxide in a semiconductor layer. A transistor including a metal oxide in a semiconductor layer is suitably used for a memory because the off-state current in the case where the transistor is off is low. Moreover, when the transistor 45 and the transistor 46 include back gates, the threshold voltages of the transistor 45 and the transistor 46 can be controlled. Thus, a potential for controlling the threshold voltages of the transistor 45 and the transistor 46 is preferably supplied to the back gates of the transistor 45 and the transistor 46 through the wiring BG (not illustrated in the drawing).

The structure and method described in this embodiment can be used by being combined as appropriate with the structures and methods described in the other embodiments and the examples.

Embodiment 2

In this embodiment, description will be made using an example in which a comparison circuit is applied to a battery protection IC. The battery protection IC has a function of detecting a failure mode of a battery in addition to management of the power supply voltage. For example, a failure called micro short-circuit (also referred to as internal short-circuit or soft short-circuit) is generated in a lithium ion battery. The micro short-circuit is a failure mode where lithium metal that precipitates on a negative electrode reaches a positive electrode; eventually short-circuit occurs between the negative electrode and positive electrode and battery voltage slightly decreases.

In this embodiment, a comparison circuit different from that in Embodiment 1 will be described with reference to FIG. 18 to FIG. 22. A micro-short detection circuit (Micro-short detector) included in the battery protection IC is formed using an N-type transistor. Note that in the micro-short detection circuit, a transistor including a metal oxide in a semiconductor layer can be used.

Figure 18A:
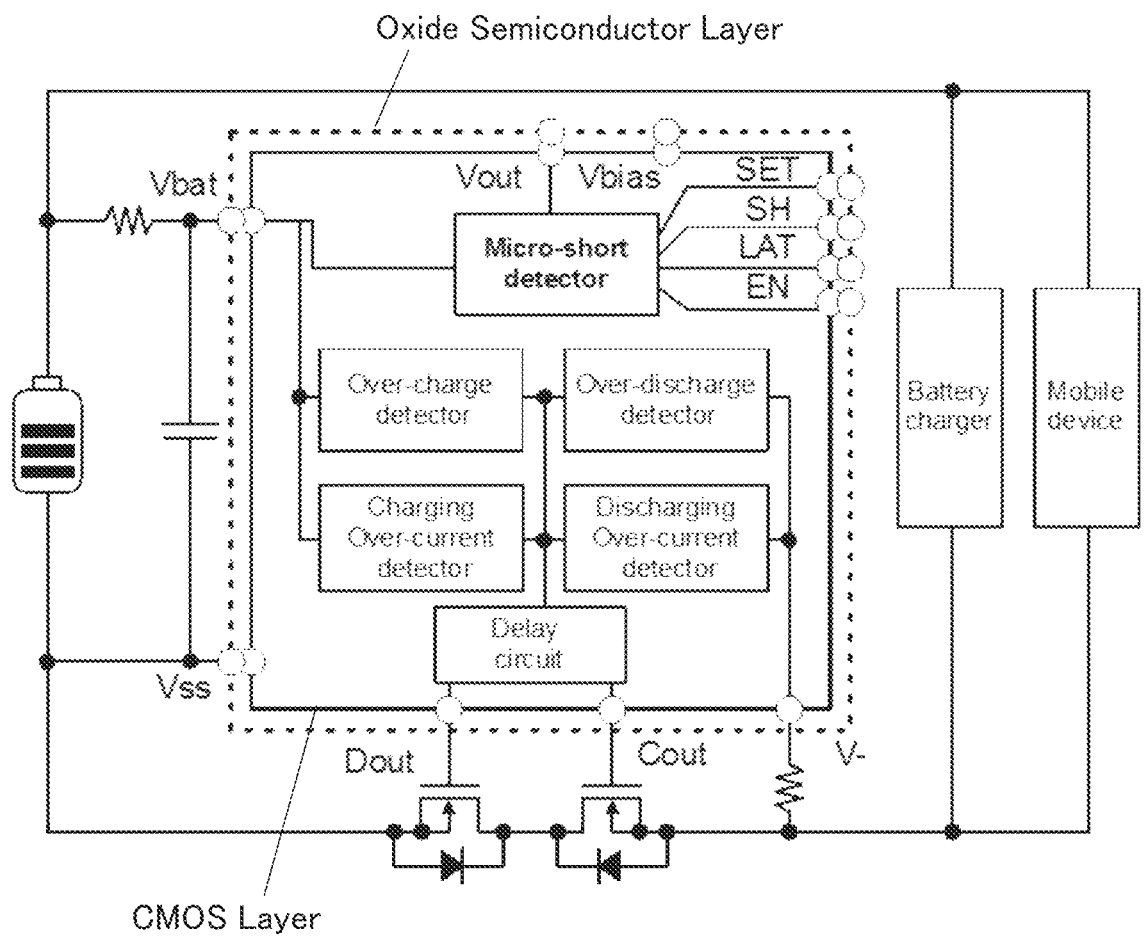
FIG. 18A is a block diagram of a battery protection IC.

FIG. 18A is a block diagram illustrating a battery protection IC, a charger (Battery charger), and a control portion (Mobile device). The battery protection IC is composed of a circuit formed using a CMOS process (CMOS Layer) and a circuit that detects micro short-circuit and is formed using a transistor including a metal oxide (Oxide Semiconductor Layer) in a semiconductor layer. The battery protection IC includes the micro-short detection circuit (Micro-short detectot), an overcharge prevention detection circuit for managing the power supply voltage (Over-charge detector), an overdischarge prevention detection circuit (Over-discharge detector), an overcurrent detection circuit (Charging Over-current detector, disCharging Over-current detector), a delay circuit, and the like.

Figure 18B:
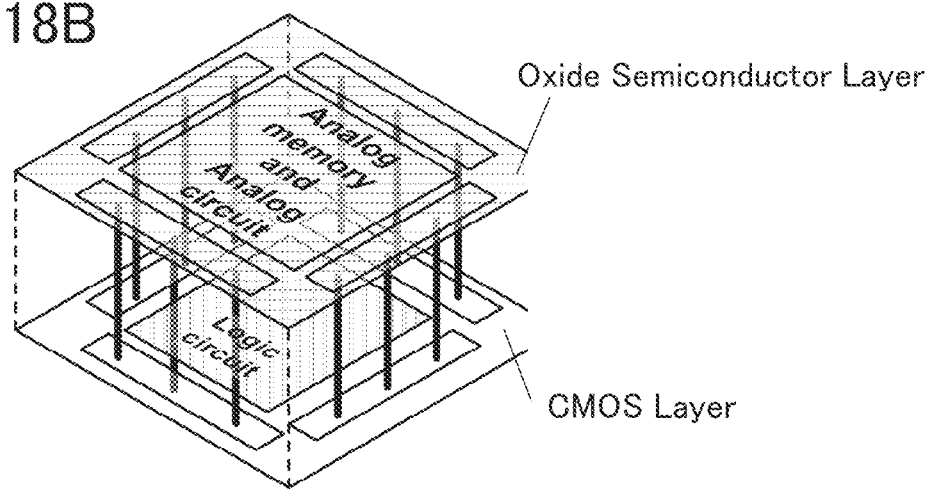
FIG. 18B is a perspective view of a battery protection IC.

FIG. 18B is a perspective view in which a circuit formed using a CMOS process (Logic circuit) and the circuit that detects micro short-circuit and is formed using a transistor including a metal oxide in a semiconductor layer (Analog memory and Analog circuit) are stacked. An example in which the overcharge prevention detection circuit, the overdischarge prevention detection circuit, the overcurrent detection circuit, the delay circuit, and the like for managing the power supply voltage are formed using a CMOS process is illustrated. The micro-short detection circuit can be provided to be stacked over the circuit that is formed using a CMOS process and manages the power supply voltage. The micro-short detection circuit can be formed using only an N-type transistor, so that the layout area can be reduced. When the micro-short detection circuit and the other circuit are stacked, a wiring can be made short. Note that in a CMOS process, single crystal silicon, polycrystalline silicon, microcrystalline silicon, or the like is preferably used. In particular, polycrystalline silicon can be formed at a lower temperature than single crystal silicon and has higher field-effect mobility and higher reliability than amorphous silicon.

Figure 19A:
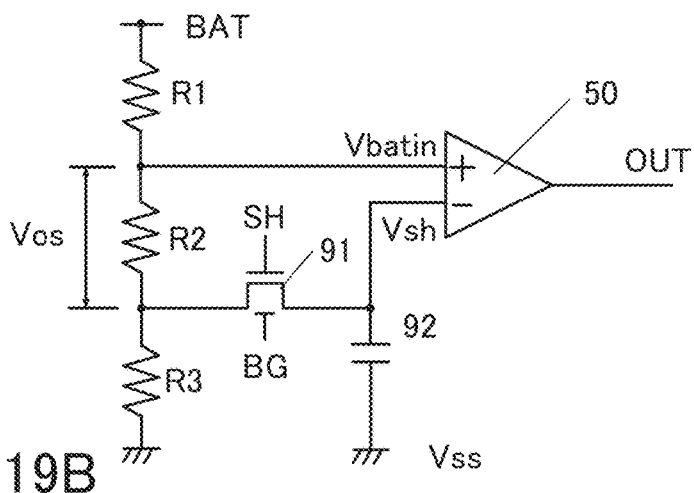
FIG. 19A is a circuit diagram illustrating a micro-short detection circuit.

FIG. 19A illustrates an example of the micro-short detection circuit. The micro-short detection circuit includes a sensing device 50, a transistor 91, a capacitor 92, and a plurality of resistors (e.g., resistors R1 to R3). The sensing device 10 described in Embodiment 1 can be used as the sensing device 50.

The plurality of resistors are connected in series between a wiring BAT and the wiring VSS. For example, in FIG. 19A, a potential Vos at both ends of the resistor R2 is an offset potential. The offset potential is preferably set as appropriate in accordance with desired resolution. In the case where the detection accuracy is desired to be increased, for example, the resistance can be set to be 5 mV. In the case of not being likely to be affected by noise, the resistance can be set to be 20 mV. Note that a potential Vbat is supplied to the wiring BAT as an output potential of the battery.

One electrode of the resistor R2 is electrically connected to a first input terminal of the sensing device 50. One of a source and a drain of the transistor 91 and one electrode of the capacitor 92 are electrically connected to a second input terminal of the sensing device 50. The other of the source and the drain of the transistor 91 is electrically connected to the other electrode of the resistor R2. A gate of the transistor 91 is electrically connected to the wiring SH. The back gate of the transistor 91 is electrically connected to the wiring BG. The other electrode of the capacitor 92 is electrically connected to the wiring VSS. Note that in the following description, a ground symbol means being electrically connected to the wiring VSS.

A signal Vbatin is supplied to the first input terminal of the sensing device 50. The signal Vbatin is a signal that changes in accordance with a potential of the signal Vbat. The transistor 91 and the capacitor 92 form a sample-and-hold circuit. A potential lower than the signal Vbatin by 10 mV is supplied to the memory circuit. A signal Vsh is supplied to the second input terminal of the sensing device 50 as a potential stored in the sample-and-hold circuit. In other words, the signal Vbatin and the signal Vsh are generated by resistor division from the signal Vbat that is an output potential of the battery.

Note that in the case where the transistor 91 is off, the sensing device 50 is not affected by the potential of the signal Vbatin. That is, the potential of the signal Vsh can be a comparison potential of the sensing device 50. The comparison potential stored in the sample-and-hold circuit is suitable for detection of a change in potential of the signal Vbatin. The sensing device 50 easily detects a change in the signal Vbatin by comparing the above comparison potential with a comparison potential just before the above comparison potential is stored in the sample-and-hold circuit. In a period during which the signal Vsh is held in the sample-and-hold circuit, the comparison circuit compares a change in the signal Vbatin in a continuous manner. Note that it is preferable that monitoring whether a failure is generated in the battery or not by comparing a change in the signal Vbatin for a long period can be performed. In the period, it is preferable that monitoring can be performed in a continuous manner for one second or more. It is farther preferable that monitoring can be performed in a continuous manner for five seconds or more. Accordingly, the sample-and-hold circuit functions as a memory circuit.

The detection accuracy of the sensing device 50 can be changed by the offset potential. The offset potential is preferably set such that the selection range can be changed by the number of resistors or the size of the resistor. For example, it is preferable that the number of selected resistors can be changed by a switch. The potential Vos that is the offset potential is obtained by the following formula (1).

$$Vos = Vbatin - Vsh \qquad \text{formula (1)}$$

Figure 19B:
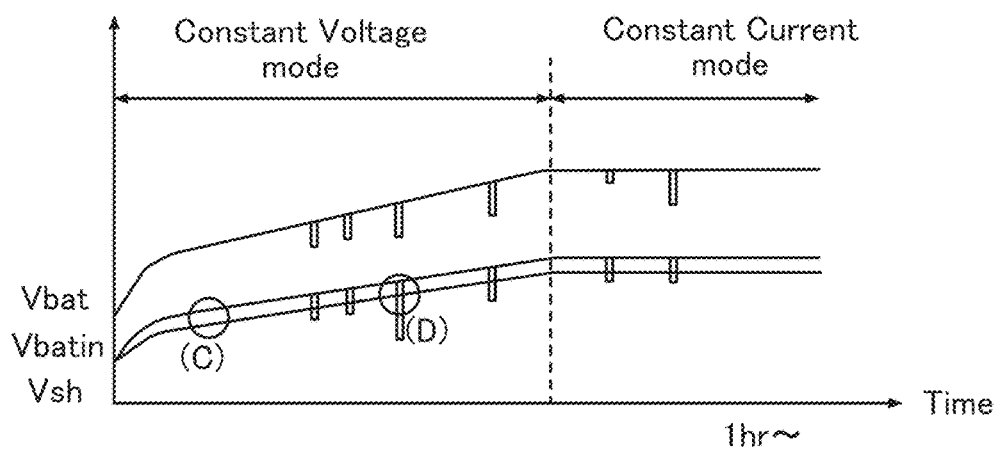
FIG. 19B is a diagram showing a state of a battery at the time of charging.

FIG. 19B shows Constant Voltage Mode and Constant Current Mode in charging the battery (Battery charge). In either mode, the signal Vbatin and the signal Vsh are potentials lower than the signal Vbat that is an output potential of the battery. The potential of the signal Vsh is lower than the potential of the signal Vbatin.

Figure 19C:
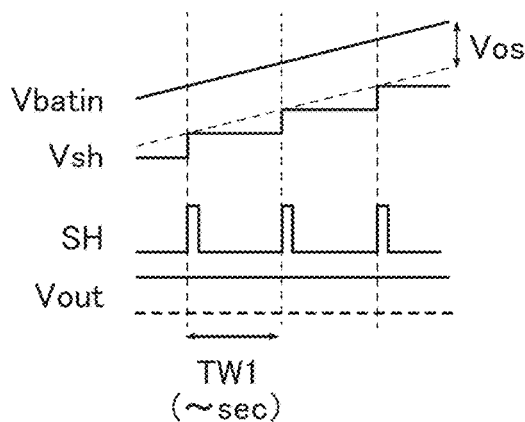
FIG. 19C is a diagram showing a state of a battery at the time of charging.
Figure 19D:
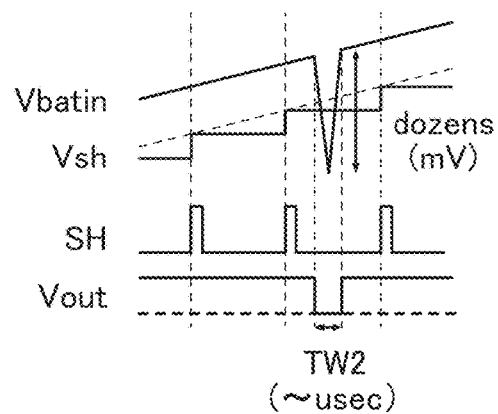
FIG. 19D is a diagram showing a state of a battery at the time of charging.

FIG. 19C is an enlarged view of (C) in FIG. 19B, and FIG. 19D is an enlarged view of (D) in FIG. 19B. In the case where a failure mode such as micro short-circuit is generated in the battery (Abnormal operation: Micro-short), the failure can be detected as shown in FIG. 19D. In the case where a failure mode such as micro short-circuit is generated, the signal Vout output to the terminal OUT is changed in the sensing device 50. Note that in the case where a failure is not generated in the battery, the signal Vout output to the terminal OUT is not changed as in FIG. 19C (Normal operation).

Figure 20A:
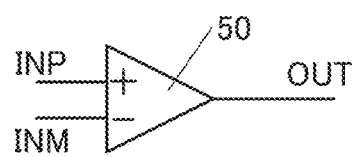
FIG. 20A and FIG. 20B are circuit diagrams illustrating a comparison circuit.

FIG. 20A is a block diagram illustrating the sensing device 50. The sensing device 50 includes the terminal INP, the terminal INM, and the terminal OUT.

Figure 20B:
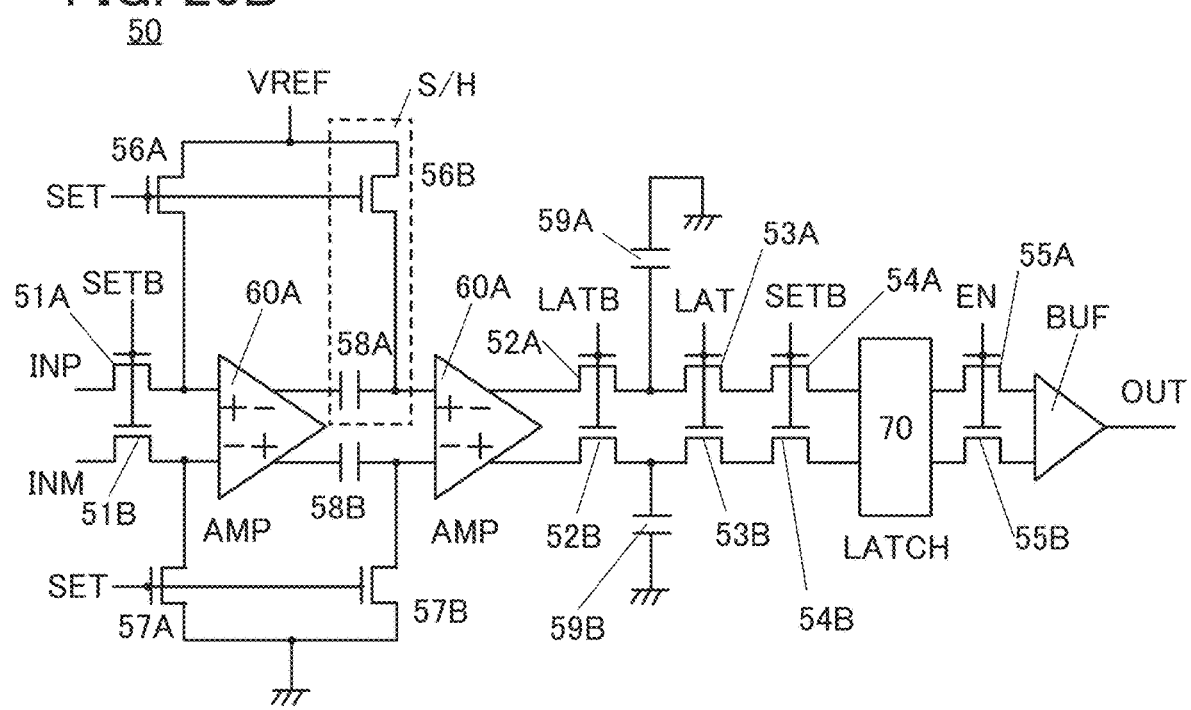

FIG. 20B is a circuit diagram of the sensing device 50. The sensing device 50 includes an amplifier circuit 60A, an amplifier circuit 60B, a latch circuit 70, a buffer circuit, transistors 51A to 55A, a transistor 51B to a transistor 55B, transistors 56A to 56D, a capacitor 58A, a capacitor 58B, a capacitor 59A, and a capacitor 59B.

One of a source and a drain of the transistor 51A is electrically connected to the terminal INP. The other of the source and the drain of the transistor 51A is electrically connected to a first input terminal of the amplifier circuit 60A and one of a source and a drain of the transistor 56A. A first output terminal of the amplifier circuit 60A is electrically connected to one electrode of the capacitor 58A. The other electrode of the capacitor 58A is electrically connected to a first input terminal of the amplifier circuit 60B and one of a source and a drain of the transistor 56B. The first output terminal of the amplifier circuit 60A is electrically connected to one of a source and a drain of the transistor 52A. The other of the source and the drain of the transistor 52A is electrically connected to one of a source and a drain of the transistor 53A and one electrode of the capacitor 59A. The other of the source and the drain of the transistor 53A is electrically connected to one of a source and a drain of the transistor 54A. The other of the source and the drain of the transistor 54A is electrically connected to a first input terminal of the latch circuit 70. A first output terminal of the latch circuit 70 is electrically connected to one of a source and a drain of the transistor 55A. The other of the source and the drain of the transistor 55A is electrically connected to a first input terminal of a buffer circuit BUF.

One of a source and a drain of the transistor 51B is electrically connected to the terminal INM. The other of the source and the drain of the transistor 51B is electrically connected to a second input terminal of the amplifier circuit 60A and one of a source and a drain of the transistor 57A. A second output terminal of the amplifier circuit 60A is electrically connected to one electrode of the capacitor 58B. The other electrode of the capacitor 58B is electrically connected to a second input terminal of the amplifier circuit 60B and one of a source and a drain of the transistor 57B. A second output terminal of the amplifier circuit 60A is electrically connected to one of a source and a drain of the transistor 52B. The other of the source and the drain of the transistor 52B is electrically connected to one of a source and a drain of the transistor 53B and one electrode of the capacitor 59B. The other of the source and the drain of the transistor 53B is electrically connected to one of a source and a drain of the transistor 54B. The other of the source and the drain of the transistor 54B is electrically connected to a second input terminal of the latch circuit 70. A second output terminal of the latch circuit 70 is electrically connected to one of a source and a drain of the transistor 55B. The other of the source and the drain of the transistor 55B is electrically connected to a second input terminal of the buffer circuit.

A wiring SETB is electrically connected to gates of the transistor 51A, the transistor 51B, the transistor 54A, and the transistor 54B. The wiring SET is electrically connected to gates of the transistors 56A, 56B, 57A, and 57B. A wiring LATB is electrically connected to gates of the transistor 52A and the transistor 52B. A wiring LAT is electrically connected to gates of the transistor 53A and the transistor 53B.

The other of the source and the drain of the transistor 56A is electrically connected to the other of the source and the drain of the transistor 56B and a wiring VREF. The other of the source and the drain of the transistor 57A is electrically connected to the other of the source and the drain of the transistor 57B and the wiring VSS. The other electrode of the capacitor 59A is electrically connected to the wiring VSS. The other electrode of the capacitor 59B is electrically connected to the wiring VSS.

The transistor 56B and the capacitor 58A form a sample-and-hold circuit. The transistor 57B and the capacitor 58B form a sample-and-hold circuit. The sample-and-hold circuit can hold an offset voltage. Thus, the sample-and-hold circuit can cancel an offset.

FIG. 21A1 is a block diagram illustrating the amplifier circuit 60. The amplifier circuit 60 includes a first input terminal AINP, a second input terminal AINM, a first output terminal AOUTM, and a second output terminal AOUTP.

FIG. 21A2 is a circuit diagram of the amplifier circuit 60. The amplifier circuit 60 includes a first circuit 80A, a second circuit 80B, a transistor 63, a transistor 66, a transistor 67, a transistor 68, and a capacitor 69C. The first circuit 80A includes a transistor 61, a transistor 62, and a capacitor 69A. The second circuit 80B includes a transistor 64, a transistor 65, and a capacitor 69B.

The wiring BAT is electrically connected to one of a source and a drain of the transistor 61, one of a source and a drain of the transistor 62, one of a source and a drain of the transistor 63, and one of a source and a drain of the transistor 64. The other of the source and the drain of the transistor 61 is electrically connected to a gate of the transistor 62 and one electrode of the capacitor 69A. The other of the source and the drain of the transistor 64 is electrically connected to a gate of the transistor 65 and one electrode of the capacitor 69B. The other of the source and the drain of the transistor 62 is electrically connected to the one of the source and the drain of the transistor 63, the other electrode of the capacitor 69A, and the first output terminal AOUTM. The other of the source and the drain of the transistor 65 is electrically connected to one of a source and a drain of the transistor 66, and the other electrode of the capacitor 69B, and the second output terminal AOUTP. One of a source and a drain of the transistor 67 is electrically connected to the other of the source and the drain of the transistor 63 and the other of the source and the drain of the transistor 66. The other of the source and the drain of the transistor 67 is electrically connected to the wiring VSS. A gate of the transistor 67 is electrically connected to one of a source and a drain of the transistor 68 and one electrode of the capacitor 69C. The other electrode of the capacitor 69C is electrically connected to the wiring VSS. The wiring SET is electrically connected to a gate of the transistor 61 and a gate of the transistor 64. The wiring BIAS is electrically connected to the other of the source and the drain of the transistor 68. The wiring SH is electrically connected to a gate of the transistor 68. The first input terminal AINP is electrically connected to a gate of the transistor 63. The second input terminal AINM is electrically connected to a gate of the transistor 66.

The transistor 68 and the capacitor 69C form a sample-and-hold circuit.

The transistors 61A and the capacitor 69A included in the first circuit 80A form a sample-and-hold circuit. The first circuit 80A functions as a current source, and a potential corresponding to a current source load is held in the sample-and-hold circuit. The sample-and-hold circuit holds a current source load, whereby the amplifier circuit functions as a differential amplifier with high gain. Note that the second circuit 80B operates in a manner similar to that of the second circuit 80A, and thus description thereof is omitted.

FIG. 21B1 is a block diagram illustrating the latch circuit 70. The latch circuit 70 includes a first input terminal LINP, a second input terminal LINM, a first output terminal LOUTM, and a second output terminal LOUTP.

FIG. 21B2 is a circuit diagram of the latch circuit 70. The latch circuit 70 includes a third circuit 81A, a fourth circuit 81B, a transistor 73, a transistor 76, a transistor 77, and a transistor 78. The third circuit 81A includes a transistor 71, a transistor 72, and a capacitor 79A. The fourth circuit 82B includes a transistor 74, a transistor 75, and a capacitor 79B.

The wiring BAT is electrically connected to one of a source and a drain of the transistor 71, one of a source and a drain of the transistor 72, one of a source and a drain of the transistor 73, and one of a source and a drain of the transistor 74. The other of the source and the drain of the transistor 71 is electrically connected to a gate of the transistor 72 and one electrode of the capacitor 79A. The other of the source and the drain of the transistor 74 is electrically connected to a gate of the transistor 75 and one electrode of the capacitor 79B.

The other of the source and the drain of the transistor 72 is electrically connected to the one of the source and the drain of the transistor 73, one of a source and a drain of the transistor 77, a gate of the transistor 76, the other electrode of the capacitor 79A, the first input terminal LINP, and the first output terminal LOUTM. Note that the first input terminal LINP and the first output terminal LOUTM function as an input/output terminal. For simplifying description, either the first input terminal LINP or the first output terminal LOUTM is used in some cases.

The other of the source and the drain of the transistor 75 is electrically connected to one of a source and a drain of the transistor 76, the other of the source and the drain of the transistor 77, a gate of the transistor 73, the other electrode of the capacitor 69B, the second input terminal LINM, and the second output terminal LOUTP. Note that the second input terminal LINM and the second output terminal LOUTP function as an input/output terminal. For simplifying description, either the second input terminal LINM or the second output terminal LOUTP is used in some cases. One of a source and a drain of the transistor 78 is electrically connected to the other of the source and the drain of the transistor 73 and the other of the source and the drain of the transistor 76. The other of the source and the drain of the transistor 78 is electrically connected to the wiring VSS. A gate of the transistor 78 is electrically connected to the wiring LAT. A gate of the transistor 77 is electrically connected to the wiring LATB. The wiring SET is electrically connected to a gate of the transistor 71 and a gate of the transistor 74.

The transistor 71A and the capacitor 79A included in the third circuit 81A form a sample-and-hold circuit. The third circuit 81A functions as a current source, and a potential corresponding to a current source load is held in the sample-and-hold circuit. The sample-and-hold circuit holds a current source load, whereby the amplifier circuit functions as a differential amplifier with high gain. Note that the fourth circuit 81B operates in a manner similar to the third circuit 81A, and thus description thereof is omitted.

Figure 22:
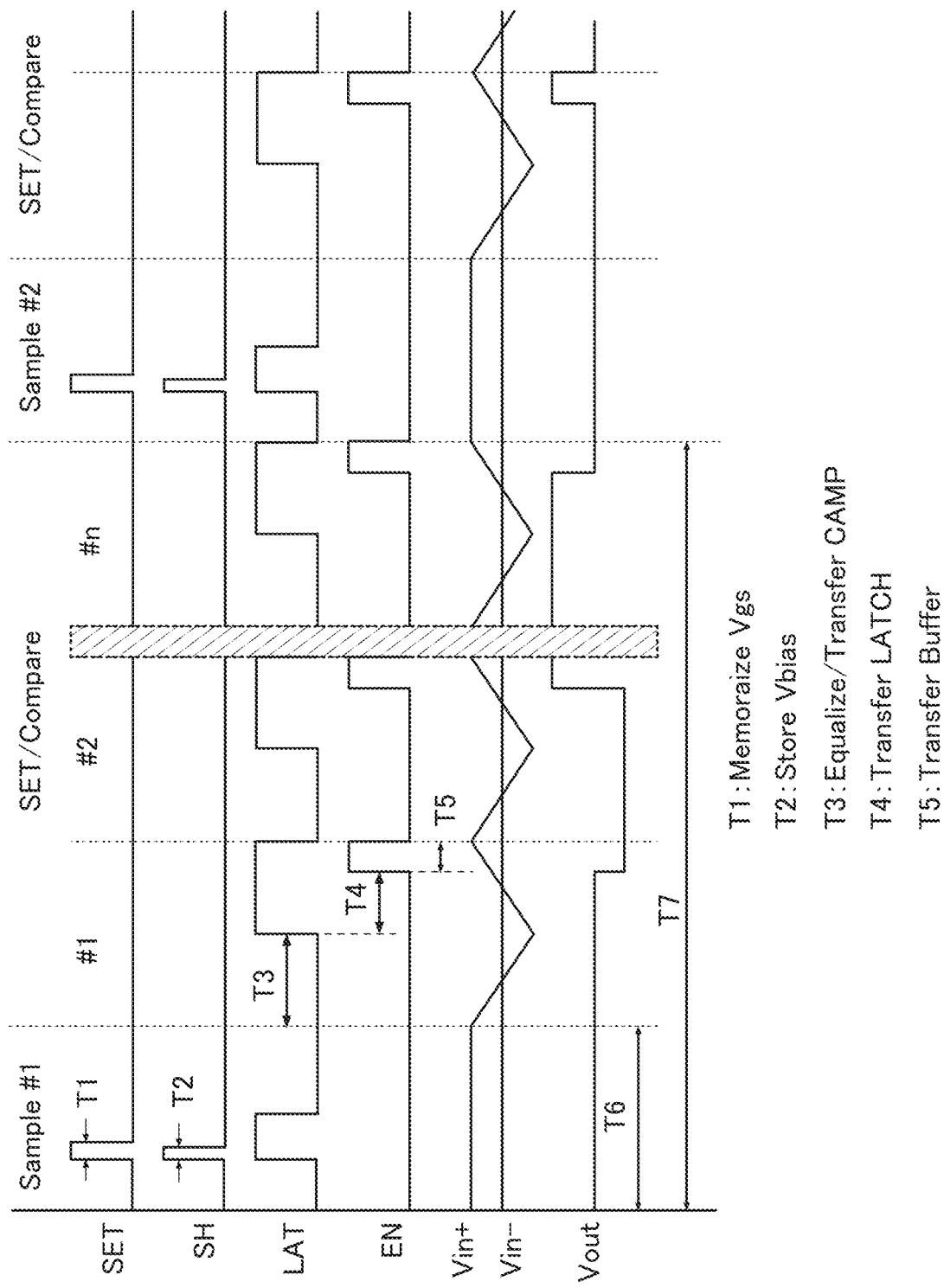
FIG. 22 is a timing chart of a micro-short detection circuit.

FIG. 22 is a timing chart showing operation of the sensing device 50 of the micro-short detection circuit. The transistor used in each of the sample-and-hold circuits includes a metal oxide in a semiconductor layer and thus has an extremely low off-leakage current. Accordingly, each of the sample-and-hold circuits can hold a supplied potential for a long time. As for an operation timing of the sensing device 50, in a sample-and-hold period, each of the transistor 61, the transistor 64, the transistor 71, and the transistor 74 holds a supplied potential, an offset potential, and a bias voltage. In a comparison period of data, in the case where the signal LAT becomes "H", Vin+ supplied to the terminal INP and Vin− supplied to the terminal INM are compared. When a signal EN becomes "H", the signal Vout is output to the terminal OUT.

Specifically, Period T1 is a period during which Vgs of the transistor 62 is stored (Memorize Vgs), for example. Period T2 is a period during which a signal Vbias is held in the capacitor 69C through the wiring Bias. Period T3 is a period during which a data potential is held in the capacitor 59A or 59B (Equalize/Transfer CAMP). Period T4 is a period during which the latch circuit 70 is brought into a state where input can be performed, and the data potential is transferred to the latch circuit 70 (Transfer LATCH) when the signal LAT becomes "H" and the signal EN becomes "L". Period T5 is a period during which in the case where the signal LAT becomes "H" and the signal EN becomes "H", the signal Vout is output to the terminal OUT through the buffer circuit BUF (Transfer Buffer). Note that in the case where Sample 1 in the timing chart shown in FIG. 22 (Sample #1) is a first sequence, #1 to #n is regarded as one sequence. Sample 2 (Sample #2) is a sequence different from Sample 1, which can detect micro short-circuit by repetition of operation. Note that #2 is a period of SET/Compare.

This embodiment can be implemented in combination with any of the structures described in the other embodiments and the like, as appropriate.

Embodiment 3

In this embodiment, examples of transistors which can be used as the transistors described in the above embodiments are described with reference to drawings.

The display device of one embodiment of the present invention can be fabricated using a transistor with any of various structures, such as a bottom-gate transistor or a top-gate transistor. Therefore, a material of a semiconductor layer or the structure of a transistor can be easily changed depending on the existing production line.

[Bottom-Gate Transistor]

FIG. 9A1 is a cross-sectional view of a channel-protective transistor 810, which is a type of bottom-gate transistor, in the channel length direction. In FIG. 9A1, the transistor 810 is formed over a substrate 771. The transistor 810 includes an electrode 746 over the substrate 771 with an insulating layer 772 therebetween. The transistor 810 also includes a semiconductor layer 742 over the electrode 746 with an insulating layer 726 therebetween. The electrode 746 can function as a gate electrode. The insulating layer 726 can function as a gate insulating layer.

Furthermore, an insulating layer 741 is provided over a channel formation region in the semiconductor layer 742. Furthermore, an electrode 744a and an electrode 744b are provided to be partly in contact with the semiconductor layer 742 and over the insulating layer 726. The electrode 744a can function as one of a source electrode and a drain electrode. The electrode 744b can function as the other of the source electrode and the drain electrode. Part of the electrode 744a and part of the electrode 744b are formed over the insulating layer 741.

The insulating layer 741 can function as a channel protective layer. With the insulating layer 741 provided over the channel formation region, the semiconductor layer 742 can be prevented from being exposed at the time of forming the electrode 744a and the electrode 744b. Thus, the channel formation region in the semiconductor layer 742 can be prevented from being etched at the time of forming the electrode 744a and the electrode 744b. According to one embodiment of the present invention, a transistor with favorable electrical characteristics can be provided.

The transistor 810 includes an insulating layer 728 over the electrode 744a, the electrode 744b, and the insulating layer 741 and also includes an insulating layer 729 over the insulating layer 728.

In the case where an oxide semiconductor is used for the semiconductor layer 742, a material capable of removing oxygen from part of the semiconductor layer 742 to generate oxygen vacancies is preferably used at least for portions of the electrode 744a and the electrode 744b which are in contact with the semiconductor layer 742. The carrier concentration in the regions of the semiconductor layer 742 where oxygen vacancies are generated is increased, so that the regions become n-type regions ($n^+$ layers). Accordingly, the regions can function as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce contact resistance between the semiconductor layer 742 and each of the electrode 744a and the electrode 744b. Accordingly, the electrical characteristics of the transistor, such as the field-effect mobility and the threshold voltage, can be improved.

In the case where a semiconductor such as silicon is used for the semiconductor layer 742, a layer that functions as an n-type semiconductor or a p-type semiconductor is preferably provided between the semiconductor layer 742 and the electrode 744a and between the semiconductor layer 742 and the electrode 744b. The layer that functions as an n-type semiconductor or a p-type semiconductor can function as the source region or the drain region in the transistor.

The insulating layer 729 is preferably formed using a material that has a function of preventing or reducing diffusion of impurities into the transistor from the outside. Note that the insulating layer 729 can be omitted as necessary.

A transistor 811 illustrated in FIG. 9A2 is different from the transistor 810 in that an electrode 723 that can function as a back gate electrode is provided over the insulating layer 729. The electrode 723 can be formed using a material and a method similar to those for the electrode 746.

In general, a back gate electrode is formed using a conductive layer and positioned so that a channel formation region in a semiconductor layer is positioned between the gate electrode and the back gate electrode. Thus, the back gate electrode can function in a manner similar to that of the gate electrode. The potential of the back gate electrode may be the same as the potential of the gate electrode or may be a ground potential (GND potential) or an arbitrary potential. When the potential of the back gate electrode is changed independently of the potential of the gate electrode, the threshold voltage of the transistor can be changed.

The electrode 746 and the electrode 723 can each function as a gate electrode. Thus, the insulating layer 726, the insulating layer 728, and the insulating layer 729 can each function as a gate insulating layer. Note that the electrode 723 may be provided between the insulating layer 728 and the insulating layer 729.

Note that in the case where one of the electrode 746 and the electrode 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. One of the electrode 746 and the electrode 723 may be referred to as a "first gate electrode", and the other may be referred to as a "second gate electrode".

By providing the electrode 746 and the electrode 723 with the semiconductor layer 742 therebetween and setting the potential of the electrode 746 equal to the potential of the electrode 723, a region of the semiconductor layer 742 through which carriers flow is enlarged in the film thickness direction; thus, the number of transferred carriers is increased. As a result, the on-state current of the transistor 811 is increased and the field-effect mobility is increased.

Therefore, the transistor 811 is a transistor having high on-state current for its occupation area. That is, the occupation area of the transistor 811 can be small for required on-state current. According to one embodiment of the present invention, the occupation area of a transistor can be reduced. Therefore, according to one embodiment of the present invention, a semiconductor device having a high degree of integration can be provided.

The gate electrode and the back gate electrode are formed using conductive layers and thus each have a function of preventing an electric field generated outside the transistor from affecting the semiconductor layer in which the channel is formed (in particular, an electric field blocking function against static electricity and the like). Note that when the back gate electrode is formed larger than the semiconductor layer such that the semiconductor layer is covered with the back gate electrode, the electric field blocking function can be enhanced.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

FIG. 9B1 is a cross-sectional view of a channel-protective transistor 820, which has a structure different from FIG. 9A1, in the channel length direction. The transistor 820 has substantially the same structure as the transistor 810 but is different from the transistor 810 in that the insulating layer 741 covers end portions of the semiconductor layer 742. The semiconductor layer 742 is electrically connected to the electrode 744a through an opening portion formed by selectively removing part of the insulating layer 741 that overlaps with the semiconductor layer 742. The semiconductor layer 742 is electrically connected to the electrode 744b through another opening portion formed by selectively removing part of the insulating layer 741 that overlaps with the semiconductor layer 742. A region of the insulating layer 741 that overlaps with the channel formation region can function as a channel protective layer.

A transistor 821 illustrated in FIG. 9B2 is different from the transistor 820 in that the electrode 723 that can function as a back gate electrode is provided over the insulating layer 729.

With the insulating layer 741, the semiconductor layer 742 can be prevented from being exposed at the time of forming the electrode 744a and the electrode 744b. Thus, the semiconductor layer 742 can be prevented from being reduced in thickness at the time of forming the electrode 744a and the electrode 744b.

The distance between the electrode 744a and the electrode 746 and the distance between the electrode 744b and the electrode 746 are longer in the transistor 820 and the transistor 821 than in the transistor 810 and the transistor 811. Thus, the parasitic capacitance generated between the electrode 744a and the electrode 746 can be reduced. Moreover, the parasitic capacitance generated between the electrode 744b and the electrode 746 can be reduced.

FIG. 9C1 is a cross-sectional view of a channel-etched transistor 825, which is a type of bottom-gate transistor, in the channel length direction. In the transistor 825, the electrode 744a and the electrode 744b are formed without the insulating layer 741. Thus, part of the semiconductor layer 742 that is exposed at the time of forming the electrode 744a and the electrode 744b might be etched. However, since the insulating layer 741 is not provided, the productivity of the transistor can be increased.

The transistor 826 illustrated in FIG. 9C2 is different from the transistor 825 in that the electrode 723 that can function as a back gate electrode is provided over the insulating layer 729.

FIG. 10A1 to FIG. 10C2 are cross-sectional views of the transistors 810, 811, 820, 821, 825, and 826 in the channel width direction, respectively.

In each of the structures illustrated in FIG. 10B2 and FIG. 10C2, the gate electrode is connected to the back gate electrode, and the gate electrode and the back gate electrode have the same potential. In addition, the semiconductor layer 742 is positioned between the gate electrode and the back gate electrode.

The length of each of the gate electrode and the back gate electrode in the channel width direction is longer than the length of the semiconductor layer 742 in the channel width direction. In the channel width direction, the whole of the semiconductor layer 742 is covered with the gate electrode and the back gate electrode with the insulating layers 726, 741, 728, and 729 positioned therebetween.

In this structure, the semiconductor layer 742 included in the transistor can be electrically surrounded by electric fields of the gate electrode and the back gate electrode.

The transistor device structure in which the semiconductor layer 742 in which the channel formation region is formed is electrically surrounded by electric fields of the gate electrode and the back gate electrode, as in the transistor 821 or the transistor 826, can be referred to as a Surrounded channel (S-channel) structure.

With the S-channel structure, an electric field for inducing a channel can be effectively applied to the semiconductor layer 742 by one or both of the gate electrode and the back gate electrode, which improves the current drive capability of the transistor and offers high on-state current characteristics. In addition, the transistor can be miniaturized because the on-state current can be increased. The S-channel structure can also increase the mechanical strength of the transistor.

[Top-Gate Transistor]

A transistor 842 illustrated in FIG. 11A1 is a type of top-gate transistor. The transistor 842 is different from the transistor 810 or the transistor 820 in that the electrode 744a and the electrode 744b are formed after the formation of the insulating layer 729. The electrode 744a and the electrode 744b are electrically connected to the semiconductor layer 742 through opening portions formed in the insulating layer 728 and the insulating layer 729.

Part of the insulating layer 726 that does not overlap with the electrode 746 is removed, and an impurity is introduced into the semiconductor layer 742 using the electrode 746 and the remaining insulating layer 726 as masks, so that an impurity region can be formed in the semiconductor layer 742 in a self-aligned manner. The transistor 842 includes a region where the insulating layer 726 extends beyond end portions of the electrode 746. The semiconductor layer 742 in a region into which the impurity is introduced through the insulating layer 726 has a lower impurity concentration than the semiconductor layer 742 in a region into which the impurity is introduced not through the insulating layer 726. Thus, an LDD (Lightly Doped Drain) region is formed in the region of the semiconductor layer 742 that does not overlap with the electrode 746.

A transistor 843 illustrated in FIG. 11A2 is different from the transistor 842 in that the electrode 723 is included. The transistor 843 includes the electrode 723 that is formed over the substrate 771. The electrode 723 includes a region overlapping with the semiconductor layer 742 with the insulating layer 772 therebetween. The electrode 723 can function as a back gate electrode.

As in a transistor 844 illustrated in FIG. 11B1 and a transistor 845 illustrated in FIG. 11B2, the insulating layer 726 in a region that does not overlap with the electrode 746 may be completely removed. Alternatively, as in a transistor 846 illustrated in FIG. 11C1 and a transistor 847 illustrated in FIG. 11C2, the insulating layer 726 may be left.

Also in the transistor 842 to the transistor 847, after the formation of the electrode 746, the impurity is introduced into the semiconductor layer 742 using the electrode 746 as a mask, so that an impurity region can be formed in the semiconductor layer 742 in a self-aligned manner. According to one embodiment of the present invention, a transistor with favorable electrical characteristics can be provided. Furthermore, according to one embodiment of the present invention, a semiconductor device having a high degree of integration can be provided.

FIG. 12A1 to FIG. 12C2 are cross-sectional views of the transistors 842, 843, 844, 845, 846, and 847 in the channel width direction, respectively.

The transistor 843, the transistor 845, and the transistor 847 each have the above-described S-channel structure. However, one embodiment of the present invention is not limited to this, and the transistor 843, the transistor 845, and the transistor 847 do not necessarily have the S-channel structure.

This embodiment can be implemented in combination with any of the structures described in the other embodiments and the like, as appropriate.

Embodiment 4

In this embodiment, an example of a transistor having a structure different from that of the transistor described in Embodiment 3 will be described with reference to FIG. 28 and FIG. 29.

Figure 28A:
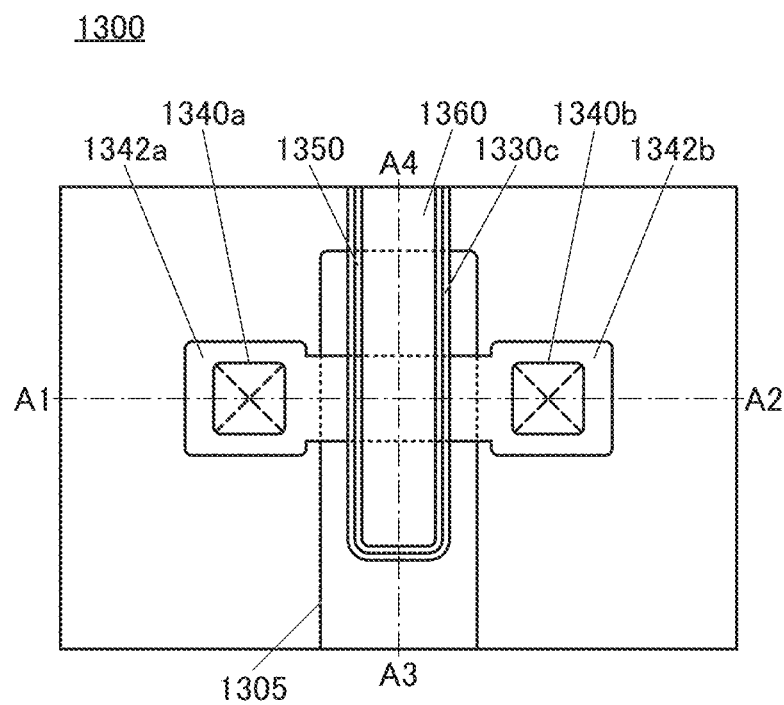
FIG. 28A is a top view illustrating an example of a transistor.
Figure 28C:
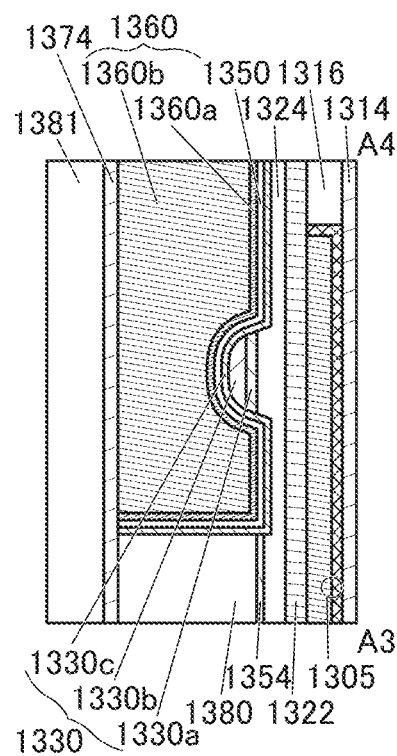
FIG. 28B and FIG. 28C are cross-sectional views illustrating an example of a transistor.
Figure 28B:
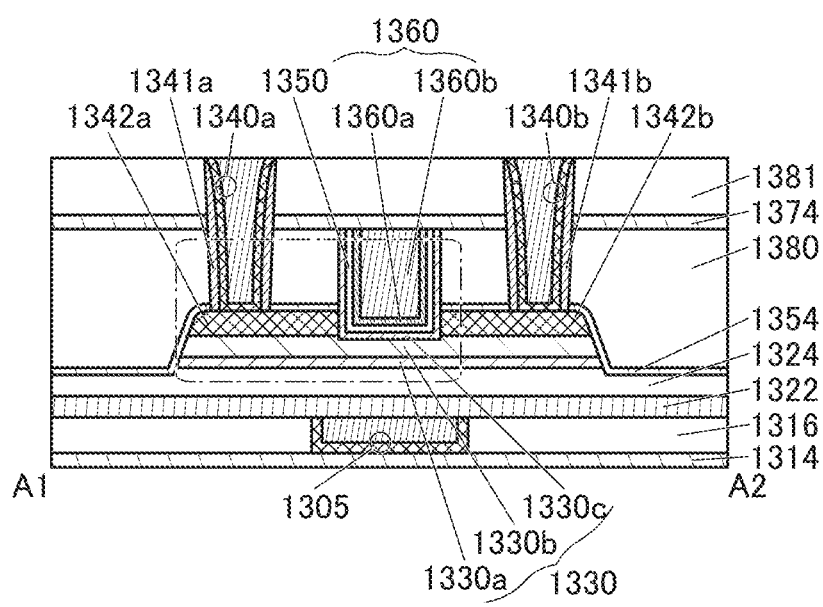

FIG. 28A illustrates a top view of a transistor 1300. Note that for simplification of the drawing, some components are not illustrated in FIG. 28A. FIG. 28B illustrates a cross-sectional view taken along dashed-dotted line A1-A2 in FIG. 28A. FIG. 28B can be referred to as a cross-sectional view of the transistor 1300 in the channel length direction. FIG. 28C illustrates a cross-sectional view taken along dashed-dotted line A3-A4 in FIG. 28A. FIG. 28C can be referred to as a cross-sectional view of the transistor 1300 in the channel width direction.

Figure 29A:
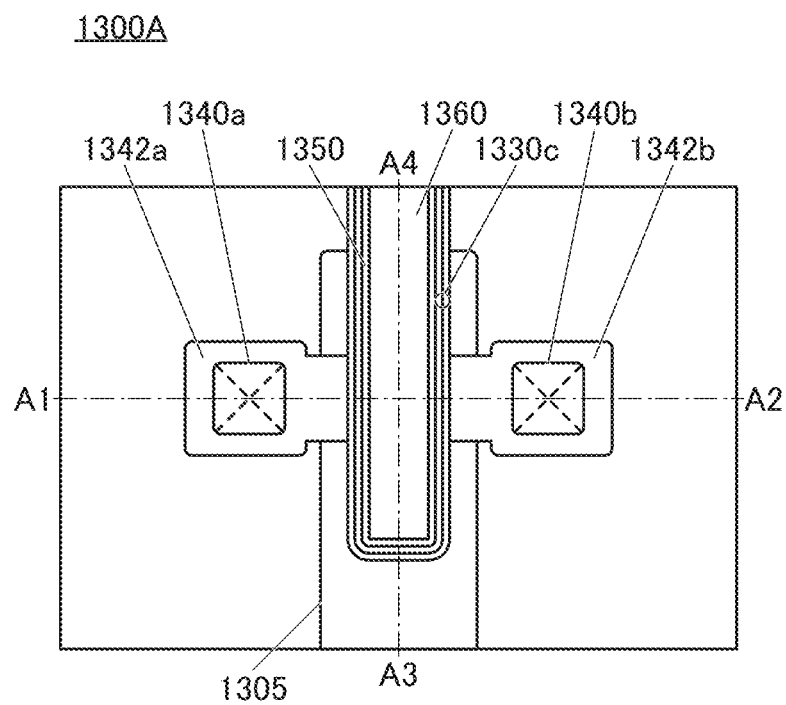
FIG. 29A is a top view illustrating an example of a transistor.
Figure 29C:
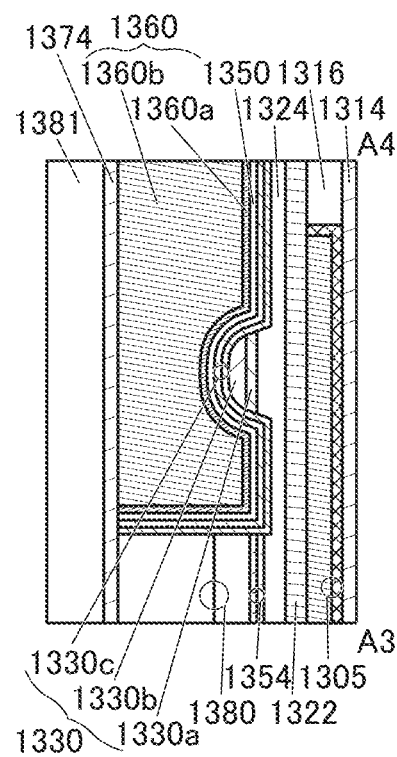
FIG. 29B and FIG. 29C are cross-sectional views illustrating an example of a transistor.
Figure 29B:
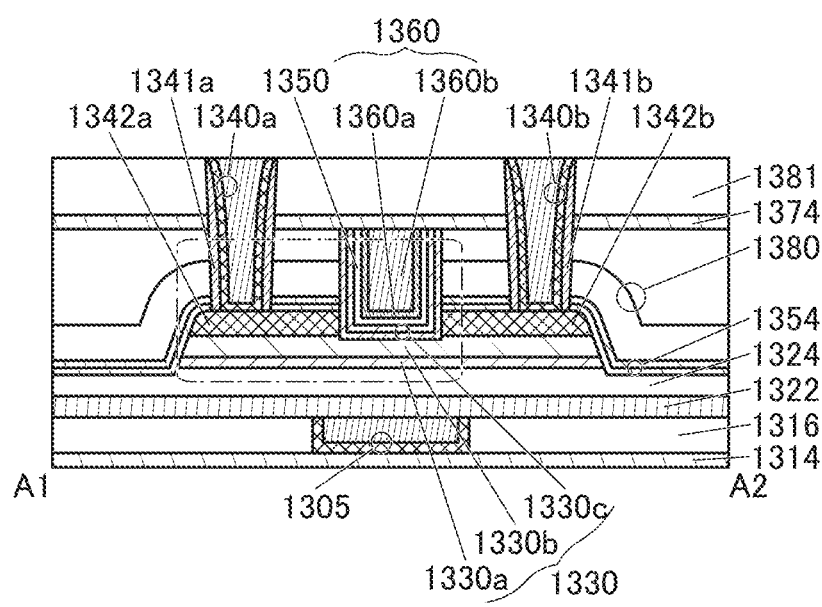

FIG. 29A illustrates a top view of a transistor 1300A. Note that for simplification of the drawing, some components are not illustrated in FIG. 29A. FIG. 29B illustrates a cross-sectional view taken along dashed-dotted line A1-A2 in FIG. 29A. FIG. 29B can be referred to as a cross-sectional view of the transistor 1300A in the channel length direction. FIG. 28C illustrates a cross-sectional view along dashed-dotted line A3-A4 in FIG. 29A. FIG. 29C can be referred to as a cross-sectional view of the transistor 1300A in the channel width direction.

Note that the transistor 1300A illustrated in FIG. 29 is a variation example of the transistor 1300 illustrated in FIG. 28. Each of an oxide layer 1330c, an insulating layer 1354, and an insulating layer 1380 has a single-layer structure in FIG. 28 and has a stacked-layer structure in FIG. 29. The other structures in FIG. 28 are similar to those in FIG. 29.

In this specification and the like, a transistor is an element having at least three terminals of a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or when a direction of current flow is changed in circuit operation, for example. Therefore, the terms "source" and "drain" can be interchanged in some cases in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, or the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, or the average value in a channel formation region.

Note that in this specification and the like, depending on transistor structures, a channel width in a region where a channel is actually formed (hereinafter, also referred to as an "effective channel width") is different from a channel width shown in a top view of a transistor (hereinafter, also referred to as an "apparent channel width") in some cases. For example, when a gate electrode covers a side surface of a semiconductor, an effective channel width is greater than an apparent channel width and its influence cannot be ignored in some cases. For example, in a miniaturized transistor having a gate electrode covering a side surface of a semiconductor, the proportion of a channel formation region formed in a side surface of a semiconductor is increased in some cases. In that case, an effective channel width is greater than an apparent channel width.

In such a case, an effective channel width is difficult to estimate by measuring in some cases. For example, to estimate an effective channel width from a design value, it is necessary to assume that the shape of a semiconductor is known. Accordingly, in the case where the shape of a semiconductor is not known exactly, it is difficult to measure an effective channel width accurately.

In this specification, the simple term "channel width" denotes an apparent channel width in some cases. In other cases, the simple term "channel width" denotes an effective channel width in this specification. Note that the values of a channel length, a channel width, an effective channel width, an apparent channel width, and the like can be determined by analyzing a cross-sectional TEM image and the like.

The transistor 1300 includes a conductive layer 1305 provided over a substrate (not illustrated) with an insulating layer 1314 therebetween and provided to be embedded in an insulating layer 1316; an insulating layer 1322 provided over the insulating layer 1316 and the conductive layer 1305; an insulating layer 1324 provided over the insulating layer 1322; an oxide layer 1330 (an oxide layer 1330a, an oxide layer 1330b, and the oxide layer 1330c) provided over the insulating layer 1324; an insulating layer 1350 provided over the oxide layer 1330; a conductive layer 1360 (a conductive layer 1360a and a conductive layer 1360b) provided over the insulating layer 1350; a conductive layer 1342a and a conductive layer 1342b in contact with part of a top surface of the oxide layer 1330b; and an insulating layer 1354 provided in contact with part of a top surface of the insulating layer 1324, a side surface of the oxide layer 1330a, a side surface of the oxide layer 1330b, a side surface and a top surface of the conductive layer 1342a, and a side surface and a top surface of the conductive layer 1342b.

The insulating layer 1350, an insulating layer 1374, and an insulating layer 1351 each functioning as an interlayer film are provided over the transistor 1300. The transistor 1300 is electrically connected to a conductive layer 1340 (a conductive layer 1340a and a conductive layer 1340b) functioning as a plug. Note that an insulating layer 1341 (an insulating layer 1341a and an insulating layer 1341b) is provided in contact with a side surface of the conducting layer 1340.

The oxide layer 1330 preferably includes the oxide layer 1330a provided over the insulating layer 1324; the oxide layer 1330b provided over the oxide layer 1330a; and the oxide layer 1330c which is provided over the oxide layer 1330b and at least part of which is in contact with a top surface of the oxide layer 1330b. When the oxide layer 1330a is provided under the oxide layer 1330b, impurities can be inhibited from being diffused into the oxide layer 1330b from the components formed below the oxide layer 1330a. When the oxide layer 1330c is provided over the oxide layer 1330b, impurities can be inhibited from being diffused into the oxide layer 1330b from the components formed above the oxide layer 1330c.

Although an example of the transistor 1300 in which the oxide layer 1330 has a three-layer structure of the oxide layer 1330a, the oxide layer 1330b, and the oxide layer 1330c is described, the present invention is not limited thereto. For example, the oxide layer 1330 may have a single-layer structure of the oxide layer 1330b, a two-layer structure of the oxide layer 1330a and the oxide layer 1330b, a two-layer structure of the oxide layer 1330b and the oxide layer 1330c, or a stacked-layer structure of four or more layers. Alternatively, each of the oxide layer 1330a, the oxide layer 1330b, and the oxide layer 1330c may have a stacked-layer structure.

The conductive layer 1342 (the conductive layer 1342a and the conductive layer 1342b) is provided over the oxide layer 1330b. The thickness of the conductive layer 1342 can be, for example, greater than or equal to 1 nm and less than or equal to 50 nm, preferably greater than or equal to 2 nm and less than or equal to 25 nm.

The conductive layer 1360 functions as a first gate (also referred to as top gate) electrode of the transistor 1300, and the conductive layer 1342a and the conductive layer 1342b function as a source electrode and a drain electrode of the transistor 1300.

In the transistor 1300, a metal oxide functioning as a semiconductor (hereinafter also referred to as an oxide semiconductor) is preferably used in the oxide layer 1330 including a channel formation region. When an oxide semiconductor is used in a channel formation region of a transistor, a transistor having high field-effect mobility can be achieved. In addition, a transistor having high reliability can be achieved.

As the above metal oxide, it is preferable to use a metal oxide having a bandgap of 2.0 eV or more, preferably 2.5 eV or more. The use of a metal oxide having a wide band gap in the oxide layer 330 can reduce the off-state current of the transistor. The use of such a transistor can provide an amplifier circuit with low power consumption.

For example, as the oxide layer 1330, a metal oxide such as an In-M-Zn oxide including indium (In), an element M, and zinc (Zn) (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. Furthermore, an In-M oxide, an In—Zn oxide, or a M-Zn oxide may be used as the oxide layer 330.

A metal oxide with a low carrier density is preferably used in the transistor 1300. In order to reduce the carrier density of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. As examples of the impurities in the metal oxide, hydrogen, nitrogen, alkali metal, alkaline earth metal, iron, nickel, silicon, and the like are given.

In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics in some cases. In some cases, a defect that is an oxygen vacancy into which hydrogen enters functions as a donor and generates an electron serving as a carrier. In other cases, bonding of part of hydrogen to oxygen bonded to a metal atom generates electrons serving as carriers. Thus, a transistor using a metal oxide containing much hydrogen is likely to have normally-on characteristics.

Therefore, when a metal oxide is used in the oxide layer 1330, hydrogen in the metal oxide is preferably reduced as much as possible. Specifically, the hydrogen concentration of the metal oxide, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide with a sufficiently low concentration of impurities such as hydrogen is used for a channel formation region of a transistor, the transistor can have stable electrical characteristics.

When a metal oxide is used for the oxide layer 1330, contact between the conductive layer 1342 (the conductive layer 1342a and the conductive layer 1342b) and the oxide layer 1330 may make oxygen in the oxide layer 1330 diffuse into the conductive layer 1342, resulting in oxidation of the conductive layer 1342. It is highly possible that oxidation of the conductive layer 1342 lowers the conductivity of the conductive layer 1342. Note that diffusion of oxygen from the oxide layer 1330 into the conductive layer 1342 can be interpreted as absorption of oxygen in the oxide layer 1330 by the conductive layer 1342.

When oxygen in the oxide layer 1330 is diffused into the conductive layer 1342 (the conductive layer 1342a and the conductive layer 1342b), a layer may be formed between the conductive layer 1342a and the oxide layers 1330b and 1330c and between the conductive layer 1342b and the oxide layers 1330b and 1330c. The layer contains more oxygen than the conductive layer 1342 does and thus presumably has an insulating property. In this case, a three-layer structure of the conductive layer 1342, the layer, and the oxide layer 1330b or the oxide layer 1330c can be regarded as a three-layer structure of a metal, an insulator, and a semiconductor and is sometimes referred to as a MIS (metal-insulator-semiconductor) structure.

In view of the above, the conductive layer 1342 (the conductive layer 1342a and the conductive layer 1342b) is preferably formed using a conductive material with which hydrogen in the oxide layer 1330 easily diffuses into the conductive layer 1342 and oxygen in the oxide layer 1330 does not easily diffuse into the conductive layer 1342. Thus, hydrogen in the oxide layer 1330 is diffused into the conductive layer 1342, and thus the hydrogen concentration in the oxide layer 1330 is reduced, so that the transistor 1300 can have stable electrical characteristics. Note that in this specification and the like, ease of diffusion of hydrogen in an oxide into a conductive layer is sometimes expressed by a phrase "the conductive layer is likely to extract (absorb) hydrogen in the oxide". Moreover, hardness of diffusion of oxygen in an oxide into a conductive layer is sometimes expressed by phrases "the conductive layer is not easily oxidized" and "the conductive layer is resistant to oxidation", for example.

As the above conductive material, for example, a conductor containing tantalum (Ta), titanium (Ti), or the like can be given. In particular, a conductor containing tantalum is preferably used for the conductive layer 1342. A conductor containing tantalum may contain nitrogen and/or oxygen. Accordingly, the composition formula of a conductor containing tantalum preferably satisfies TaN$_x$O$_y$ (x is a real number greater than 0 and less than or equal to 1.67 and y is a real number greater than or equal to 0 and less than or equal to 1.0). Examples of the conductor containing tantalum include tantalum, tantalum oxide, tantalum nitride, tantalum nitride oxide, and tantalum oxynitride. For that reason, in this specification and the like, the conductor containing tantalum is sometimes referred to as TaNxOy.

In TaNxOy, the proportion of tantalum is preferably high. Alternatively, the proportions of nitrogen and oxygen are preferably low; i.e., x and y are preferably small. A high proportion of tantalum lowers the resistance of TaNxOy, and the transistor 1300 in which TaNxOy is used for the conductive layer 1342 can have favorable electrical characteristics.

Alternatively, the proportion of nitrogen in TaNxOy is preferably high; i.e., x is preferably large. The use of TaNxOy with a high proportion of nitrogen in the conductive layer 1342 can inhibit oxidation of the conductive layer 342. In addition, the thickness of a layer formed between the conductive layer 1342 and the oxide layer 1330 can be made small.

Note that hydrogen diffused into the conductive layer 1342 sometimes remains in the conductive layer 1342. That is, hydrogen in the oxide layer 1330 is absorbed by the conductive layer 1342 in some cases. In other cases, hydrogen in the oxide layer 1330 passes through the conductive layer 1342 and is released to a component provided around the conductive layer 1342 or the outside of the transistor 1300.

In order to reduce the hydrogen concentration of the oxide layer 1330 and to inhibit formation of a layer between the conductive layer 1342 and the oxide layer 1330, it is preferable that the conductive layer 1342 be formed using a conductive material with which hydrogen in the oxide layer 1330 diffuses easily into the conductive layer 342, and that a layer having a function of inhibiting oxidation of the conductive layer 1342 be provided between the conductive layer 1342 and the oxide layer 1330. By providing the layer, the conductive layer 1342 and the oxide layer 1330 are not in contact with each other, so that the conductive layer 1342 can be inhibited from absorbing oxygen in the oxide layer 1330.

The structure of the transistor 1300 is described in detail below.

The insulating layer 1314 preferably functions as an insulating barrier film that inhibits diffusion of impurities such as water and hydrogen from the substrate side into the transistor 1300. Accordingly, for the insulating layer 1314, it is preferable to use an insulating material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use an insulating material having a function of inhibiting diffusion of oxygen (e.g., at least one of an oxygen atom, an oxygen molecule, and the like).

Note that in this specification, a function of inhibiting diffusion of impurities or oxygen means a function of inhibiting diffusion of any one or all of the impurities and the oxygen. A film having a function of inhibiting diffusion of hydrogen or oxygen may be referred to as a film through which hydrogen or oxygen does not pass easily, a film having low permeability of hydrogen or oxygen, a film having a barrier property against hydrogen or oxygen, or a barrier film against hydrogen or oxygen, for example. A barrier film having conductivity is sometimes referred to as a conductive barrier film.

For example, an aluminum oxide film, a silicon nitride film, or the like is preferably used as the insulating layer 1314. Accordingly, impurities such as water and hydrogen can be inhibited from diffusing to the transistor 1300 side from the substrate side through the insulating layer 1314. Alternatively, oxygen contained in the insulating layer 1324 and the like can be inhibited from diffusing into the substrate side through the insulating layer 1314. Note that the insulating layer 1314 may have a stacked-layer structure of two or more layers. In that case, without limitation to a stacked-layer structure formed of the same material, a stacked-layer structure formed of different materials may be employed. For example, a stacked layer of an aluminum oxide film and a silicon nitride film may be employed.

Furthermore, it is preferable to use, as the insulating layer 1314, a silicon nitride film deposited by a sputtering method, for example. Thus, the hydrogen concentration of the insulating layer 1314 can me made low, so that impurities such as water and hydrogen can be further inhibited from diffusing to the transistor 1300 side from the substrate side through the insulating layer 1314.

The dielectric constant of the insulating layer 1316 functioning as an interlayer film is preferably lower than that of the insulating layer 1314. When a material having a low dielectric constant is used for an interlayer film, parasitic capacitance generated between wirings can be reduced. As the insulating layer 1316, a silicon oxide film, a silicon oxynitride film, a silicon nitride oxide film, a silicon nitride film, a silicon oxide film to which fluorine is added, a silicon oxide film to which carbon is added, a silicon oxide film to which carbon and nitrogen are added, a porous silicon oxide film, or the like is used as appropriate, for example.

The insulating layer 1316 preferably includes a region that has a low hydrogen concentration and contains oxygen in excess of that in the stoichiometric composition (hereinafter also referred to as an excess-oxygen region), or preferably contains oxygen that is released by heating (hereinafter also referred to as excess oxygen). For example, a silicon oxide film deposited by a sputtering method is preferably used as the insulating layer 1316. Thus, entry of hydrogen into the oxide layer 1330 can be inhibited; alternatively, oxygen can be supplied to the oxide layer 1330 to reduce oxygen vacancies in the oxide layer 1330. Accordingly, a transistor that has stable electrical characteristics with a small variation in electrical characteristics and improved reliability can be provided.

The insulating layer 1316 may have a stacked-layer structure. For example, in the insulating layer 1316, a structure may be employed in which an insulating layer similar to the insulating layer 1314 is provided at least in a portion in contact with a side surface of the conductive layer 1305. With such a structure, oxidization of the conductive layer 1305 due to oxygen contained in the insulating layer 1316 can be inhibited. Reduction in the amount of oxygen contained in the insulating layer 1316 due to the conductive layer 1305 can be inhibited.

The conductive layer 1305 sometimes functions as a second gate (also referred to as bottom gate) electrode. In that case, by changing the potential applied to the conductive layer 1305 not in conjunction with but independently of the potential applied to the conductive layer 1360, the threshold voltage (Vth) of the transistor 1300 can be controlled. In particular, by applying a negative potential to the conductive layer 1305, Vth of the transistor 1300 can be higher, and its off-state current can be reduced. Thus, drain current at the time when a potential applied to the conductive layer 1360 is 0 V can be lower in the case where a negative potential is applied to the conductive layer 1305 than in the case where a negative potential is not applied to the conductive layer 1305.

The conductive layer 1305 is placed to overlap with the oxide layer 1330 and the conductive layer 1360. The conductive layer 1305 is preferably provided to be embedded in the insulating layer 1314 or the insulating layer 1316.

Note that as illustrated in FIG. 28B, the conductive layer 1305 is preferably provided larger than the channel formation region in the oxide layer 1330. As illustrated in FIG. 28C it is particularly preferable that the conductive layer 1305 also extend to a region outside an end portion of the oxide layer 1330 that intersects with the channel width direction. That is, the conductive layer 1305 and the conductive layer 1360 preferably overlap with each other with the insulating layers positioned therebetween on an outer side of the side surface of the oxide layer 1330 in the channel width direction. Since the above structure is included, the channel formation region of the oxide layer 1330 can be electrically surrounded by the electric field of the conductive layer 1360 functioning as the first gate electrode and the electric field of the conductive layer 1305 functioning as the second gate electrode.

As illustrated in FIG. 28C, the conductive layer 1305 is extended to function as a wiring. However, without limitation to this structure, a structure where a conductive layer functioning as a wiring is provided below the conductive layer 1305 may be employed. In addition, the conductive layer 1305 does not necessarily have to be provided in each transistor. For example, the conductive layer 1305 may be shared by a plurality of transistors.

Although an example of the transistor 1300 in which the conductive layer 1305 has a two-layer structure (a first conductive layer over the insulating layer 1314 and a second conductive layer over the first conductive layer) is described, the present invention is not limited to this. For example, the conductive layer 1305 may have a single-layer structure or a stacked-layer structure of three or more layers. In the case where a structure body has a stacked-layer structure, layers may be distinguished by ordinal numbers corresponding to the formation order.

Here, for the first conductive layer of the conductive layer 1305, a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom is preferably used. Alternatively, it is preferable to use a conductive material having a function of inhibiting diffusion of oxygen (e.g., at least one of an oxygen atom, an oxygen molecule, and the like).

When a conductive material having a function of inhibiting oxygen diffusion is used for the first conductive layer of the conductive layer 1305, a reduction in the conductivity of the second conductive layer of the conductive layer 1305 due to oxidation can be inhibited. As a conductive material having a function of inhibiting diffusion of oxygen, for example, tantalum, tantalum nitride, ruthenium, or ruthenium oxide is preferably used. Accordingly, the first conductive layer of the conductive layer 1305 preferably has a single-layer structure or a stacked-layer structure using any of the above conductive materials. For example, the first conductive layer of the conductive layer 1305 may be a stacked layer of a tantalum film, a tantalum nitride film, a ruthenium film, or a ruthenium oxide film and a titanium film or a titanium nitride film.

For the second conductive layer of the conductive layer 1305, a conductive material containing tungsten, copper, or aluminum as its main component is preferably used. Note that the second conductive layer of the conductive layer 1305 is a single layer in FIG. 28B and the like but may have a stacked-layer structure, for example, a stacked-layer structure of a film containing the above conductive material and a titanium film or a titanium nitride film.

The insulating layer 1322 and the insulating layer 1324 function as gate insulating layers.

It is preferable that the insulating layer 1322 have a function of inhibiting diffusion of hydrogen (e.g., at least one of a hydrogen atom, a hydrogen molecule, and the like). In addition, it is preferable that the insulating layer 1322 have a function of inhibiting diffusion of oxygen (e.g., at least one of an oxygen atom, an oxygen molecule, and the like). For example, the insulating layer 1322 preferably has a function of inhibiting diffusion of one or both of hydrogen and oxygen than the insulating layer 1324.

It is preferable to use an insulator containing an oxide of one or both of aluminum and hafnium, which is an insulating material, as a material of the insulating layer 1322. In particular, it is preferable that aluminum oxide, hafnium oxide, an oxide containing aluminum and hafnium (hafnium aluminate), or the like be used for the insulator. In the case where the insulating layer 1322 is formed using such a material, the insulating layer 1322 functions as a layer that inhibits release of oxygen from the oxide layer 1330 to the substrate side and diffusion of impurities such as hydrogen from the periphery of the transistor 1300 into the oxide layer 1330. Thus, providing the insulating layer 322 can inhibit diffusion of impurities such as hydrogen into the transistor 1300 and inhibit generation of oxygen vacancies in the oxide layer 1330. Furthermore, the conductive layer 1305 can be inhibited from reacting with oxygen contained in the insulating layer 1324 and the oxide layer 1330.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A layer in which a silicon oxide film, a silicon oxynitride film, or a silicon nitride film is stacked over an insulating film containing any of these insulators may be used for the insulating layer 322.

For example, the insulating layer 1322 may be formed to have a single-layer structure or a stacked-layer structure using an insulating material containing aluminum oxide, hafnium oxide, tantalum oxide, zirconium oxide, lead zirconate titanate (PLT), strontium titanate ($SrTiO_3$), (Ba,Sr)$TiO_3$ (BST), or the like. As miniaturization and high integration of transistors progress, a problem such as generation of leakage current may arise because of a thinner gate insulating layer. When a high-k material is used for an insulating layer functioning as the gate insulating layer, a gate potential during operation of the transistor can be reduced while the physical thickness is maintained.

Here, it is preferable that oxygen be released from the insulating layer 1324 in contact with the oxide layer 1330 by heating. A silicon oxide film, a silicon oxynitride film, or the like is used as appropriate for the insulating layer 1324, for example. When an insulating layer containing oxygen is provided in contact with the oxide layer 1330, oxygen vacancies in the oxide layer 330 can be reduced and the reliability of the transistor 1300 can be improved.

As the insulating layer 1324, specifically, an oxide material from which part of oxygen is released by heating is preferably used. An oxide layer that releases oxygen by heating is an oxide layer in which the amount of released oxygen converted into oxygen molecules is greater than or equal to $1.0\times10^{18}$ molecules/cm$^3$, preferably greater than or equal to $1.0\times10^{19}$ molecules/cm$^3$, further preferably greater than or equal to $2.0\times10^{19}$ molecules/cm$^3$ or greater than or equal to $3.0\times10^{20}$ molecules/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 400° C.

The insulating layer 1324 preferably has a low hydrogen concentration and includes an excess-oxygen region or excess oxygen, and may be formed using a material similar to that for the insulating layer 1316, for example.

Note that the insulating layer 1322 and the insulating layer 1324 may each have a stacked-layer structure of two or more layers. In that case, without limitation to a stacked-layer structure formed of the same material, a stacked-layer structure formed of different materials may be employed.

Note that the oxide layer 1330 preferably has a stacked-layer structure using oxides with different chemical compositions. Specifically, the atomic ratio of the element M to metal elements of main components in the metal oxide used as the oxide layer 1330a is preferably greater than the atomic ratio of the element M to metal elements of main components in the metal oxide used as the oxide layer 1330b. Moreover, the atomic ratio of the element M to In in the metal oxide used as the oxide layer 1330a is preferably greater than the atomic ratio of the element M to In in the metal oxide used as the oxide layer 1330b. Furthermore, the atomic ratio of In to the element M in the metal oxide used as the oxide layer 1330b is preferably greater than the atomic ratio of In to the element M in the metal oxide used as the oxide layer 1330a. A metal oxide that can be used as the oxide layer 1330a or the oxide layer 1330b can be used as the oxide layer 1330c.

The oxide layer 1330b and the oxide layer 1330c preferably have crystallinity. For example, a CAAC-OS (c-axis aligned crystalline oxide semiconductor) is preferably used. An oxide having crystallinity, such as a CAAC-OS, has a dense structure with small amounts of impurities and defects (oxygen vacancies or the like) and high crystallinity. This can inhibit oxygen extraction from the oxide layer 330b by the source electrode or the drain electrode. This can reduce oxygen extraction from the oxide layer 330b even when heat treatment is performed; hence, the transistor 1300 is stable with respect to high temperatures in the manufacturing process (what is called thermal budget).

A CAAC-OS is preferably used as the oxide layer 1330c; i.e., the c-axis of a crystal included in the oxide layer 1330c preferably faces in a direction substantially perpendicular to the formation surface or the top surface of the oxide layer 1330c. The CAAC-OS has a property such that oxygen is likely to be moved in a direction perpendicular to the c-axis. Accordingly, oxygen contained in the oxide layer 1330c can be efficiently supplied to the oxide layer 1330b.

The energy level of the conduction band minimum of each of the oxide layer 1330a and the oxide layer 1330c is preferably higher than the energy level of the conduction band minimum of the oxide layer 1330b. In other words, the electron affinity of each of the oxide layer 1330a and the oxide layer 1330c is preferably smaller than the electron affinity of the oxide layer 1330b. In that case, a metal oxide that can be used as the oxide layer 1330a is preferably used as the oxide layer 1330c. At this time, the oxide layer 1330b serves as a main carrier path.

Here, the energy level of the conduction band minimum is gradually varied at junction portions of the oxide layer 1330a, the oxide layer 1330b, and the oxide layer 1330c. In other words, the energy level of the conduction band minimum at the junction portions of the oxide layer 1330a, the oxide layer 1330b, and the oxide layer 1330c is continuously varied or continuously connected. To vary the energy level gradually, the density of defect states in a mixed layer formed at the interface between the oxide layer 1330a and the oxide layer 1330b and the interface between the oxide layer 1330b and the oxide layer 1330c is decreased.

Specifically, when the oxide layer 1330a and the oxide layer 1330b or the oxide layer 1330b and the oxide layer 1330c contain the same element as a main component in addition to oxygen, a mixed layer with a low density of defect states can be formed. For example, an In—Ga—Zn oxide, a Ga—Zn oxide, gallium oxide, or the like may be used for the oxide layer 1330a and the oxide layer 1330c in the case where the oxide layer 1330b is an In—Ga—Zn oxide.

Specifically, as the oxide layer 1330a, a metal oxide with In:Ga:Zn=1:3:4 [atomic ratio] or 1:1:0.5 [atomic ratio] is used. As the oxide layer 1330b, a metal oxide with In:Ga:Zn=1:1:1 [atomic ratio] or In:Ga:Zn=4:2:3 [atomic ratio] is used. As the oxide layer 1330c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used.

When the metal oxide is deposited by a sputtering method, the atomic ratio is not limited to the atomic ratio of the deposited metal oxide and may be the atomic ratio of a sputtering target used for depositing the metal oxide.

When the oxide layer 1330a and the oxide layer 1330c have the above structure, the density of defect states at the interface between the oxide layer 1330a and the oxide layer 1330b and the interface between the oxide layer 1330b and the oxide layer 1330c can be made low. This reduces the influence of interface scattering on carrier conduction, and the transistor 1300 can have a high on-state current and high frequency characteristics.

The oxide layer 1330c may have a stacked-layer structure of two or more layers. For example, the oxide layer 1330c may include a first oxide layer and a second oxide over the first oxide layer.

The first oxide layer of the oxide layer 1330c preferably contains at least one of the metal elements contained in the metal oxide used as the oxide layer 1330b, and further preferably contains all of these metal elements. For example, it is preferable that an In—Ga—Zn oxide film be used as the first oxide layer of the oxide layer 1330c, and an In—Ga—Zn oxide film, a Ga—Zn oxide film, or a gallium oxide film be used as the second oxide layer of the oxide layer 1330c. Accordingly, the density of defect states at the interface between the oxide layer 1330b and the first oxide layer of the oxide layer 1330c can be decreased. The second oxide layer of the oxide layer 1330c preferably inhibits diffusion or transmission of oxygen more than the first oxide layer of the oxide layer 1330c. When the second oxide layer of the oxide layer 1330c is provided between the insulating layer 1350 and the first oxide layer of the oxide layer 1330c, diffusion of oxygen contained in the insulating layer 1380 into the insulating layer 1350 can be inhibited. Therefore, the oxygen is more likely to be supplied to the oxide layer 1330b through the first oxide layer of the oxide layer 1330c.

The energy level of the conduction band minimum of each of the oxide layer 1330a and the second oxide layer of the oxide layer 1330c is preferably higher than the energy level of the conduction band minimum of each of the oxide layer 1330b and the first oxide layer of the oxide layer 1330c. In other words, the electron affinity of each of the oxide layer 1330a and the second oxide layer of the oxide layer 1330c is preferably smaller than the electron affinity of each of the oxide layer 1330b and the first oxide layer of the oxide layer 1330c. In that case, it is preferable that a metal oxide that can be used as the oxide layer 1330a be used as the second oxide layer of the oxide layer 1330c, and a metal oxide that can be used as the oxide layer 1330b be used as the first oxide layer of the oxide layer 1330c. At this time, not only the oxide layer 1330b but also the first oxide layer of the oxide layer 1330c serves as a main carrier path in some cases.

For the conductive layer 1342, TaNxOy described above is preferably used. Note that Ta:NxOy may contain aluminum. As another example, titanium nitride, nitride containing titanium and aluminum, ruthenium oxide, ruthenium nitride, oxide containing strontium and ruthenium, or oxide containing lanthanum and nickel may be used. These materials are preferable because they are conductive materials that are not easily oxidized or materials that maintain the conductivity even when absorbing oxygen.

As illustrated in FIG. 28B, the insulating layer 1354 is preferably in contact with a top surface and a side surface of the conductive layer 1342a, a top surface and a side surface of the conductive layer 1342b, side surfaces of the oxide layer 1330a and the oxide layer 1330b, and part of a top surface of the insulating layer 1324. With such a structure, the insulating layer 1380 is isolated from the insulating layer 1324, the oxide layer 1330a, and the oxide layer 1330b by the insulating layer 1354.

Like the insulating layer 1322, the insulating layer 1354 preferably has a function of inhibiting diffusion of one or both of hydrogen and oxygen. For example, the insulating layer 1354 preferably has a function of inhibiting diffusion of one or both of hydrogen and oxygen than the insulating layer 1324 and the insulating layer 1380. Thus, diffusion of hydrogen contained in the insulating layer 1380 into the oxide layer 1330a and the oxide layer 1330b can be inhibited. Furthermore, by surrounding the insulating layer 1324, the oxide layer 1330, and the like with the insulating layer 1322 and the insulating layer 1354, diffusion of impurities such as water and hydrogen from the outside into the insulating layer 1324 and the oxide layer 1330 can be inhibited. Thus, the transistor 1300 can have favorable electrical characteristics and reliability.

An insulating film containing an oxide of one or both of aluminum and hafnium is preferably deposited as the insulating layer 1354, for example. In this case, the insulating layer 1354 is preferably deposited using an atomic layer deposition (ALD) method. An ALD method is a deposition method that provides good coverage, and thus can prevent formation of disconnection or the like due to unevenness of the insulating layer 1354.

In particular, an insulating film containing aluminum nitride is preferably used as the insulating layer 1354, for example. In that case, a film having an excellent insulating property and high thermal conductivity can be obtained, and thus dissipation of heat generated in driving the transistor 1300 can be increased. Alternatively, silicon nitride, silicon nitride oxide, or the like can be used.

Alternatively, an oxide containing gallium may be used as the insulating layer 1354, for example. An oxide containing gallium is preferable because it sometimes has a function of inhibiting diffusion of one or both of hydrogen and oxygen. Note that gallium oxide, gallium zinc oxide, indium gallium zinc oxide, or the like can be used as an oxide containing gallium. Note that when an indium gallium zinc oxide film is used as the insulating layer 1354, the atomic ratio of gallium to indium is preferably large. When the atomic ratio is increased, the insulating property of the oxide film can be high.

The insulating layer 1350 functions as a gate insulating layer. The insulating layer 1350 is preferably placed in contact with a top surface of the oxide layer 1330c. As a material of the insulating layer 1350, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Like the insulating layer 1324, the insulating layer 1350 is preferably formed using an insulating film from which oxygen is released by heating. When an insulating film from which oxygen is released by heating is provided as the insulating layer 1350 in contact with the top surface of the oxide layer 1330c, oxygen can be efficiently supplied to the channel formation region of the oxide layer 1330b and oxygen defects in the channel formation region of the oxide layer 1330b can be reduced. Accordingly, a transistor that has stable electrical characteristics with a small variation in electrical characteristics and improved reliability can be provided. Furthermore, as in the insulating layer 324, the concentration of impurities such as water and hydrogen in the insulating layer 1350 is preferably reduced. The thickness of the insulating layer 1350 is preferably greater than or equal to 1 nm and less than or equal to 20 nm.

The conductive layer 1360 preferably includes the conductive layer 1360a and the conductive layer 1360b positioned over the conductive layer 1360a. For example, the conductive layer 1360a is preferably positioned so as to cover a bottom surface and a side surface of the conductive layer 1360b.

Here, for the conductive layer 1360a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

When the conductive layer 1360a has a function of inhibiting diffusion of oxygen, it is possible to inhibit a reduction in conductivity of the conductive layer 1360b due to oxidation of the conductive layer 1360b caused by oxygen in the insulating layer 1350. As a conductive material having a function of inhibiting diffusion of oxygen, for example, tantalum, tantalum nitride, ruthenium, or ruthenium oxide is preferably used.

The conductive layer 1360 also functions as a wiring and thus a conductive material having high conductivity is preferably used. For example, for the conductive layer 1360b, a conductive material containing tungsten, copper, or aluminum as its main component can be used. The conductive layer 1360b may have a stacked-layer structure, for example, a stacked-layer structure of a film containing any of the above conductive materials and a titanium film or a titanium nitride film.

Although the conductive layer 1360 has a two-layer structure of the conductive layer 1360a and the conductive layer 1360b in FIG. 28, the conductive layer 1360 may have a single-layer structure or a stacked-layer structure of three or more layers.

In the transistor 1300, the conductive layer 1360 is formed in a self-aligned manner so as to fill the opening formed in the insulating layer 1380 and the like. Forming the conductive layer 1360 in this manner allows the conductive layer 1360 to be surely positioned in a region between the conductive layer 1342a and the conductive layer 1342b without alignment.

As illustrated in FIG. 28B, a top surface of the conductive layer 1360 is substantially aligned with a top surface of the insulating layer 1350 and the top surface of the oxide layer 1330c.

As illustrated in FIG. 28C, in the channel width direction of the transistor 1300, with reference to a bottom surface of the insulating layer 1322, the level of the bottom surface of the conductive layer 1360 in a region where the conductive layer 1360 and the oxide layer 1330b do not overlap with each other is preferably lower than the level of the bottom surface of the oxide layer 1330b. When the conductive layer 1360 functioning as a gate electrode covers the side and top surfaces of the channel formation region of the oxide layer 1330b with the insulating layer 1350 and the like therebetween, the electric field of the conductive layer 1360 is likely to affect the entire channel formation region of the oxide layer 1330b. Consequently, the on-state current of the transistor 1300 can be increased and the frequency characteristics can be improved.

The insulating layer 1380 is provided over the insulating layer 1324, the oxide layer 1330, and the conductive layer 1342 with the insulating layer 1354 therebetween. A top surface of the insulating layer 1380 may be planarized.

The insulating layer 1380 functioning as an interlayer film preferably has a low dielectric constant. When a material having a low dielectric constant is used for an interlayer film, parasitic capacitance generated between wirings can be reduced. The insulating layer 1380 is preferably formed using a material similar to that of the insulating layer 1316, for example. Silicon oxide and silicon oxynitride are particularly preferable in terms of high thermal stability. Materials such as silicon oxide, silicon oxynitride, and porous silicon oxide, in each of which a region containing oxygen that is released by heating can be easily formed, are particularly preferable.

The concentration of impurities such as water and hydrogen in the insulating layer 1380 is preferably reduced. Moreover, the insulating layer 1380 preferably has a low hydrogen concentration and includes an excess-oxygen region or excess oxygen, and may be formed using a material similar to that for the insulating layer 1316, for example. Note that the insulating layer 1380 may have a stacked-layer structure of two or more layers.

Like the insulating layer 1314 and the like, the insulating layer 1374 preferably functions as an insulating barrier film that inhibits diffusion of impurities such as water and hydrogen into the insulating layer 1380 from above. In addition, like the insulating layer 1314 and the like, the insulating layer 1314 preferably has a low hydrogen concentration and has a function of inhibiting diffusion of hydrogen.

As illustrated in FIG. 28B, the insulating layer 1374 is preferably in contact with the top surface of each of the conductive layer 1360, the insulating layer 1350, and the oxide layer 1330c. Thus, impurities such as hydrogen contained in the insulating layer 1381 and the like can be inhibited from entering the insulating layer 1350. Accordingly, adverse effects on the electric characteristics of the transistor and the reliability of the transistor can be inhibited.

The insulating layer 1381 functioning as an interlayer film is preferably provided over the insulating layer 1374. Like the insulating layer 1316 or the like, the insulating layer 1381 preferably has a low dielectric constant. As in the insulating layer 1324 and the like, the concentration of impurities such as water and hydrogen in the insulating layer 1381 is preferably reduced.

The conductive layer 1340a and the conductive layer 1340b are provided in openings formed in the insulating layer 1381, the insulating layer 1374, the insulating layer 1380, and the insulating layer 1354. The conductive layer 1340a and the conductive layer 1340b are provided to face each other with the conductive layer 1360 therebetween. Note that the level of the top surfaces of the conductive layer 1340a and the conductive layer 1340b may be on the same surface as the top surface of the insulating layer 1381.

The insulating layer 1341a is provided in contact with a sidewall of the opening in the insulating layer 1381, the insulating layer 1374, the insulating layer 1380, and the insulating layer 1354, and the conductive layer 1340a is formed in contact with a side surface of the insulating layer 1341a. The conductive layer 1342a is located on at least part of a bottom portion of the opening, and thus the conductive layer 1340a is in contact with the conductive layer 1342a. Similarly, the insulating layer 1341b is provided in contact with a sidewall of the opening in the insulating layer 1381, the insulating layer 1374, the insulating layer 1380, and the insulating layer 1354, and the conductive layer 1340b is formed in contact with a side surface of the insulating layer 1341b. The conductive layer 1342b is located on at least part of a bottom portion of the opening, and thus the conductive layer 1340b is in contact with the conductive layer 1342b.

For the conductive layer 1340a and the conductive layer 1340b, a conductive material containing tungsten, copper, or aluminum as its main component is preferably used.

The conductive layer 1340a and the conductive layer 1340b may have a stacked-layer structure. Although the conductive layer 1340a and the conductive layer 1340b have a stacked-layer structure of two layers in the transistor 1300, the present invention is not limited thereto. The conductive layer 1340 may have a single-layer structure or a stacked-layer structure of three or more layers, for example.

As the insulating layer 1341a and the insulating layer 1341b, an insulating film that can be used for the insulating layer 1314, the insulating layer 1354, or the like can be used, for example. Since the insulating layer 1341a and the insulating layer 1341b are provided in contact with the insulating layer 1354, impurities such as water and hydrogen contained in the insulating layer 1380 or the like can be inhibited from diffusing into the oxide layer 1330 through the conductive layer 1340a and the conductive layer 1340b. In addition, oxygen contained in the insulating layer 1380 can be prevented from being absorbed by the conductive layer 1340a and the conductive layer 1340b.

In addition, although not illustrated, a conductive layer functioning as a wiring may be provided in contact with the top surface of the conductive layer 1340a and the top surface of the conductive layer 1340b. For the conductive layer functioning as a wiring, a conductive material containing tungsten, copper, or aluminum as its main component is preferably used. Furthermore, the conductive layer may have a stacked-layer structure; for example, a stack of a titanium film or a titanium nitride film and a film containing the above conductive material. The conductive layer may be formed to be embedded in an opening provided in an insulating layer.

In addition, although not illustrated, an insulating layer having resistivity within the range of $1.0 \times 10^{13}$ Ωcm to $1.0 \times 10^{15}$ Ωcm, preferably within the range of $5.0 \times 10^{13}$ Ω/cm to $5.0 \times 10^{14}$ Ωcm is preferably provided to cover the conductive layer. It is preferable that an insulator having resistivity in the above range be provided over the conductor, in which case the insulator can disperse electric charge accumulated in the transistor 1300 or between wirings of the conductor or the like and can inhibit defects in characteristics and electrostatic breakdown of the transistor and an electronic device including the transistor due to the electric charge, while maintaining the insulating property.

The size of the transistors described in this embodiment can be reduced, which facilitates an increase in the resolution and the application to a relatively small electronic device.

This embodiment can be combined with the other embodiments as appropriate. In this specification, in the case where a plurality of structure examples are shown in one embodiment, the structure examples can be combined as appropriate.

Embodiment 5

Figure 13A:
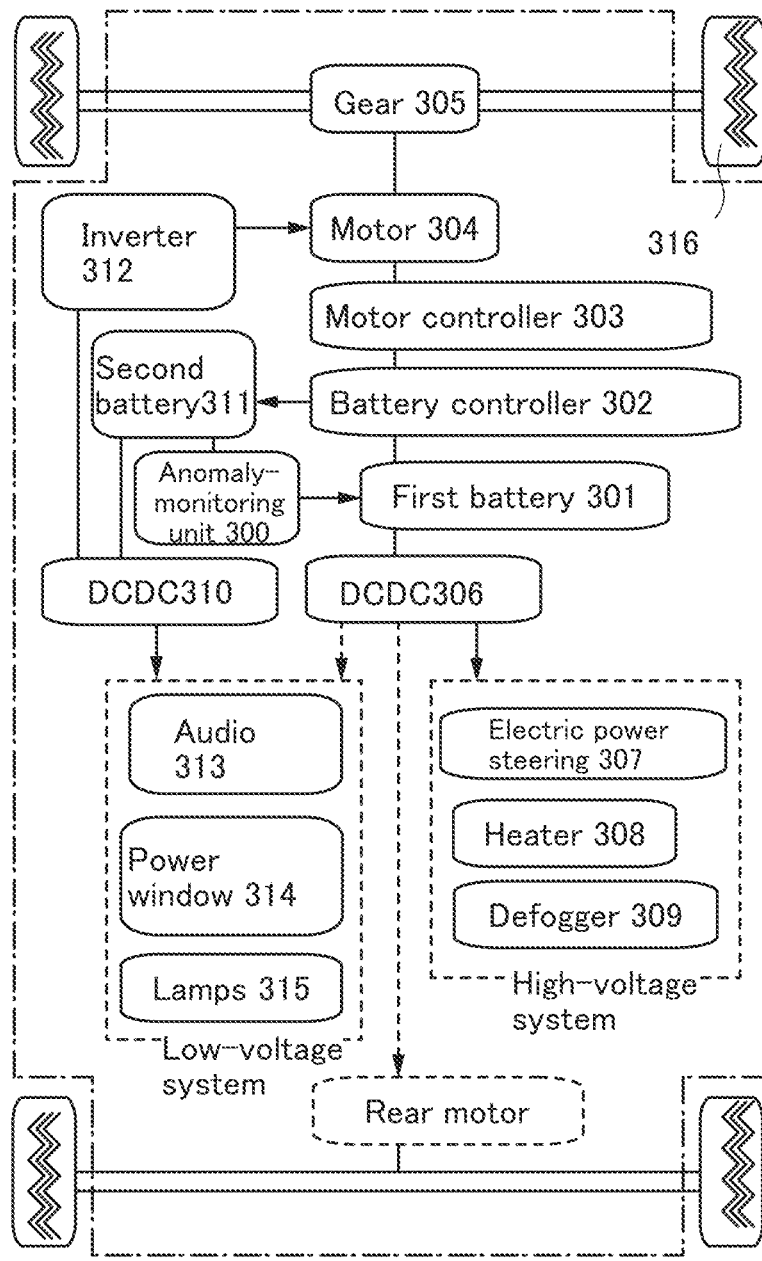
FIG. 13A is a block diagram of an electric vehicle.

In this embodiment, an example in which the present invention is applied to an electric vehicle (EV) is described using FIG. 13.

In the electric vehicle, a first battery 301 as a secondary battery for main driving and a second battery 311 which supplies power to an inverter 312 starting a motor 304 are provided. In this embodiment, an anomaly-monitoring unit 300 driven by power supply from the second battery 311 monitors a plurality of secondary batteries constituting the first battery 301 collectively. The anomaly-monitoring unit 300 senses anomaly and performs charge state estimation. For the anomaly-monitoring unit 300, the sensing device described in Embodiment 1 can be used.

The first battery 301 mainly supplies power to in-vehicle parts for 42 V (for a high-voltage system) and the second battery 311 supplies power to in-vehicle parts for 14 V (for a low-voltage system). Lead batteries are usually used for the second battery 311 due to cost advantage. Lead batteries have disadvantages compared with lithium-ion secondary batteries in that they have a larger amount of self-discharge and are more likely to degrade due to a phenomenon called sulfation. There is an advantage that the second battery 311 can be maintenance-free when it uses a lithium-ion secondary battery; however, in the case of long-term use, for example three years or more, anomaly that cannot be determined at the time of manufacturing might occur. In particular, when the second battery 311 that starts the inverter becomes inoperative, the motor cannot be started even when the first battery 301 has remaining capacity; thus, in order to prevent this, in the case where the second battery 311 is a lead storage battery, the second battery is supplied with power from the first battery to constantly maintain a fully-charged state.

In this embodiment, an example in which a lithium-ion secondary battery is used for both the first battery 301 and the second battery 311 is described. A lead battery or an all-solid-state battery can be used for the second battery 311.

Figure 15A:
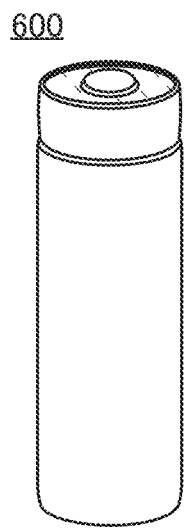
FIG. 15A to FIG. 15C are perspective views illustrating an example of a secondary battery.

An example of a cylindrical secondary battery is described with reference to FIG. 15A and FIG. 15B. A cylindrical secondary battery 600 includes, as illustrated in FIG. 15A, a positive electrode cap (battery lid) 601 on the top surface and a battery can (outer can) 602 on the side and bottom surfaces. The positive electrode cap and the battery can (outer can) 602 are insulated by a gasket (insulating gasket) 610.

Figure 15B:
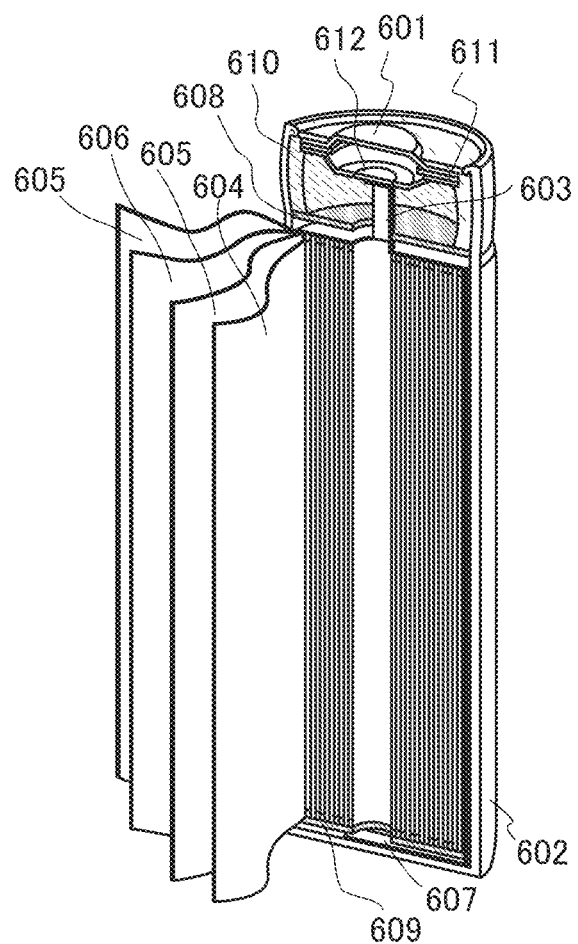

FIG. 15B is a diagram schematically illustrating a cross-section of a cylindrical secondary battery, inside the battery can 602 having a hollow cylindrical shape, a battery element in which a belt-like positive electrode 604 and a belt-like negative electrode 606 are wound with a separator 605 located therebetween is provided. Although not illustrated, the battery element is wound centering around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel or the like) can be used. The battery can 602 is preferably covered with nickel, aluminum, or the like in order to prevent corrosion due to the electrolyte solution. Inside the battery can 602, the battery element in which the positive electrode, the negative electrode, and the separator are wound is sandwiched between a pair of insulating plates 608 and 609 that face each other. Furthermore, a nonaqueous electrolyte solution (not illustrated) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical storage battery are wound, active materials are preferably formed on both sides of the current collectors. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 612 and the bottom of the battery can 602, respectively. The safety valve mechanism 612 is electrically connected to the positive electrode cap 601 through a PTC element (Positive Temperature Coefficient) 611. The safety valve mechanism 612 cuts off electrical connection between the positive electrode cap 601 and the positive electrode 604 when the internal pressure of the battery exceeds a predetermined threshold value. In addition, the PTC element 611 is a thermally sensitive resistor whose resistance increases as temperature rises, and limits the amount of current by increasing the resistance to prevent abnormal heat generation. Barium titanate ($BaTiO_3$)-based semiconductor ceramic or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode (positive electrode) and the cathode (negative electrode) are interchanged in charging and discharging, and the oxidation reaction and the reduction reaction are interchanged; thus, an electrode with a high reaction potential is called the positive electrode and an electrode with a low reaction potential is called the negative electrode. For this reason, in this specification, the positive electrode is referred to as a "positive electrode" or a "+ electrode (plus electrode)" and the negative electrode is referred to as a "negative electrode" or a "− electrode (minus electrode)" in any of the case where charging is performed, the case where discharging is performed, the case where a reverse pulse current is made to flow, and the case where a charge current is made to flow. The use of terms an "anode" and a "cathode" related to oxidation reaction and reduction reaction might cause confusion because the anode and the cathode interchange in charging and in discharging. Thus, the terms the "anode" and the "cathode" are not used in this specification. If the term the "anode" or the "cathode" is used, it should be clearly mentioned that the anode or the cathode is which of the one in charging or in discharging and corresponds to which of the positive electrode (plus electrode) or the negative electrode (minus electrode).

Figure 15C:
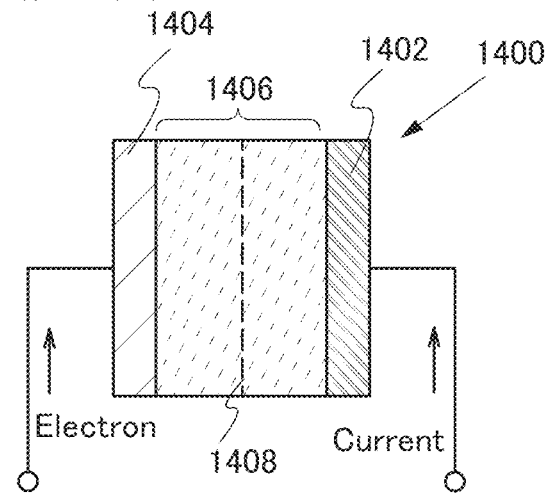

A charger is connected to two terminals shown in FIG. 15C to charge the storage battery 1400. As the charging of the storage battery 1400 proceeds, a potential difference between electrodes increases. The positive direction in FIG. 15C is the direction which a current flows from a terminal outside the storage battery 1400 to a positive electrode 1402; from the positive electrode 1402 to a negative electrode 1404 in the storage battery 1400; and from the negative electrode to a terminal outside the storage battery 1400. In other words, the direction in which a charge current flows is regarded as the direction of a current.

In this embodiment, an example of a lithium-ion secondary battery is shown; however, it is not limited to a lithium-ion secondary battery and a material including an element A, an element X, and oxygen can be used as a positive electrode material for the secondary battery. The element A is preferably one or more selected from the Group 1 elements and the Group 2 elements. As a Group 1 element, for example, an alkali metal such as lithium, sodium, or potassium can be used. As a Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium-cobalt composite oxide ($LiCoO_2$) and lithium iron phosphate ($LiFePO_4$).

The negative electrode includes a negative electrode active material layer and a negative electrode current collector. The negative electrode active material layer may contain a conductive additive and a binder.

For the negative electrode active material, an element that enables charge-discharge reaction by alloying reaction and dealloying reaction with lithium can be used. For example, a material containing at least one of silicon, tin, gallium, aluminum, germanium, lead, antimony, bismuth, silver, zinc, cadmium, indium, and the like can be used. Such elements have higher capacity than carbon. In particular, silicon has a high theoretical capacity of 4200 mAh/g.

In addition, the secondary battery preferably includes a separator. As the separator, for example, a fiber containing cellulose such as paper; nonwoven fabric; a glass fiber; ceramics; a synthetic fiber using nylon (polyamide), vinylon (polyvinyl alcohol-based fiber), polyester, acrylic, polyolefin, or polyurethane; or the like can be used.

Regenerative energy generated by rolling of tires 316 is transmitted to a motor 304 through a gear 305 and a motor controller 303 and a battery controller 302 charges the second battery 311 or the first battery 301.

The first battery 301 is mainly used for driving the motor 304 and supplies power to in-vehicle parts for 42 V (such as an electric power steering 307, a heater 308, and a defogger 309) through a DCDC circuit 306. Even in the case where there is a rear motor for the rear wheels, the first battery 301 is used to drive the rear motor.

The second battery 311 supplies power to in-vehicle parts for 14V (such as an audio 313, a power window 314, and lamps 315) through a DCDC circuit 310.

Figure 13B:
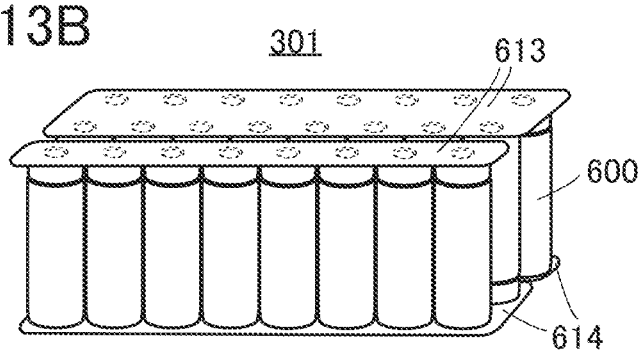
FIG. 13B is a perspective view of a secondary battery.

The first battery 301 includes a plurality of secondary batteries. For example, a cylindrical secondary battery 600 illustrated in FIG. 15A is used. As illustrated in FIG. 13B, the cylindrical secondary battery 600 may be interposed between a conductive plate 613 and a conductive plate 614 to form a module 615. In FIG. 13B, switches are not illustrated between the secondary batteries. A plurality of secondary batteries 600 may be connected in parallel, connected in series, or connected in series after connecting in parallel. By forming the module 615 including the plurality of secondary batteries 600, large power can be extracted.

In order to cut off electric power from the plurality of secondary batteries, the secondary batteries in the vehicle include a service plug or a circuit breaker which can cut off a high voltage without the use of equipment; these are provided in the first battery 301. For example, if 48 battery modules which each have two to ten cells are connected directly, a service plug or a circuit breaker is placed between the 24th module and the 25th module.

Figure 14A:
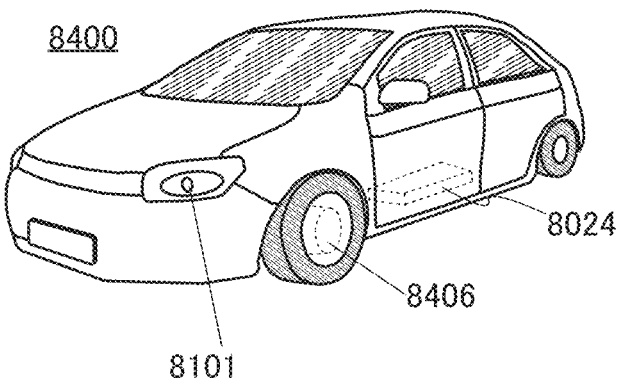
FIG. 14A to FIG. 14C are diagrams illustrating examples of a vehicle.

FIG. 14 illustrates examples of a vehicle using the charge state estimation device of a secondary battery of one embodiment of the present invention. A secondary battery 8024 of an automobile 8400 illustrated in FIG. 14A not only drives an electric motor 8406 but also can supply power to a light-emitting device such as a headlight 8401 or a room light (not illustrated). For the secondary battery 8024 in the automobile 8400, the cylindrical secondary batteries 600 illustrated in FIG. 13B that are interposed between the conductive plate 613 and the conductive plate 614 to form the module 615 can be used.

Figure 14B:
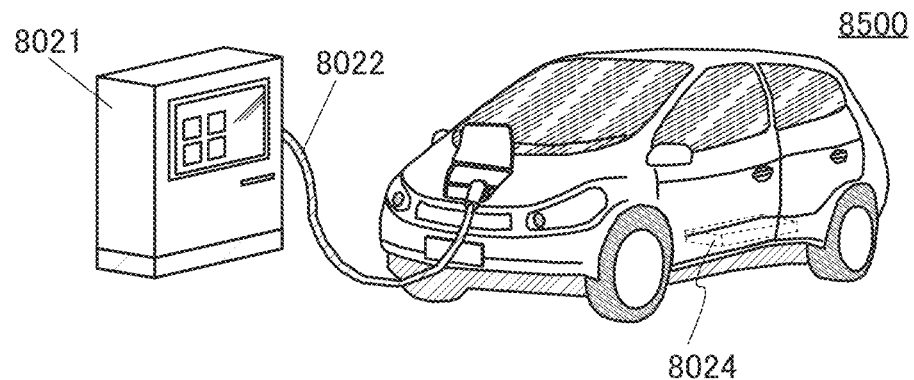

An automobile 8500 illustrated in FIG. 14B can be charged when a secondary battery included in the automobile 8500 is supplied with power through external charging equipment by a plug-in system, a contactless power feeding system, or the like. FIG. 14B illustrates a state where the secondary battery 8024 incorporated in the automobile 8500 is charged from a ground installation type charging device 8021 through a cable 8022. Charging may be performed as appropriate by a given method such as CHAdeMO (registered trademark) or Combined Charging System as a charging method, the standard of a connector, or the like. The charging device 8021 may be a charging station provided in a commerce facility or a power source in a house. For example, with a plug-in technique, the secondary battery 8024 incorporated in the automobile 8500 can be charged by power supply from the outside. Charging can be performed by converting AC power into DC power through a converter such as an ACDC converter.

Furthermore, although not illustrated, a power receiving device can be incorporated in the vehicle, and the vehicle can be charged by being supplied with power from an above-ground power transmitting device in a contactless manner. In the case of this contactless power feeding system, by incorporating a power transmitting device in a road or an exterior wall, charging can also be performed while the vehicle is driven without limitation on the period while the vehicle is stopped. In addition, this contactless power feeding system may be utilized to transmit and receive power between vehicles. Furthermore, a solar cell may be provided in the exterior of the vehicle to charge the secondary battery while the vehicle is stopped or while the vehicle is driven. For supply of power in such a contactless manner, an electromagnetic induction method or a magnetic resonance method can be used.

Figure 14C:
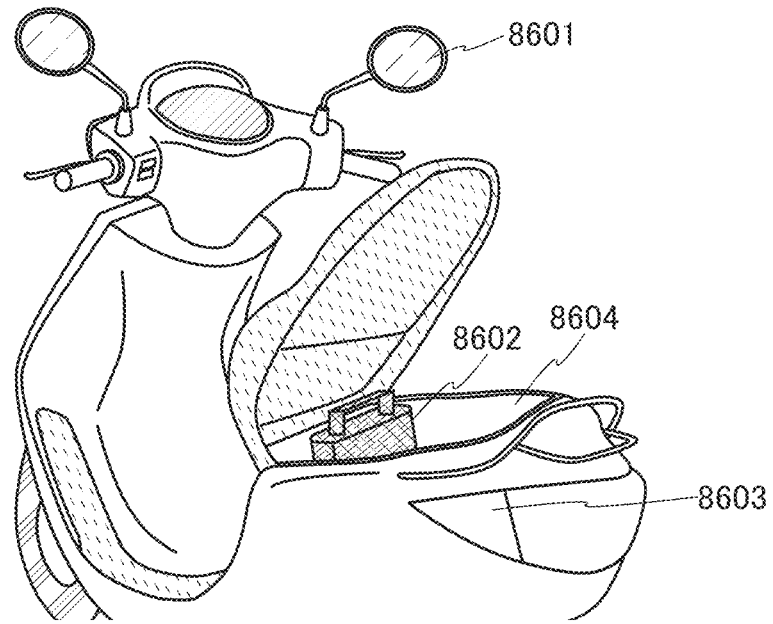

In addition, FIG. 14C is an example of a motorcycle using the secondary battery of one embodiment of the present invention. A scooter 8600 illustrated in FIG. 14C includes a secondary battery 8602, side mirrors 8601, and direction indicators 8603. The secondary battery 8602 can supply electricity to the direction indicators 8603.

In the scooter 8600 illustrated in FIG. 14C, the secondary battery 8602 can be stored in an under-seat storage 8604. The secondary battery 8602 can be stored in the under-seat storage 8604 even when the under-seat storage 8604 is small.

This embodiment can be combined with the description of the other embodiments as appropriate.

Embodiment 6

Examples of an electronic device including a secondary battery that can use the sensing device of one embodiment of the present invention include display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (e.g., car audio players and digital audio players), copiers, facsimiles, printers, multifunction printers, automated teller machines (ATM), and vending machines. FIG. 16 illustrates specific examples of such electronic devices. Note that in the electronic device, the sensing device that can manage the remaining battery amount of the secondary battery as appropriate and is described in Embodiment 1 can be used.

Figure 16A:
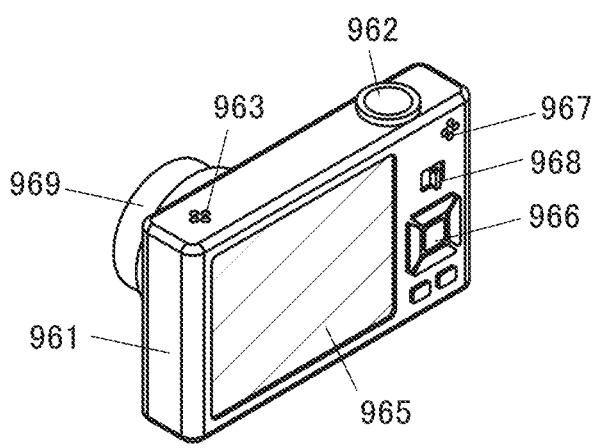
FIG. 16A to FIG. 16F are diagrams illustrating electronic devices.

FIG. 16A is a digital camera, which includes a housing 961, a shutter button 962, a microphone 963, a speaker 967, a display portion 965, operation keys 966, a zoom lever 968, a lens 969, and the like. The digital camera includes a secondary battery, and operating time can be made long by appropriate management of the remaining battery amount of the secondary battery.

Figure 16B:
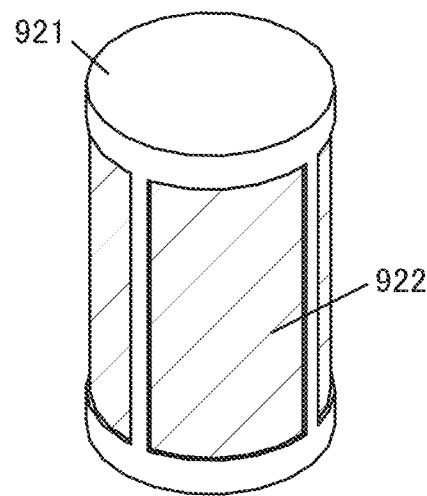

FIG. 16B is digital signage, which has large display portions 922 attached on a side surface of a pillar 921. The digital signage includes a secondary battery, and operating time can be made long by appropriate management of the remaining battery amount of the secondary battery.

Figure 16C:
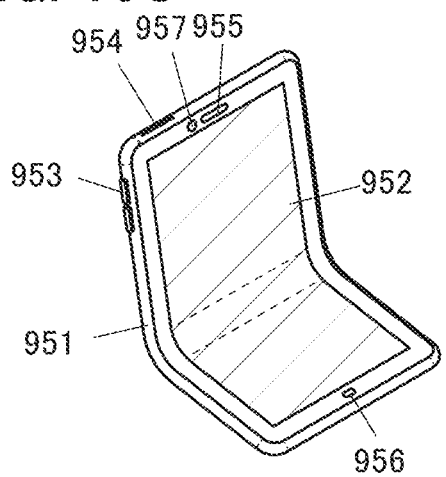

FIG. 16C is an example of a mobile phone, which includes a housing 951, a display portion 952, an operation button 953, an external connection port 954, a speaker 955, a microphone 956, a camera 957, and the like. The display portion 952 of the mobile phone includes a touch sensor. Operations such as making a call and inputting text can be performed by touch on the display portion 952 with a finger, a stylus, or the like. The housing 901 and the display portion 952 have flexibility and can be used in a bent state as illustrated in the drawing. The mobile phone includes a secondary battery, and operating time can be made long by appropriate management of the remaining battery amount of the secondary battery.

Figure 16D:
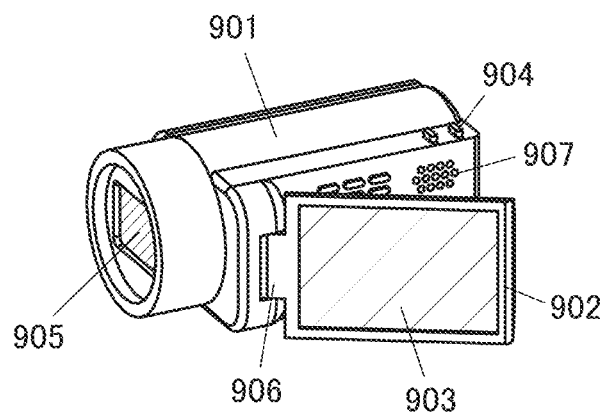

FIG. 16D is a video camera, which includes a first housing 901, a second housing 902, a display portion 903, an operation key 904, a lens 905, a connection portion 906, a speaker 907, and the like. The operation key 904 and the lens 905 are provided on the first housing 901, and the display portion 903 is provided on the second housing 902. The video camera includes a secondary battery, and operating time can be made long by appropriate management of the remaining battery amount of the secondary battery.

Figure 16E:
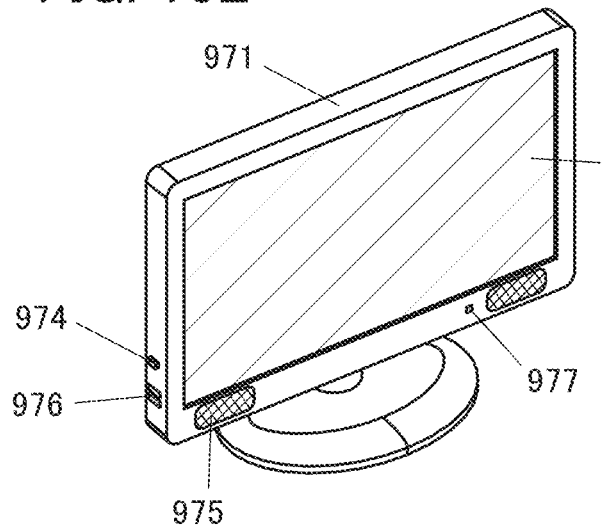

FIG. 16E is a television, which includes a housing 971, a display portion 973, an operation key 974, speakers 975, a communication connection terminal 976, an optical sensor 977, and the like. The display portion 973 includes a touch sensor that enables input operation. The television device includes a secondary battery, and operating time can be made long by appropriate management of the remaining battery amount of the secondary battery.

Figure 16F:
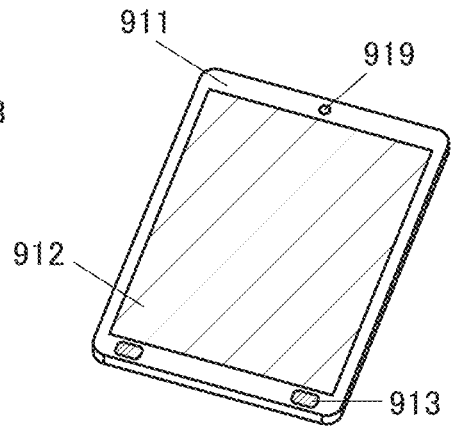

FIG. 16F is a portable data terminal, which includes a housing 911, a display portion 912, speakers 913, a camera 919, and the like. A touch panel function of the display portion 912 enables input and output of information. Note that the portable data terminal may have a telephone function and can execute a variety of application programs. The portable data terminal includes a secondary battery, and operating time can be made long by appropriate management of the remaining battery amount of the secondary battery.

FIG. 17A1 illustrates an example in which a plurality of sensor modules and the like are worn on a body. The sensor module includes at least one sensor of an infrared sensor, a near-infrared sensor, a temperature sensor, an acceleration sensor, and the like, and includes a secondary battery, a detection device, a communication module, and the like. The sensor module has a function of sampling an induction waveform used in an electrocardiogram or the like, a function of detecting body temperature, a function of detecting a pulse, a function of detecting a blood sugar level or the like, a function of detecting the amount of movement of arms and legs, and the like.

An example in which sensor modules LA, RA, LL, and RL are worn on arms and legs is described. When the plurality of sensor modules are used, an electrocardiogram shown in FIG. 17B1 on whether or not anomaly such as an irregular heartbeat of a heart occurs can be obtained. For example, the sensor module LA is worn on a left arm, the sensor module RA is worn on a right arm, the sensor module LL is worn on a left foot, and the sensor module RL is worn on a right foot. Note that the arm includes an upper arm, a wrist, a palm, a finger, and the like. The foot includes a thigh, a calf, a shin, an ankle, an instep, a sole of foot, a toe, and the like.

It is known that a first induction waveform (Waveform 1), a second induction waveform (Waveform 2), and a third induction waveform (Waveform 3) in the electrocardiogram are compared for judgement. That is, the sensor module LA obtains the amount of change with the RA used as a reference, as Waveform 1. The sensor module LL obtains the amount of change with the RA used as a reference, as Waveform 2. The sensor module LL obtains the amount of change with the LA used as a reference, as Waveform 3.

Data may be shared among the sensor modules. Alternatively, the data obtained by the sensor modules may be transmitted to a portable data terminal in FIG. 17A2 with or without a wire, and Waveform 1 to Waveform 3 may be detected in the portable data terminal. The portable data terminal can detect whether or not a problem such as an irregular heartbeat occurs from the data obtained from the sensor modules. In the case where the data obtained by the sensor modules are transmitted to the portable data terminal with a wire, it is preferable that data obtained by connection with a wire be collectively transmitted. Note that dates may be automatically given to the detected data, and the data may be stored in the portable data terminal and managed personally. Alternatively, the data may be transmitted to a hospital or the like through a network (Network) (including the Internet). The data can be managed in a data server of a hospital and used as inspection data in treatment. Note that the portable data terminal can have the structure illustrated in FIG. 16F.

In the case where the above sensor modules further include a plurality of microneedles and the like, a value of a current flowing between the microneedles or a resistance can be measured. That is, the sensor module can detect a blood sugar level in blood (FIG. 17B4) and the like by measuring the conductivity between the microneedles. Note that a slight change in potential needs to be detected in order to measure the conductivity in blood; thus, the sensing device or the amplifier circuit described in Embodiment 1 can be used.

When the above sensor module includes an acceleration sensor, the amount of exercise (movement) of arms and legs can be detected. By individual management of the amount of exercise of arms and legs, whether or not the balance of the amount of exercise of a body is lost can be detected. The sensing device described in Embodiment 1 can be used in order to detect the amount of exercise from the acceleration sensor.

As described above, when the plurality of sensor modules are worn on a body, the portable data terminal can detect in what state an irregular heartbeat or the like occurs in daily life. The use of information such as a body temperature (FIG. 17B2), a pulse (FIG. 17B3), and a blood sugar level in the case where an irregular heartbeat occurs enables correct management of a body or correct diagnosis of a disorder in a hospital.

The above sensor modules may be directly attached to a body with a sticker or the like, may be embedded in a body, or may be an electronic device that can be worn, such as a wristwatch. Note that the sensor module may have all the functions described above or one or more of the functions.

This embodiment can be implemented in combination with any of the structures described in the other embodiments and the like, as appropriate.

Embodiment 7

In this embodiment, a metal oxide that can be favorably used for a channel formation region of a transistor will be described.

As a semiconductor material used for a transistor, a metal oxide whose energy gap is greater than or equal to 2 eV, preferably greater than or equal to 2.5 eV, further preferably greater than or equal to 3 eV can be used. A typical example is a metal oxide containing indium, and a CAC-OS described later or the like can be used, for example.

A transistor with a metal oxide having a larger band gap and a lower carrier density than silicon has low off-state current; therefore, charges accumulated in a capacitor that is series-connected to the transistor can be held for a long time.

A semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where a metal oxide that constitutes the semiconductor layer is an In-M-Zn-based oxide, it is preferable that the atomic ratio of metal elements in a sputtering target used to deposit an In-M-Zn oxide satisfy In≥M and Zn≥M. The atomic ratio of metal elements of such a sputtering target is preferably In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, In:M:Zn=5:1:8, or the like. Note that the atomic ratio in the deposited semiconductor layer varies from the atomic ratio of metal elements in the sputtering targets in a range of ±40%.

A metal oxide film with a low carrier density is used for the semiconductor layer. For example, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such a metal oxide is referred to as a highly purified intrinsic or substantially highly purified intrinsic metal oxide. The oxide semiconductor has a low density of defect states and can be regarded as a metal oxide having stable characteristics.

Note that the composition is not limited to those, and an oxide semiconductor having appropriate composition may be used depending on required semiconductor characteristics and electrical characteristics of the transistor (field-effect mobility, threshold voltage, or the like). In addition, to obtain the required semiconductor characteristics of the transistor, it is preferable that the carrier density, impurity concentration, defect density, atomic ratio between a metal element and oxygen, interatomic distance, density, and the like of the semiconductor layer be set to be appropriate.

When silicon or carbon, which is one of the Group 14 elements, is contained in the metal oxide that constitutes the semiconductor layer, oxygen vacancies in the semiconductor layer are increased, and the semiconductor layer becomes n-type. Thus, the concentration (concentration obtained by secondary ion mass spectrometry) of silicon or carbon in the semiconductor layer is set to lower than or equal to $2\times10^{18}$ atoms/cm$^3$, preferably lower than or equal to $2\times10^{17}$ atoms/cm$^3$.

In addition, alkali metal and alkaline earth metal might generate carriers when bonded to a metal oxide, in which case the off-state current of the transistor might be increased. Thus, the concentration obtained by secondary ion mass spectrometry of alkali metal or alkaline earth metal in the semiconductor layer is set to lower than or equal to $1\times10^{18}$ atoms/cm$^3$, preferably lower than or equal to $2\times10^{16}$ atoms/cm$^3$.

Furthermore, when nitrogen is contained in the metal oxide that constitutes the semiconductor layer, electrons serving as carriers are generated and the carrier density is increased, so that the semiconductor layer easily becomes n-type. As a result, a transistor using a metal oxide that contains nitrogen is likely to have normally-on characteristics. Therefore, the concentration obtained by secondary ion mass spectrometry of nitrogen in the semiconductor layer is preferably set to lower than or equal to $5\times10^{18}$ atoms/cm$^3$.

Oxide semiconductors are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

In addition, a CAC-OS (Cloud-Aligned Composite oxide semiconductor) may be used for a semiconductor layer of a transistor disclosed in one embodiment of the present invention.

Note that the non-single-crystal oxide semiconductor or CAC-OS can be suitably used for a semiconductor layer of a transistor disclosed in one embodiment of the present invention. In addition, as the non-single-crystal oxide semiconductor, the nc-OS or the CAAC-OS can be suitably used.

Note that in one embodiment of the present invention, a CAC-OS is preferably used for a semiconductor layer of a transistor. The use of the CAC-OS allows the transistor to have high electrical characteristics or high reliability.

Note that the semiconductor layer may be a mixed film including two or more kinds of a region of a CAAC-OS, a region of a polycrystalline oxide semiconductor, a region of an nc-OS, a region of an amorphous-like oxide semiconductor, and a region of an amorphous oxide semiconductor. The mixed film has, for example, a single-layer structure or a stacked-layer structure including two or more kinds of the above regions in some cases.

The composition of a CAC (Cloud-Aligned Composite)-OS that can be used in a transistor disclosed in one embodiment of the present invention is described below.

The CAC-OS is, for example, a composition of a material in which elements that constitute a metal oxide are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in a metal oxide is referred to as a mosaic pattern or a patch-like pattern.

Note that the metal oxide preferably contains at least indium. In particular, indium and zinc are preferably contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, a CAC-OS in an In—Ga—Zn oxide (an In—Ga—Zn oxide in the CAC-OS may be particularly referred to as CAC-IGZO) has a composition in which materials are separated into indium oxide (hereinafter referred to as $InO_{X1}$ (X1 is a real number greater than 0)) or indium zinc oxide (hereinafter referred to as $In_{X2}Zn_{Y2}O_{Z2}$ (each of X2, Y2, and Z2 is a real number greater than 0)) and gallium oxide (hereinafter referred to as $GaO_{X3}$ (X3 is a real number greater than 0)), gallium zinc oxide (hereinafter referred to as $Ga_{X4}Zn_{Y4}O_{Z4}$ (each of X4, Y4, and Z4 is a real number greater than 0)), or the like so that a mosaic pattern is formed, and mosaic-like $InO_{X1}$ or $In_{X2}Zn_{Y2}O_{Z2}$ is evenly distributed in the film (this composition is hereinafter also referred to as a cloud-like composition).

That is, the CAC-OS is a composite metal oxide having a composition in which a region where $GaO_{X3}$ is a main component and a region where $In_{X2}Zn_{Y2}O_{Z2}$ or $InO_{X1}$ is a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ (−1≤x0≤1; m0 is a given number).

The crystalline compound has a single crystal structure, a polycrystalline structure, or a CAAC structure. Note that the CAAC structure is a crystal structure in which a plurality of IGZO nanocrystals have c-axis alignment and are connected in an a-b plane without alignment.

Meanwhile, the CAC-OS relates to the material composition of a metal oxide. In the material composition of a CAC-OS containing In, Ga, Zn, and O, some regions that contain Ga as a main component and are observed as nanoparticles and some regions that contain In as a main component and are observed as nanoparticles are each randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film containing in as a main component and a film containing Ga as a main component is not included.

Note that a clear boundary between the region where $GaO_{X3}$ is a main component and the region where $In_{X2}Zn_{Y2}O_{Z2}$ or $InO_{X1}$ is a main component cannot be observed in some cases.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that contain the metal elements) as a main component and are observed as nanoparticles and some regions that contain In as a main component and are observed as nanoparticles are each randomly dispersed in a mosaic pattern.

The CAC-OS can be formed by a sputtering method under a condition where a substrate is not heated, for example. In addition, in the case of forming the CAC-OS by a sputtering method, one or more selected from an inert gas (typically, argon), an oxygen gas, and a nitrogen gas may be used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed at the time of measurement using θ/2θ scan by an Out-of-plane method, which is one of the X-ray diffraction (XRD) measurement methods. That is, it is found from the analysis results of X-ray diffraction that no alignment in an a-b plane direction and a c-axis direction is observed in a measured region.

In addition, in an electron diffraction pattern of the CAC-OS that is obtained by irradiation with an electron beam with a probe diameter of 1 nm (also referred to as a nanobeam electron beam), a ring-like high-luminance region (ring region) and a plurality of bright spots in the ring region are observed. It is therefore found from the electron diffraction pattern that the crystal structure of the CAC-OS includes an nc (nano-crystal) structure with no alignment in a plan-view direction and a cross-sectional direction.

Moreover, for example, it can be confirmed by EDX mapping obtained using energy dispersive X-ray spectroscopy (EDX) that the CAC-OS in the In—Ga—Zn oxide has a composition in which regions where $GaO_{X3}$ is a main component and regions where $In_{X2}Zn_{Y2}O_{Z2}$ or $InO_{X1}$ is a main component are unevenly distributed and mixed.

The CAC-OS has a composition different from that of an IGZO compound in which metal elements are evenly distributed, and has characteristics different from those of the IGZO compound. That is, the CAC-OS has a composition in which regions where $GaO_{X3}$ or the like is a main component and regions where $In_{X2}Zn_{Y2}O_{Z2}$ or $InO_{X1}$ is a main component are phase-separated from each other, and the regions including the respective elements as the main components form a mosaic pattern.

Here, a region where $In_{X2}Zn_{Y2}O_{Z2}$ or $InO_{X1}$ is a main component is a region whose conductivity is higher than that of a region where $GaO_{X3}$ or the like is a main component. In other words, when carriers flow through regions where $In_{X2}Zn_{Y2}O_{Z2}$ or $InO_{X1}$ is a main component, the conductivity of a metal oxide is exhibited. Accordingly, when the regions where $In_{X2}Zn_{Y2}O_{Z2}$ or $InO_{X1}$ is a main component are distributed like a cloud in a metal oxide, high field-effect mobility ($\mu$) can be achieved.

In contrast, a region where $GaO_{X3}$ or the like is a main component is a region whose insulating property is higher than that of a region where $In_{X2}Zn_{Y2}O_{Z2}$ or $InO_{X1}$ is a main component. In other words, when regions where $GaO_{X3}$ or the like is a main component are distributed in a metal oxide, leakage current can be suppressed and favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, so that high on-state current ($I_{on}$) and high field-effect mobility ($\mu$) can be achieved.

In addition, a semiconductor element using the CAC-OS has high reliability. Thus, the CAC-OS is suitable for a variety of semiconductor devices typified by a display.

In addition, since a transistor including the CAC-OS in a semiconductor layer has high field-effect mobility and high drive capability; the use of the transistor in a driver circuit, a typical example of which is a scan line driver circuit that generates a gate signal, can provide a display device with a narrow bezel width (also referred to a narrow bezel). Furthermore, with the use of the transistor in a signal line driver circuit that is included in a display device (particularly in a demultiplexer connected to a terminal of a shift register included in a signal line driver circuit), a display device to which a small number of wirings are connected can be provided.

Furthermore, the transistor including the CAC-OS in the semiconductor layer does not need a laser crystallization step like a transistor including low-temperature polysilicon. Thus, the manufacturing cost of a display device can be reduced even when the display device is formed using a large area substrate. In addition, the transistor including the CAC-OS in the semiconductor layer is preferably used for a driver circuit and a display portion in a large display device having high resolution such as ultra-high definition ("4K resolution", "4K2K", and "4K") or super high definition ("8K resolution", "8K4K", and "8K") because writing can be performed in a short time and display defects can be reduced.

Alternatively, silicon may be used for a semiconductor in which a channel of a transistor is formed. Although amorphous silicon may be used as silicon, silicon having crystallinity is particularly preferably used. For example, microcrystalline silicon, polycrystalline silicon, single crystal silicon, or the like is preferably used. In particular, polycrystalline silicon can be formed at a temperature lower than that for single crystal silicon and has higher field-effect mobility and higher reliability than amorphous silicon.

At least part of this embodiment can be implemented in combination with the other embodiments described in this specification as appropriate.

EXAMPLE 1

In this example, a CAAC-OS was foiled using a technology of a 360 nm Top-gate self-aligned CAAC-IGZO FET stacked on a Si wafer. The top-gate self-aligned structure eliminated overlap between a top gate and a source or drain and reduced parasitic capacitance due to the overlap. This smaller parasitic capacitance can reduce charge injection and feedthrough and increase the sampling accuracy of a sample-and-hold circuit. As a control method of a gate of the CAAC-IGZO, a Dual-gate type or a Back-gate type was used, and the gates are fabricated within the same substrate. The dual-gate type has topology where a front gate at the top and a back gate at the bottom are connected. The dual-gate type has better gate controllability than a single-gate type, i.e., higher on-state current and lower off-state current than a single-gate type. Meanwhile, the back-gate type has topology where the front gate and the back gate can be independently controlled. A negative voltage is applied to the back gate of the back-gate type, whereby the threshold voltage can be shifted positively, that is, a low off-state current can be exhibited. The dual-gate transistor was used in a circuit other than a sample-and-hold circuit, such as a comparison circuit to achieve high gain due to its high on-state current. The back-gate transistor was used in the sample-and-hold circuit to achieve long holding time.

Figure 23A:
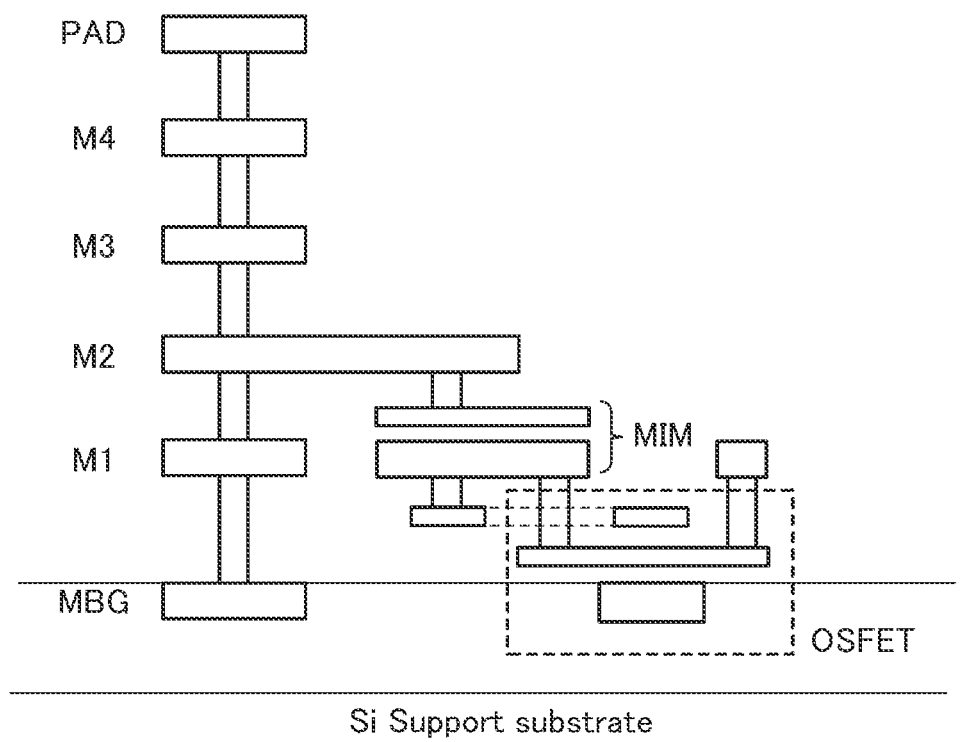
FIG. 23A is a diagram illustrating a cross section of a transistor.
Figure 23B:
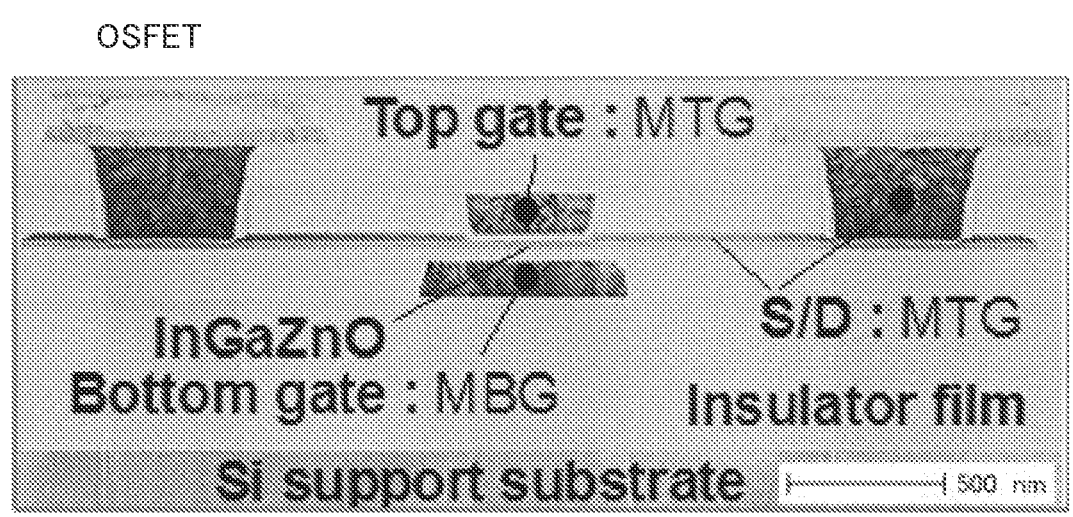
FIG. 23B is a cross-sectional TEM image of a transistor.

FIG. 23A is a diagram illustrating an example of a cross section of a transistor. A Si substrate (Si Support substrate) was used as a substrate. Note that an insulating layer (Insulator film) was formed over the Si substrate, and an OSFET (InGaZnO was used in a semiconductor layer) was formed over the insulating layer. A back gate (MBG) corresponds to an MBG (Bottom Gate) of the OSFET. Conductive layers M1 to M4 were included, and a PAD was formed thereover. Note that the MBG, the wiring layers M1 to M4, and the PAD are connected through a plug. Each of the MBG, the wiring layers M1 to M4, and the PAD was also used as a wiring. Note that one electrode of a capacitor MIM was formed using the wiring M1. A top gate (MTG) was formed between the MBG and the wiring M1. FIG. 23B shows an example of a cross-sectional TEM image.

Figure 24A:
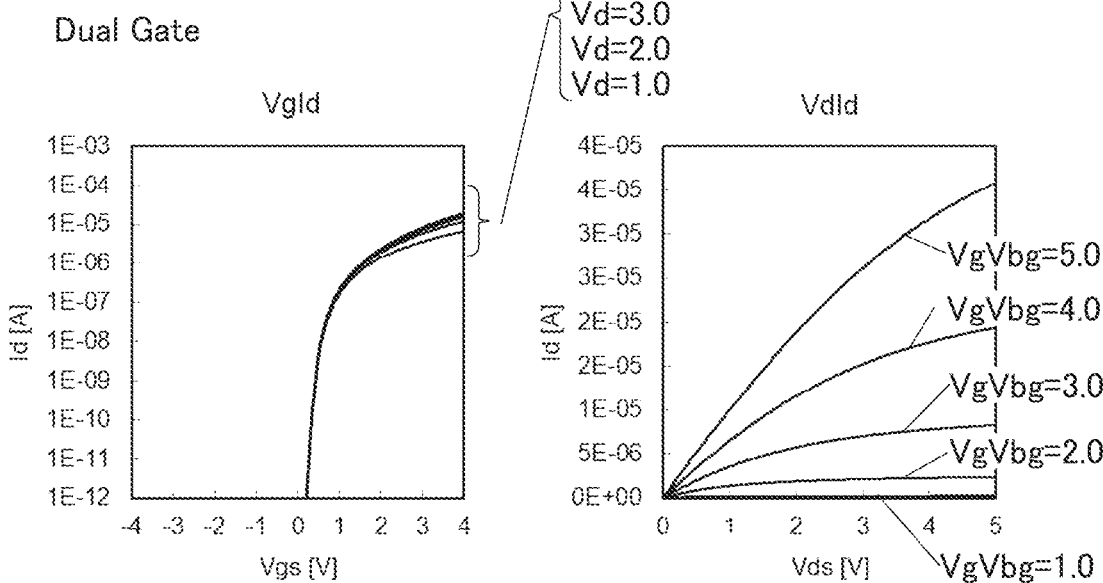
FIG. 24A and FIG. 24B are measurement data of the electric characteristics of a transistor.

Next, measurement results of the fabricated transistor are shown. FIG. 24A shows a VGID curve and a VDID curve obtained by measurement through simultaneous sweep of the front gate at the top and the back gate at the bottom. Stable transistor characteristics are shown.

Figure 24B:
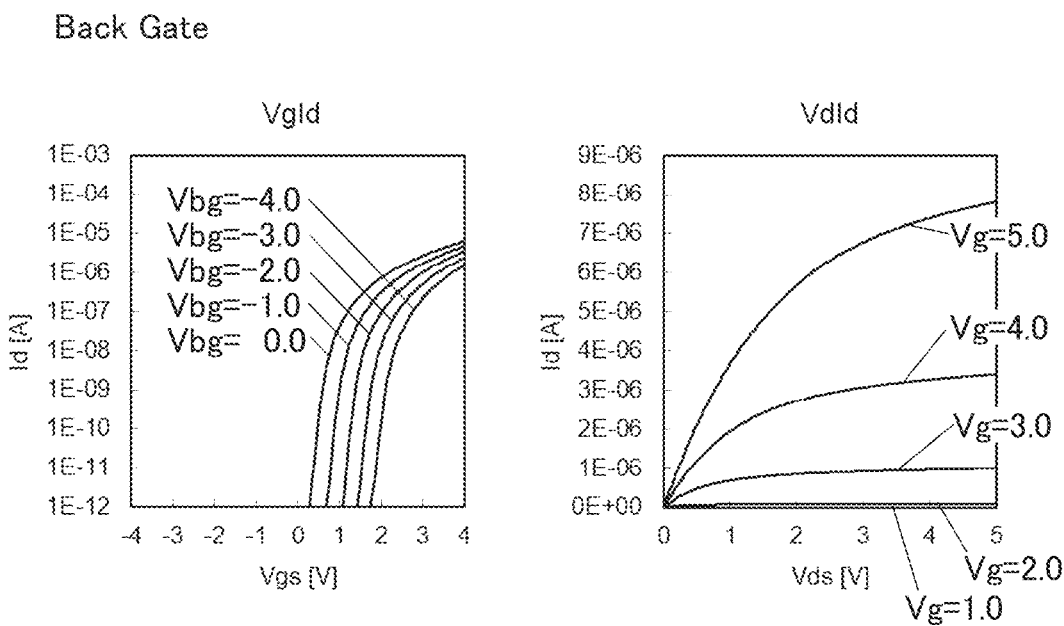

FIG. 24B shows VGID curves obtained by measurement through fixing the back gate at the bottom to 0V, −1 V, −2 V, −3 V, and −4 V and sweep of the front gate at the top and VDID curves. By application of a negative voltage to the back gate at the bottom, the threshold voltage is shifted positively.

Next, measurement results of the comparison accuracy of the sensing device 50 of the micro-short detection circuit described in Embodiment 2 are shown. FIG. 25A shows operation of the comparison circuit. FIG. 25B shows results of input of the amplitude±10 mV of Vin+ (referred to as a determination threshold (threshold) with respect to VIN−=1.5 V. It is found that an output signal Vout is inverted within (Vin+)−(Vin−)=10 mV. FIG. 25C shows distribution (frequency distribution) corresponding to a voltage supplied to the signal Vbat. As shown in FIG. 25C, the operation voltage of the sensing device 50 changes depending on the Vbat; however, it is found that the detection accuracy of 10 mV can be also obtained in a range of the Vbat from 2.5 V to 4.0 V. The gain is 52 dB when the Vbat is 4 V. Thus, occurrence of a failure mode of a voltage drop caused by micro short-circuit (several tens of millivolts) can be sensed. FIG. 25D shows results of this example. The micro-short detection circuit was able to detect a change in detection voltage of 10 mV. The corresponding gain was 52.0 [dB] when Vbat=4.0 V.

Figures 26A, 26B:
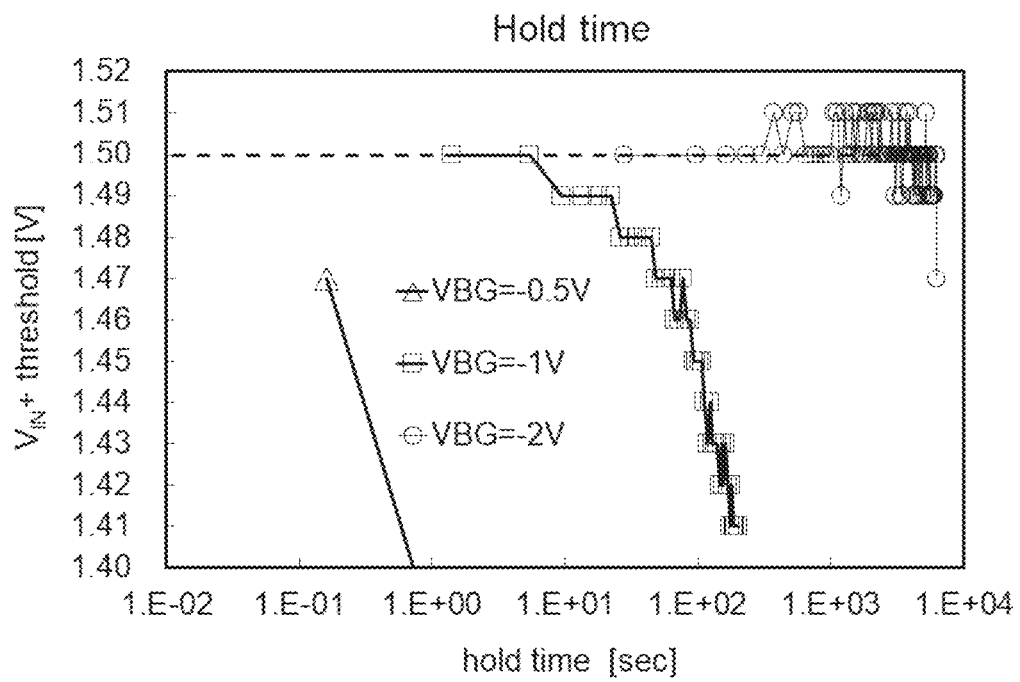
FIG. 26A and FIG. 26B are measurement data of operation of a comparison circuit.

FIG. 26A shows the holding characteristics of the micro-short detection circuit. In the measurement, first, Vin=1.5 V is sampled and held. During the holding, a triangle wave of 10 mV is input to Vin+ for each step and a comparison is made in each step. Note that a horizontal axis represents hold time, and a vertical axis represents Vin+voltage (Vin+ threshold) at which the output signal Vout is inverted. The holding characteristics of the signals Vsh and Vbias that depends on the hold time were indirectly monitored via continuous monitoring of the Vin+voltage at which the output signal Vout is inverted. As a result, holding for more than 1 h at VBG of −2V was confirmed, and the adequate sampling period for micro short-circuit was confirmed. FIG. 26B shows results of measurement of VBG at −0.5 V, −1.0 V, and 0 V. In the case where −2.0 V is applied to VBG, favorable results were obtained.

Figures 27A, 27B:
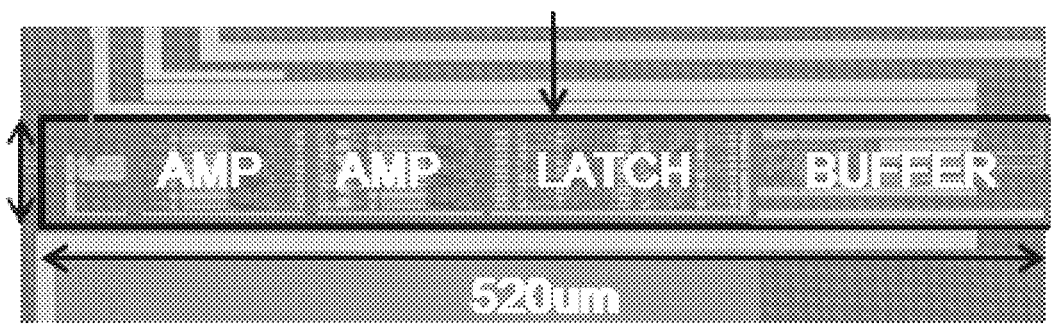
FIG. 27A is a photograph of a chip.
FIG. 27B is a table showing characteristics and comparison of fabricated battery protective circuits

FIG. 27A is a photograph of a chip. Positions of an amplifier circuit (AMP), a latch circuit (LATCH), and a buffer circuit (BUFFER) on the chip are shown.

FIG. 27B shows characteristics of the fabricated battery protective circuit and a comparative table. Results of comparison with the kinds (Oxide (OS) FET, CMOS FET) of the fabricated devices (the technology node (Technology), the potential Vbat as a supplied voltage or an output potential of a battery (Power supply or VBat. [V]), the number of transistors (#Tr.s), the operation frequency (Frequency [Hz]), the power consumption (Power [μW]), and the presence or absence of micro short-circuit detection (Micro-short func.)) are shown. Note that the fabricated protective circuit corresponds to "This work".

EXAMPLE 2

Figure 30A:
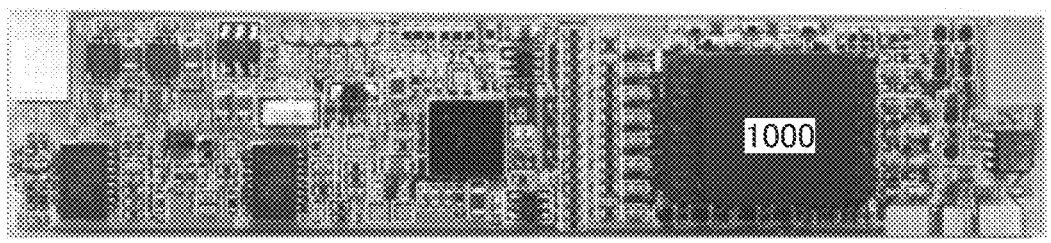
FIG. 30A is a photograph showing a battery control system.
Figure 30B:
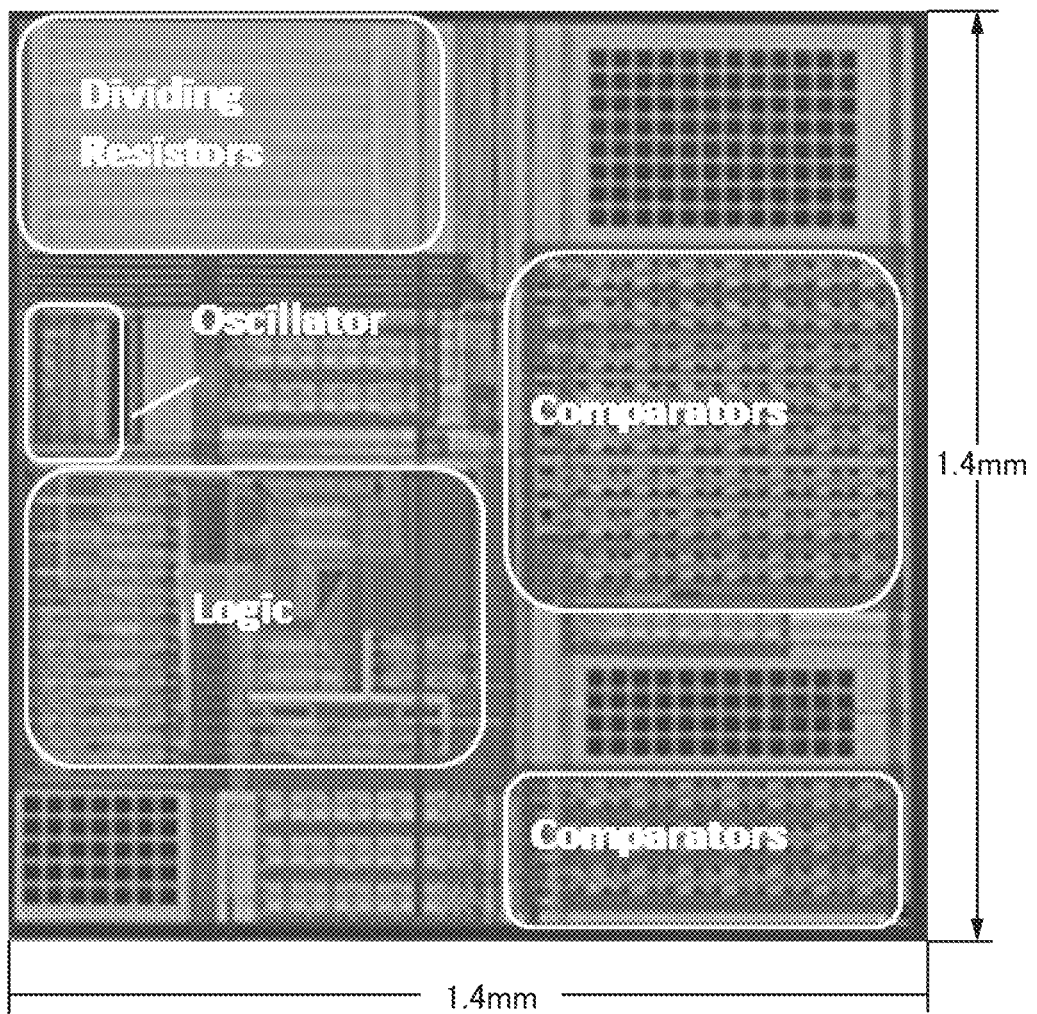
FIG. 30B is a photograph of a chip.

In this example, a battery control system using the comparison circuit described in Example 1 will be described. FIG. 30A shows a photograph of a prototyped battery control system. FIG. 30B shows a photograph of a chip formed using a technology of a 360 nm top-gate self-aligned CAAC-IGZO FET stacked on a Si wafer, which was described in Example 1. A chip 1000 was composed of dividing resistors (Dividing Resistors), an oscillator (Oscillator), a logic portion (Logic), and detection circuits (Comparators). Note that the battery control system includes a plurality of detection circuits. When description is made using the battery control system illustrated in FIG. 18A as an example, an overvoltage detection circuit (Over-charge detector), an overcurrent detection circuit (charging Overcurrent detector), an overdischarge detection circuit (Overdischarge detector), an overheat detection circuit (not illustrated), a delay circuit (Delay circuit), and the like can be given as the detection circuit.

Figure 31A:
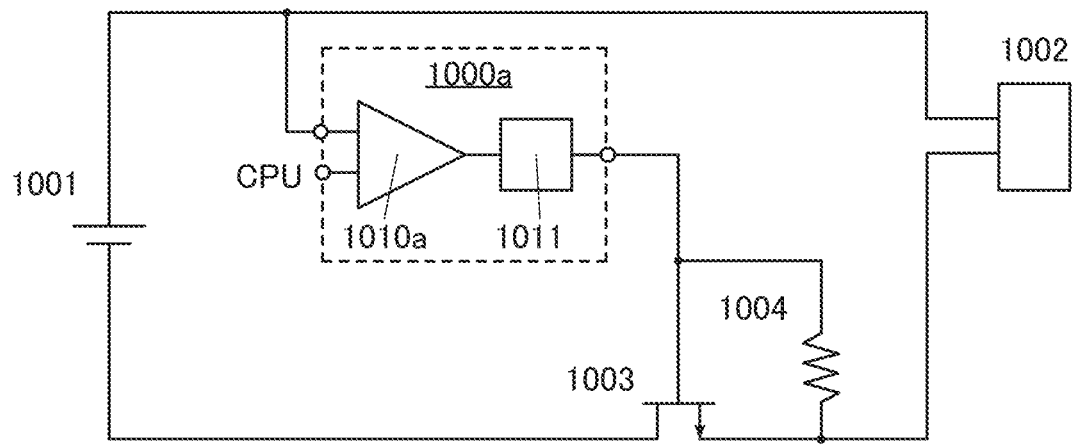
FIG. 31A is a diagram illustrating a test circuit.

FIG. 31A is an overcharge voltage control test circuit for evaluating an overvoltage detection circuit 1000a included in the chip 1000. The overcharge voltage control test circuit includes an overvoltage detection circuit 1000a, a secondary battery 1001, a stabilized power source 1002, a power MOSFET 1003, and a resistor 1004. The overvoltage detection circuit 1000a includes a comparison circuit 1010a and a delay circuit 1011. Although a structure example in which the delay circuit 1011 is shared in the battery control system is described, the detection circuits may include corresponding delay circuits 1010. In the overcharge voltage control test circuit, PWR800L (manufactured by Kikusui electronics corp.) was used as the stabilized power source 1002. Note that in the case where reference numerals and the like are the same, description may be omitted.

Next, electrical connection of the overcharge voltage control test circuit will be described. A first input terminal included in the comparator circuit 1010a was electrically connected to a CPU through a digital/analog conversion circuit (not illustrated). Alternatively, the first input terminal was electrically connected to the digital/analog conversion circuit through a memory circuit (e.g., FIG. 5B). A second input terminal of the comparison circuit 1010a was electrically connected to one electrode of the secondary battery 1001 and a first electrode of the stabilized power source 1002. An output terminal of the comparison circuit 1010a was electrically connected to an input terminal of the delay circuit 1011. An output terminal of the delay circuit 1011 was electrically connected to a gate of the power MOSFET 1003 and one electrode of the resistor 1004. The other electrode of the secondary battery 1001 was electrically connected to a drain terminal of the power MOSFET 1003. A source of the power MOSFET 1003 was electrically connected to the other electrode of the resistor 1004 and a second electrode of the stabilized power source 1002.

A reference voltage of the comparison circuit 1010a is supplied from the CPU to the first input terminal included in the comparison circuit 1010a through the digital/analog conversion circuit.

Figure 31B:
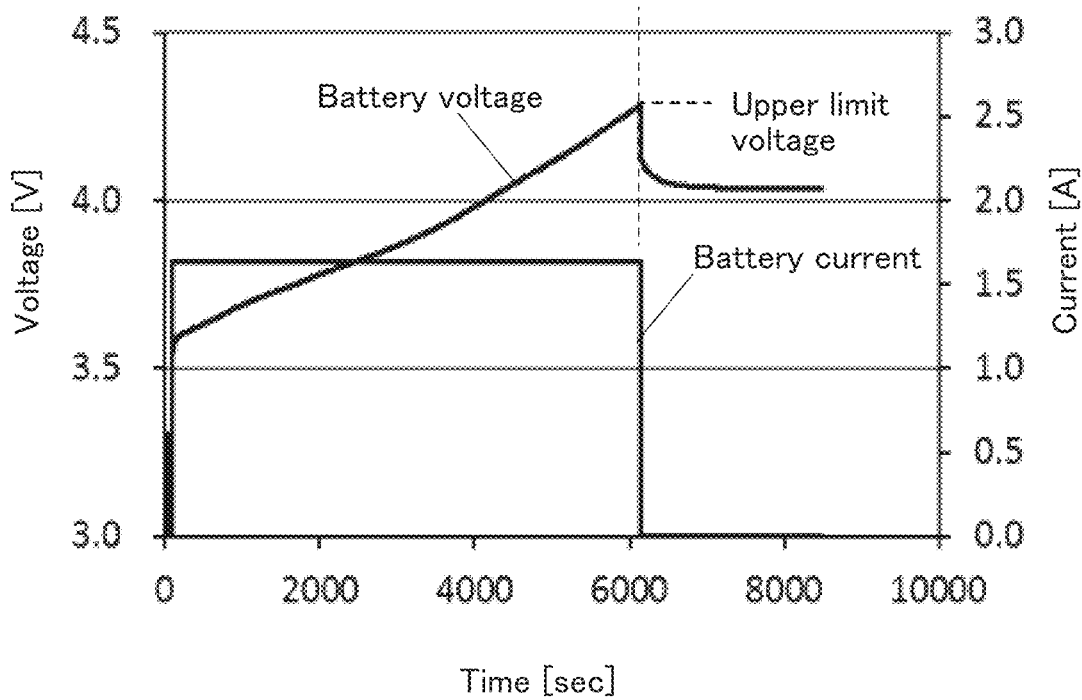
FIG. 31B is measurement data of a detection circuit.

FIG. 31B shows results of measurement of the overvoltage detection circuit 1000a by the overcharge voltage control test circuit. When the secondary battery 1001 started to be charged with the stabilized power source 1002, a battery voltage of a charging potential of the secondary battery 1001 was increased over time. While the secondary battery was charged, a current supplied from the stabilized power source 1002 to the secondary battery 1001 was constant.

The comparison circuit 1010a brings the power MOSFET from an on state into an off state through the delay circuit 1011 when the battery voltage reaches the upper limit voltage. As a result, it was confirmed that supply of current from the stabilized power source 1002 to the secondary battery 1001 was stopped. Note that while the secondary battery 1001 is charged with the stabilized power source 1002, the reference voltage is set only once for the comparison circuit 1010a, and after that, the digital/analog conversion circuit is power-gated. In other words, it was confirmed that the overvoltage detection circuit included in the battery control system was operated as a safety device that prevents an overcharge voltage of the secondary battery 1001.

Figure 32A:
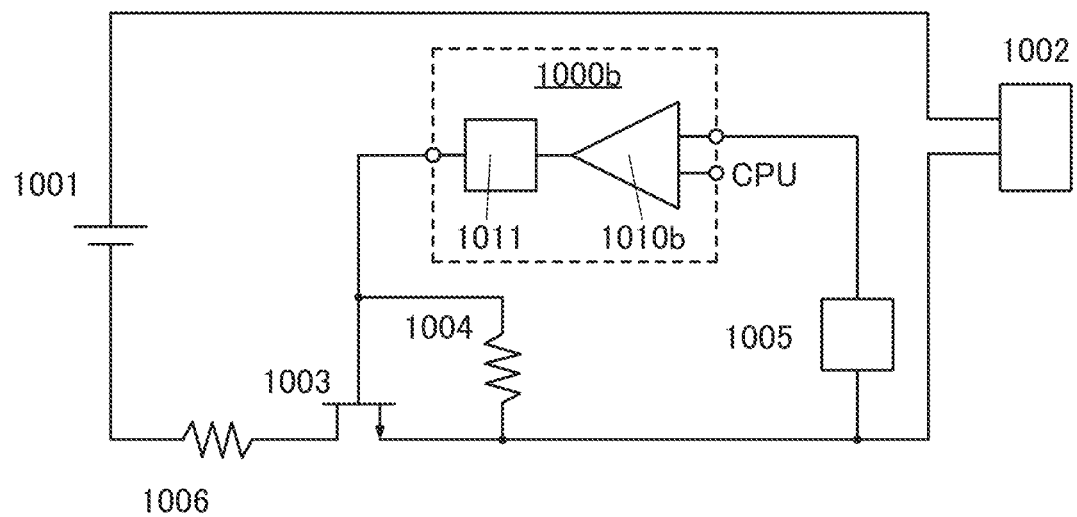
FIG. 32A is a diagram illustrating a test circuit.

FIG. 32A is an overcurrent control test circuit for evaluating the overcurrent detection circuit 1000b included in the chip 1000. The overcurrent control test circuit includes an overcurrent detection circuit 1000b, the secondary battery 1001, the stabilized power source 1002, the power MOSFET 1003, the resistor 1004, the current voltage conversion circuit 1005, and a resistor 1006. Note that the resistor 1006 functions as a shunt resistor. The overcurrent detection circuit 1000*b* includes a comparison circuit 1010*b* and the delay circuit 1011.

Next, electrical connection of the overcurrent control test circuit will be described. A first input terminal included in the comparator circuit 1010*b* was electrically connected to a CPU through a digital/analog conversion circuit (not illustrated). Alternatively; the first input terminal was connected to the digital/analog conversion circuit through a memory circuit. A second input terminal of the comparison circuit 1010*b* was electrically connected to an output terminal of the current voltage conversion circuit 1005. An output terminal of the comparison circuit 1010*b* was electrically connected to the input terminal of the delay circuit 1011. The output terminal of the delay circuit 1011 was electrically connected to the gate of the power MOSFET 1003 and the one electrode of the resistor 1004. The other electrode of the secondary battery 1001 was electrically connected to the drain terminal of the power MOSFET 1003 through the resistor 1006. The source of the power MOSFET 1003 was electrically connected to an input terminal of the current voltage converter circuit 1005, the other electrode of the resistor 1004, and the second electrode of the stabilized power source 1002.

A reference voltage of the comparison circuit 1010*b* is supplied from the CPU to the first input terminal included in the comparison circuit 1010*b* through the digital/analog conversion circuit.

Figure 32B:
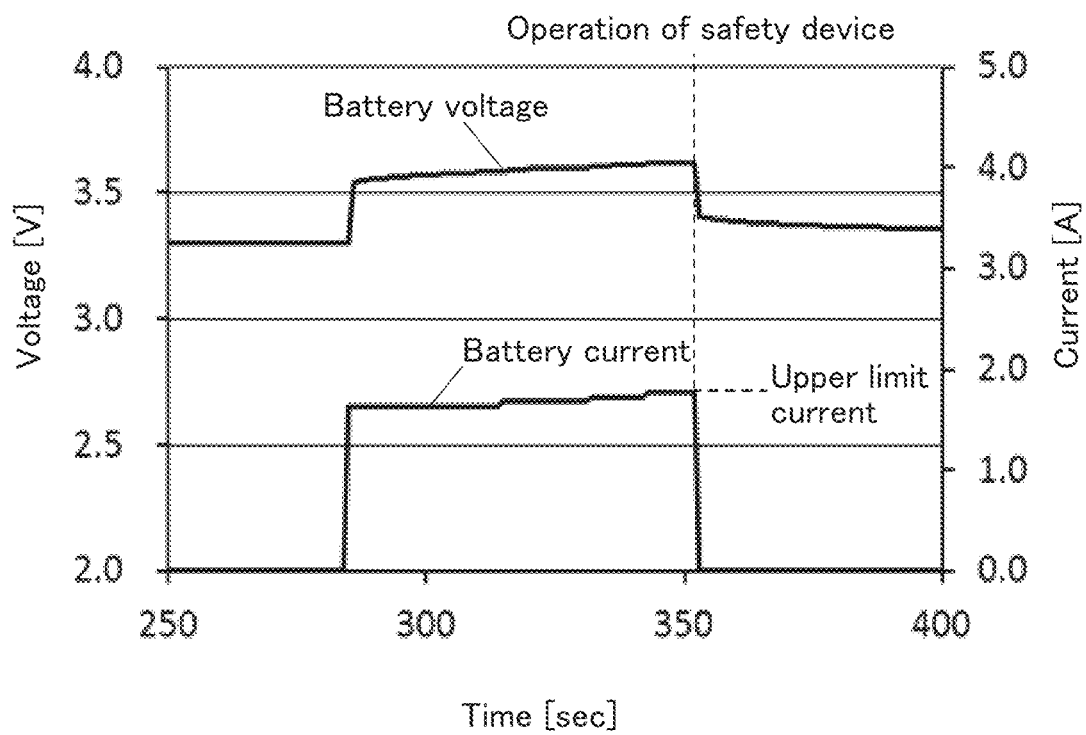
FIG. 32B is measurement data of a detection circuit.

FIG. 32B shows results of measurement of the overcurrent detection circuit 1000*b* by the overcurrent control test circuit. When the secondary battery 1001 started to be charged with the stabilized power source 1002, a battery voltage of a charging potential of the secondary battery 1001 was increased over time. While the secondary battery 1001 was charged, current supplied from the stabilized power source 1002 to the secondary battery 1001 was constant. When the internal resistance of the secondary battery 1001 is the same, the secondary battery 1001 is charged and the battery voltage increases, so that the battery current also increases. Note that in the case where internal short-circuiting or the like occurs in the secondary battery 1001 while the secondary battery 1001 is charged, the battery current flowing in the secondary battery 1001 is increased.

Accordingly, the battery control system preferably manages the upper limit of the battery current. The comparison circuit 1010*b* converts current flowing in the resistor 1006 functioning as a shunt resistor into a voltage by the current-voltage conversion circuit 1005 and supplies the voltage to the second input terminal of the comparison circuit 1010*b*. The voltage obtained by conversion of the current by the current-voltage conversion circuit 1005 was amplified 20 times so that the comparison circuit 1010*b* can detect a change and is supplied to the second input terminal. When the current supplied to the battery reaches the upper limit current, the comparison circuit 1010*b* brings the power MOSFET from an on state to an off state through the delay circuit 1011. As a result, it was confirmed that supply of current from the stabilized power source 1002 to the secondary battery 1001 was stopped. Note that while the secondary battery 1001 is charged with the stabilized power source 1002, the reference voltage is set only once for the comparison circuit 1010*b*, and after that, the digital/analog conversion circuit is power-gated. In other words, it was confirmed that the overcurrent detection circuit 1000*b* included in the battery control system was operated as a safety device that prevents overcurrent from flowing in the secondary battery 1001.

Figure 33A:
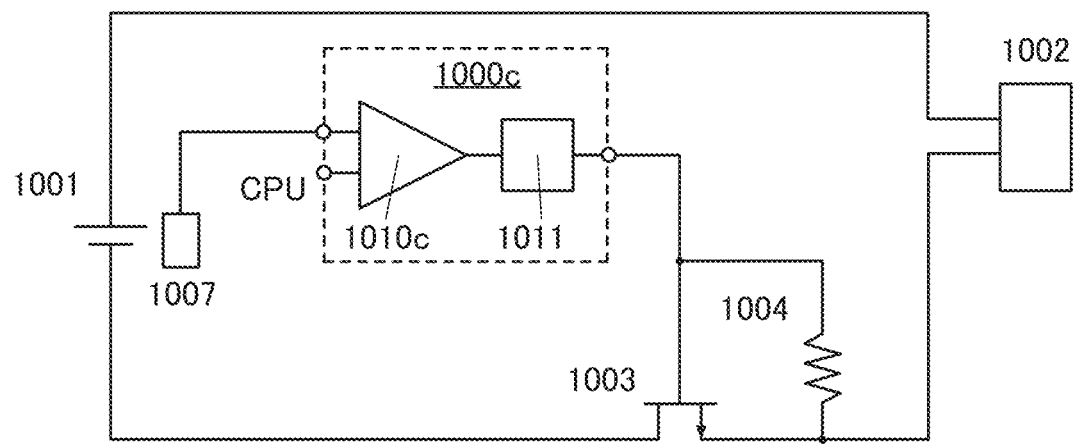
FIG. 33A is a diagram illustrating a test circuit.

FIG. 33A is an overheat detection control test circuit for evaluating an overheat detection circuit 1000*c* included in the chip 1000. The overheat detection control test circuit includes the overheat detection circuit 1000*c*, the secondary battery 1001, the stabilized power source 1002, the power MOSFET 1003, the resistor 1004, and a temperature detection circuit 1007. In the temperature detection circuit 1007, a temperature was detected using a thermistor. The overheat detection circuit 1000*c* includes a comparison circuit 1010*c* and the delay circuit 1011.

Next, electrical connection of the overheat detection control test circuit will be described. A first input terminal included in the comparator circuit 1010*c* was electrically connected to a CPU through a digital/analog conversion circuit (not illustrated). Alternatively, the first input terminal may be connected to the digital/analog conversion circuit through a memory circuit. A second input terminal of the comparison circuit 1010*c* was electrically connected to the temperature detection circuit 1007. An output terminal of the comparison circuit 1010*c* was electrically connected to an input terminal of the delay circuit 1011. An output terminal of the delay circuit 1011 was electrically connected to the gate of the power MOSFET 1003 and the one electrode of the resistor 1004. The other electrode of the secondary battery 1001 was electrically connected to the drain terminal of the power MOSFET 1003. The source of the power MOSFET 1003 was electrically connected to the other electrode of the resistor 1004 and the second electrode of the stabilized power supply 1002. Note that the temperature detection circuit 1007 is provided in the vicinity of or in contact with the secondary battery 1001.

A reference voltage of the comparison circuit 1010*c* is supplied from the CPU to the first input terminal included in the comparison circuit 1010*c* through the digital/analog conversion circuit.

Figure 33B:
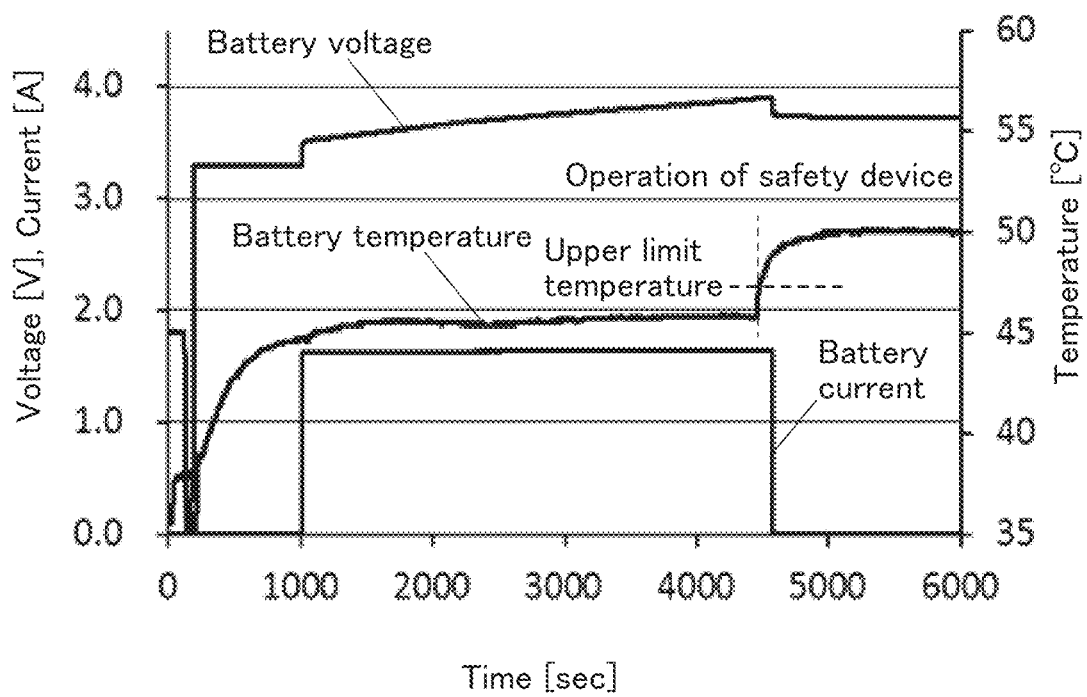
FIG. 33B is measurement data of a detection circuit.

FIG. 33B shows results of measurement of the overheat detection circuit 1000*c* by the overheat detection control test circuit. When the secondary battery 1001 started to be charged with the stabilized power source 1002, a battery voltage of a charging potential of the secondary battery 1001 was increased over time. While the secondary battery 1001 was charged, current supplied from the stabilized power source 1002 to the secondary battery 1001 was constant. The temperature of the secondary battery 1001 is increased when charged or discharged. It is known that in the case where the secondary battery is a compound containing a lithium element, occurrence of a failure such as internal short-circuiting in the secondary battery 1001 causes a significant increase in temperature of the secondary battery 1001 and firing.

Accordingly, in the management of the battery control system, the upper limit of the battery temperature was set. As for the comparison circuit 1010*c*, the temperature detection circuit 1007 detects a temperature of the secondary battery 1001, converts the detected temperature into a voltage, and supplies the voltage to the second input terminal of the comparison circuit 1010*b*. When the battery temperature detected by the temperature detection circuit 1007 reaches the upper limit temperature, the comparison circuit 1010*c* brings the power MOSFET from an on state into an off state through the delay circuit 1011. As a result, it was confirmed that supply of current from the stabilized power source 1002 to the secondary battery 1001 was stopped. Note that while the secondary battery 1001 is charged with the stabilized power source 1002, the reference voltage is set only once for the comparison circuit 1010c, and after that, the digital/analog conversion circuit is power-gated. In other words, it was confirmed that the overheat detection circuit 1000c included in the battery control system detects a significant change in temperature of the secondary battery 1001 and was operated as a safety device that prevents firing of the secondary battery.

Figure 34A:
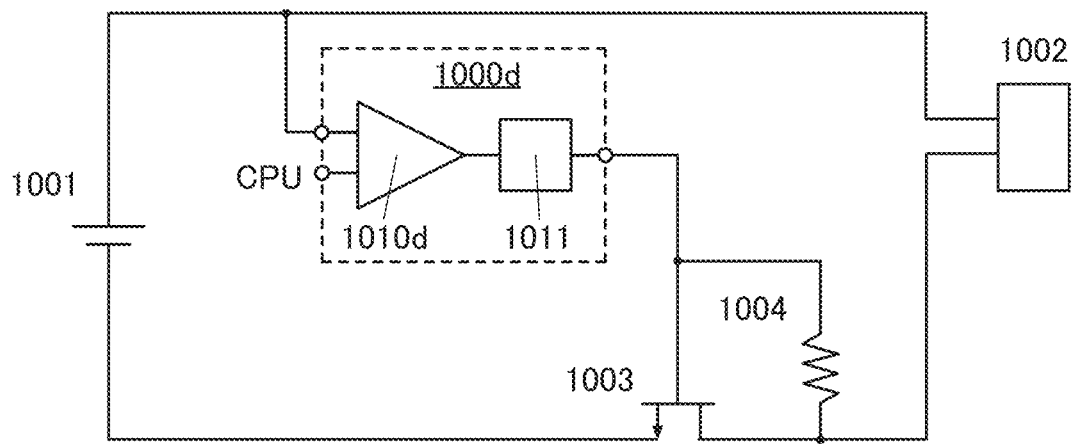
FIG. 34A is a diagram illustrating a test circuit.

FIG. 34A is an overdischarge control test circuit for evaluating the overdischarge detection circuit 1000d included in the chip 1000. The overdischarge control test circuit includes the overdischarge detection circuit 1000d, the secondary battery 1001, the stabilized power source 1002, the power MOSFET 1003, and the resistor 1004. The overdischarge detection circuit 1000d includes a comparison circuit 1010d and the delay circuit 1011.

Next, electrical connection of the overdischarge control test circuit will be described. The first input terminal included in the comparison circuit 1010d was electrically connected to a CPU through a digital/analog conversion circuit (not illustrated). Note that the first input terminal included in the comparison circuit 1010d may be electrically connected directly to the CPU. A second input terminal of the comparison circuit 1010d was electrically connected to the one electrode of the secondary battery 1001 and the first electrode of the stabilized power source 1002. An output terminal of the comparison circuit 1010a was electrically connected to the input terminal of the delay circuit 1011. The output terminal of the delay circuit 1011 was electrically connected to the gate of the power MOSFET 1003 and the one electrode of the resistor 1004. The other electrode of the secondary battery 1001 was electrically connected to a source terminal of the power MOSFET 1003. A drain of the power MOSFET 1003 was electrically connected to the other electrode of the resistor 1004 and the second electrode of the stabilized power source 1002.

A reference voltage of the comparison circuit 1010d is supplied from the CPU to the first input terminal included in the comparison circuit 1010d through the digital/analog conversion circuit.

Figure 34B:
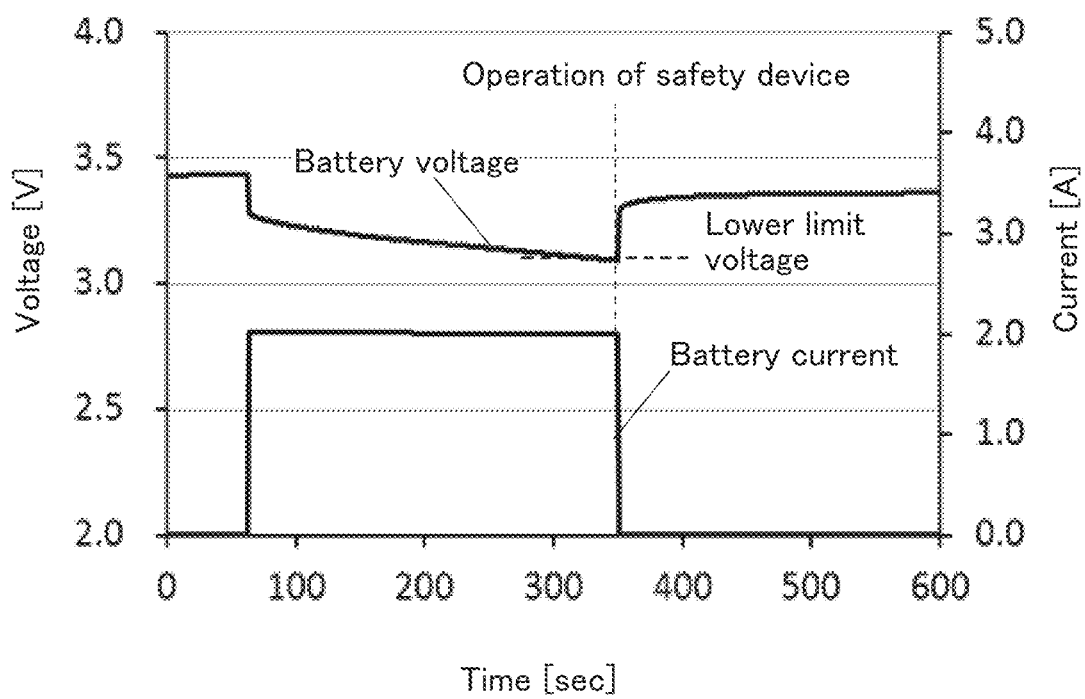
FIG. 34B is measurement data of a detection circuit.

FIG. 34B shows results of measurement of the overdischarge detection circuit 1000d by the overdischarge control test circuit. When the secondary battery 1001 starts to be discharged to the stabilized power source 1002, the battery voltage of the secondary battery 1001 is lowered over time. While the secondary battery was discharged, current supplied from the secondary battery 1001 to the stabilized power source 1002 was constant.

The comparison circuit 1010d brings the power MOSFET from an on state into an off state through the delay circuit 1011 when the battery voltage reaches the lower limit voltage. As a result, it was confirmed that discharge of a current from the secondary battery 1001 to the stabilized power source 1002 was stopped. Note that while the secondary battery 1001 is discharged to the stabilized power source 1002, the reference voltage is set only once for the comparison circuit 1010d, and after that, the digital/analog conversion circuit is power-gated. In other words, it was confirmed that the overdischarge detection circuit 1000d included in the battery control system was operated as a safety device that prevents an overdischarge state of the secondary battery 1001.

REFERENCE NUMERALS

BIAS1:wiring, BIAS2: wiring, INM1: terminal, INM2: terminal, INP1: terminal, INP2: terminal, ND1: node, R1: resistor, R2: resistor, R3: resistor, 10: sensing device, 10A: sensing device, 10B: sensing device, 10C: sensing device, 11: comparison circuit, 11a1: terminal, 11a2: terminal, 11A: amplifier circuit, 11b1: terminal, 11b2: terminal, 11B: source follower circuit, 11c1: terminal, 11c2: terminal, 11C: amplifier circuit, 12: comparison circuit, 13: comparison circuit, 13a: source follower circuit, 13a1, terminal, 13a2: terminal, 13A: amplifier circuit, 13b1: terminal, 13b2: terminal, 13B: source follower circuit, 14: output circuit, 20: memory circuit, 21: transistor, 22: capacitor, 24: transistor, 25: transistor, 26: transistor, 27: transistor, 30: transistor, 30_n: transistor, 30_1: transistor, 30_2: transistor, 30a: circuit, 30b: circuit, 30c: circuit, 30d: circuit, 31: transistor, 31a: transistor, 32: transistor, 32a: transistor, 33: transistor, 33a: transistor, 34: transistor, 34a: transistor, 35: transistor, 36: transistor, 37: transistor, 38: transistor, 41: capacitor, 42: capacitor, 43: capacitor, 44: capacitor, 45: transistor, 46: transistor, 50: sensing device, 51A: transistor, 51B: transistor, 52A: transistor, 52B: transistor, 53A: transistor, 53B: transistor, 54A: transistor, 54B: transistor, 55A: transistor, 55B: transistor, 56A: transistor, 56B: transistor, 56D: transistor, 57A: transistor, 57B: transistor, 58A: capacitor, 58B: capacitor, 59A: capacitor, 59B: capacitor, 60: amplifier circuit, 60A: amplifier circuit, 60B: amplifier circuit, 61: transistor, 61A: transistor, 62: transistor, 63: transistor, 64: transistor, 65: transistor, 66: transistor, 67: transistor, 68: transistor, 69A: capacitor, 69B: capacitor, 69C: capacitor, 70: latch circuit, 71: transistor, 71A: transistor, 72: transistor, 73: transistor, 74: transistor, 75: transistor, 76: transistor, 77: transistor, 78: transistor, 79A: capacitor, 79B: capacitor, 80A: circuit, 80B: circuit, 81A: circuit, 81B: circuit, 82B: circuit, 91: transistor, 92: capacitor, 100: semiconductor device, 300: anomaly-monitoring unit, 301: battery, 302: battery controller, 303: motor controller, 304: motor, 305: gear, 306: DCDC circuit, 307: electric power steering, 308: heater, 309: defogger, 310: DCDC circuit, 311: battery, 312: inverter, 314: power window, 315: lamps, 316: tire, 322: insulating layer, 324: insulating layer, 330: oxide layer, 330b: oxide layer, 342: conductive layer, 600: secondary battery, 601: positive electrode cap, 602: battery can, 603: positive electrode terminal, 604: positive electrode, 605: separator, 606: negative electrode, 607: negative electrode terminal, 608: insulating plate, 609: insulating plate, 611: PTC element, 612: safety valve mechanism, 613: conductive plate, 614: conductive plate, 615: module, 723: electrode, 724a: electrode, 724b: electrode, 726: insulating layer, 728: insulating layer, 729: insulating layer, 741: insulating layer, 742: semiconductor layer, 744a: electrode, 744b: electrode, 746: electrode, 771: substrate, 772: insulating layer, 810: transistor, 811: transistor, 820: transistor, 821: transistor, 825: transistor, 826: transistor, 830: transistor, 840: transistor, 842: transistor, 843: transistor, 844: transistor, 845: transistor, 846: transistor, 847: transistor, 901: housing, 902: housing, 903: display portion, 904: operation key, 905: lens, 906: connection portion, 907: speaker, 911: housing, 912: display portion, 913: speaker, 919: camera, 921: pillar, 922: display portion, 951: housing, 952: display portion, 953: operation button, 954: external connection port, 955: speaker, 956: microphone, 957: camera, 961: housing, 962: shutter button, 963: microphone, 965: display portion, 966: operation key, 967: speaker, 968: zoom lever, 969: lens, 971: housing, 973: display portion, 974: operation key, 975: speaker, 976: communication connection terminal, 977: optical sensor, 1000: chip, 1000a: overvoltage detection circuit, 1000b: overcurrent detection circuit, 1000c: overheat detection circuit, 1000*d*: overdischarge detection circuit, 1001: secondary electron, 1001: secondary battery, 1002: stabilized power source, 1003: power MOSFET, 1004: resistor, 1005: current voltage conversion circuit, 1006: resistor, 1007: temperature detection circuit, 1010: delay circuit, 1010*a*: comparison circuit, 1010*b*: comparison circuit, 1010*c*: comparison circuit, 1010*d*: comparison circuit, 1011: delay circuit, 1300: transistor, 1300A: transistor, 1305: conductive layer, 1314: insulating layer, 1316: insulating layer, 1322: insulating layer, 1324: insulating layer, 1330: oxide layer, 1330*a*: oxide layer, 1330*b*: oxide layer, 1330*c*: oxide layer, 1340: conductive layer, 1340*a*: conductive layer, 1340*b*: conductive layer, 1341: insulating layer, 1341*a*: insulating layer, 1341*b*: insulating layer, 1342: conductive layer, 1342*a*: conductive layer, 1342*b*: conductive layer, 1350: insulating layer, 1354: insulating layer, 1360: conductive layer, 1360*a*: conductive layer, 1360*b*: conductive layer, 1374: insulating layer, 1380: insulating layer, 1381: insulating layer, 1400: storage battery, 1402: positive electrode, 1404: negative electrode, 8021: charging device, 8022: cable, 8024: secondary battery, 8400: automobile, 8401: headlight, 8406: electric motor, 8500: automobile, 8600: scooter, 8601: side mirror, 8602: secondary battery, 8603: direction indicator, 8604: under-seat storage

The invention claimed is:

1. An amplifier circuit comprising:
a first circuit comprising a plurality of transistors;
a second circuit comprising a plurality of transistors;
first to fourth transistors;
a first capacitor; and
a second capacitor,
wherein the amplifier circuit comprises a first output terminal and a second output terminal,
wherein each of the first circuit and the second circuit is configured to be a current source,
wherein, in the amplifier circuit, an output terminal of the first circuit is electrically connected to one of a source and a drain of the first transistor, and a first electrode of the first capacitor,
wherein, in the amplifier circuit, the output terminal of the first circuit is directly connected to the first output terminal,
wherein an output terminal of the second circuit is electrically connected to one of a source and a drain of the second transistor, a first electrode of the second capacitor, and the second output terminal,
wherein one of a source and a drain of the third transistor is electrically connected to the other of the source and the drain of the first transistor and the other of the source and the drain of the second transistor, and
wherein a gate of the third transistor is electrically connected to one of a source and a drain of the fourth transistor, a second electrode of the first capacitor, and a second electrode of the second capacitor.

2. The amplifier circuit according to claim 1,
wherein the amplifier circuit comprises a first input terminal, a second input terminal, and a third input terminal,
wherein the first input terminal is configured to be supplied with a first input signal and electrically connected to a gate of the first transistor,
wherein the second input terminal is configured to be supplied with a second input signal and electrically connected to a gate of the second transistor,
wherein the third input terminal is configured to be supplied with a third potential and electrically connected to the second electrode of the first capacitor and the second electrode of the second capacitor through the fourth transistor, and
wherein in the case where a first potential supplied as the first input signal is the same as a second potential supplied as the second input signal, a first output potential output to the first output terminal is substantially the same as a second output potential output to the second output terminal.

3. The amplifier circuit according to claim 1,
wherein the amplifier circuit further comprises a third capacitor whose capacitance is smaller than or equal to half of a combined capacitance of the first capacitor and the second capacitor,
wherein the third capacitor is electrically connected to the gate of the third transistor, the one of the source and the drain of the fourth transistor, the second electrode of the first capacitor, and the second electrode of the second capacitor, and
wherein a third potential is supplied to the second electrode of the first capacitor, the second electrode of the second capacitor, and a first electrode of the third capacitor through the fourth transistor.

4. The amplifier circuit according to claim 2,
wherein each of the first circuit and the second circuit comprises a fifth transistor, a sixth transistor, a fourth capacitor, and a fourth input terminal,
wherein one of a source and a drain of the fifth transistor is electrically connected to a first electrode of the fourth capacitor and the one of the source and the drain of the first transistor,
wherein a gate of the fifth transistor is electrically connected to one of a source and a drain of the sixth transistor and a second electrode of the fourth capacitor,
wherein a fourth potential supplied to the fourth input terminal is configured to control an amount of current supplied to the first output terminal or the second output terminal through the sixth transistor,
wherein the first circuit is configured to supply current to the first output terminal,
wherein the second circuit is configured to supply current to the second output terminal, and
wherein the first output potential of the first output terminal or the second output potential of the second output terminal is corrected by the third potential supplied to the gate of the third transistor according to the first input signal or the second input signal.

5. The amplifier circuit according to claim 1,
wherein each of the first to fourth transistors comprises a metal oxide in a semiconductor layer.

6. The amplifier circuit according to claim 1,
wherein each of the first to fourth transistors comprises a back gate.

7. A semiconductor device comprising a sensing device, the sensing device comprising an amplifier circuit,
wherein the amplifier circuit comprises:
a first circuit comprising a plurality of transistors;
a second circuit comprising a plurality of transistors;
first to fourth transistors;
a first capacitor; and
a second capacitor,
wherein the amplifier circuit comprises a first output terminal and a second output terminal,
wherein each of the first circuit and the second circuit is configured to be a current source, wherein in the amplifier circuit, an output terminal of the first circuit is electrically connected to one of a source and a drain of the first transistor, and a first electrode of the first capacitor, wherein, in the amplifier circuit, the output terminal of the first circuit is directly connected to the first output terminal, wherein an output terminal of the second circuit is electrically connected to one of a source and a drain of the second transistor, a first electrode of the second capacitor, and the second output terminal, wherein one of a source and a drain of the third transistor is electrically connected to the other of the source and the drain of the first transistor and the other of the source and the drain of the second transistor, and wherein a gate of the third transistor is electrically connected to one of a source and a drain of the fourth transistor, a second electrode of the first capacitor, and a second electrode of the second capacitor.

8. The semiconductor device according to claim 7, wherein the amplifier circuit comprises a first input terminal, a second input terminal, and a third input terminal, wherein the first input terminal is configured to be supplied with a first input signal having a first potential and electrically connected to a gate of the first transistor, wherein the second input terminal is configured to be supplied with a second input signal having a second potential and electrically connected to a gate of the second transistor, wherein the third input terminal is configured to be supplied with a third potential and electrically connected to the second electrode of the first capacitor and the second electrode of the second capacitor through the fourth transistor, and wherein in the case where the first potential is the same as the second potential, a first output potential output to the first output terminal is substantially the same as a second output potential output to the second output terminal.

9. The semiconductor device according to claim 7, wherein the amplifier circuit further comprises a third capacitor whose capacitance is smaller than or equal to half of a combined capacitance of the first capacitor and the second capacitor, and wherein the third capacitor is electrically connected to the gate of the third transistor, the one of the source and the drain of the fourth transistor, the second electrode of the first capacitor, and the second electrode of the second capacitor.

10. The semiconductor device according to claim 9, wherein a third potential is supplied to the second electrode of the first capacitor, the second electrode of the second capacitor, and a first electrode of the third capacitor through the fourth transistor.

11. The semiconductor device according to claim 8, wherein each of the first circuit and the second circuit comprises a fifth transistor, a sixth transistor, a fourth capacitor, and a fourth input terminal, wherein one of a source and a drain of the fifth transistor is electrically connected to a first electrode of the fourth capacitor and the one of the source and the drain of the first transistor, and wherein a gate of the fifth transistor is electrically connected to one of a source and a drain of the sixth transistor and a second electrode of the fourth capacitor.

12. The semiconductor device according to claim 11, wherein a fourth potential supplied to the fourth input terminal is configured to control an amount of current supplied to the first output terminal or the second output terminal through the sixth transistor, wherein the first circuit is configured to supply current to the first output terminal, wherein the second circuit is configured to supply current to the second output terminal, and wherein the first output potential of the first output terminal or the second output potential of the second output terminal is corrected by the third potential supplied to the gate of the third transistor according to the first input signal or the second input signal.

13. The semiconductor device according to claim 7, wherein each of the first to fourth transistors comprises a metal oxide in a semiconductor layer.

14. The semiconductor device according to claim 7, wherein each of the first to fourth transistors comprises a back gate.

* * * * *